(12) United States Patent
Hantsoo et al.

(10) Patent No.: US 8,696,810 B2
(45) Date of Patent: *Apr. 15, 2014

(54) SELECTED METHODS FOR EFFICIENTLY MAKING THIN SEMICONDUCTOR BODIES FROM MOLTEN MATERIAL FOR SOLAR CELLS AND THE LIKE

(71) Applicant: 1366 Technologies Inc., Lexington, MA (US)

(72) Inventors: Eerik T. Hantsoo, Atlanta, GA (US); G. D. Stephen Hudelson, Lexington, MA (US); Ralf Jonczyk, Concord, MA (US); Adam M. Lorenz, Arlington, MA (US); Emanuel M. Sachs, Newton, MA (US); Richard L. Wallace, Acton, MA (US)

(73) Assignee: 1366 Technologies, Inc., Bedford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/654,638

(22) Filed: Oct. 18, 2012

(65) Prior Publication Data

US 2013/0036967 A1    Feb. 14, 2013

Related U.S. Application Data

(63) Continuation of application No. 13/299,031, filed on Nov. 17, 2011, now Pat. No. 8,293,009, which is a continuation of application No. 12/999,206, filed as application No. PCT/US2010/026639 on Mar. 9, 2010.

(60) Provisional application No. 61/209,582, filed on Mar. 9, 2009, provisional application No. 61/224,730, filed on Jul. 10, 2009, provisional application No. 61/237,965, filed on Aug. 28, 2009.

(51) Int. Cl.
*C30B 15/22*    (2006.01)

(52) U.S. Cl.
USPC ................. 117/13; 117/15; 117/20; 117/21

(58) Field of Classification Search
USPC .......................................... 117/13, 15, 20, 21
See application file for complete search history.

(56) References Cited

U.S. PATENT DOCUMENTS 4,670,096 A    6/1987    Schwirtlich et al.
5,275,226 A    1/1994    Cook
(Continued)

FOREIGN PATENT DOCUMENTS

WO    2009002550 A1    12/2008

OTHER PUBLICATIONS

International Search Report and Written Opinion of the International Searching Authority, mailed Jul. 9, 2010 for PCT/US10/26639, to which the present application claims priority.

(Continued)

*Primary Examiner* — Bob M Kunemund
(74) *Attorney, Agent, or Firm* — Steven J. Weissburg

(57) ABSTRACT

A pressure differential is applied across a mold sheet and a semiconductor (e.g. silicon) wafer (e.g. for solar cell) is formed thereon. Relaxation of the pressure differential allows release of the wafer. The mold sheet may be cooler than the melt. Heat is extracted almost exclusively through the thickness of the forming wafer. The liquid and solid interface is substantially parallel to the mold sheet. The temperature of the solidifying body is substantially uniform across its width, resulting in low stresses and dislocation density and higher crystallographic quality. The mold sheet must allow flow of gas through it. The melt can be introduced to the sheet by: full area contact with the top of a melt; traversing a partial area contact of melt with the mold sheet, whether horizontal or vertical, or in between; and by dipping the mold into a melt. The grain size can be controlled by many means.

22 Claims, 40 Drawing Sheets

(56) References Cited

U.S. PATENT DOCUMENTS

| | | | |
|---|---|---|---|
| 6,413,313 | B1 | 7/2002 | Yoshida et al. |
| 6,596,075 | B2 | 7/2003 | Igarashi et al. |
| 6,946,029 | B2 | 9/2005 | Tsukuda et al. |
| 7,022,180 | B2 | 4/2006 | Wallace |
| 7,186,578 | B2 | 3/2007 | Goma et al. |
| 7,407,550 | B2 | 8/2008 | Sachs |
| 8,293,009 | B2 * | 10/2012 | Sachs et al. .................. 117/13 |
| 2001/0044163 | A1 | 11/2001 | Tsukuda et al. |
| 2009/0004835 | A1 | 1/2009 | Drevet et al. |

OTHER PUBLICATIONS

Hide, I. et al., Mould Shaping Silicon Crystal Growth with a Mould Coating Material by the Spinning Method, Journal of Crystal Growth 79 (1986) 583-589.

Prakash et al., Use of Silicon Oxynitride as a graphite mold releasing coating for the growth of shaped multicrystalline silicon crystals, Journal of Crystal Growth 144 (1994) 41-47.

E. Sachs, D. Ely and J. Serdy, Edge Stabilized Ribbon (ESR) Growth of Silicon for Low Cost Photovoltaics, J. Crystal Growth 82 (1987) pp. 117-121.

R.L. Wallace, J. I. Hanoka, A. Rohatgi and G. Crotty, Thin Silicon String Ribbon, Solar Energy Materials and Solar Cells 48 (1997) pp. 179-186.

U. Hess, T. Lauermann, S. Seren, G. Hahn, A. Gutjahr, A. Schönecker, Impact of the Crystal Structure on Solar Cell Parameters of Ribbon Growth on Substrate (RGS) Solar Cells, Proc. 23rd EU PVSEC Valencia, (2008) pp. 1522-1526.

Seren, S.; Hahn, G.; Gutjahr, A.; Burgers, A.R.; Schonecker, A.; Grenko, A.; Jonczyk, R.; Ribbon Growth on Substrate and Molded Wafer—Two Low Cost Silicon Ribbon Materials for PV, Proc. 4th WCPEC IEEE PVSC (2006) pp. 1330-1333.

A. Schönecker, L.J. Geerligs, A. Müller, Casting Technologies for Solar Silicon Wafers: Block Casting and Ribbon-Growth-on-Substrate, Solid State Phenomena, vols. 95-96 (2004) pp. 149-158.

Schonecker, A.; Laas, L.; Gutjahr, A.; Wyers, P.; Reinink, A.; Wiersma, B., Ribbon-growth-on-substrate: Progress in high-speed crystalline silicon wafer manufacturing, 29th IEEE PVSC, (2002) pp. 316-319.

Culik, J.; Abraham, S.; Addison, G.; Allison, K.; Faller, F.; Goncharovsky, I.; Rand, J.; Tomanovich, J.; Barnett, A.; Recent progress on 15-MW Silicon-Film™ solar cell manufacturing systems, Proc. 29th IEEE PVSEC (2002) pp. 391-394.

A. Focsa et al., Passivation Properties of RST Silicon Ribbon by Single SiNx:H or Double a-Si:H/SiNx:H Layer and Solar Cells, Proc. 23rd EU PVSEC Valencia (2008) pp. 1884-1888. under development by www.solarforce.fr.

B. Belouet, Growth of silicon ribbon by the RAD Process, J. Crystal Growth 82 (1987) 110.

H. Yamatsugu et al., New Wafer Technology for Crystalline Silicon Solar Cell, Proc. 23rd EU PVSEC Valencia (2008) pp. 1114-1116.

Briglio, A.; Dumas, K.; Leipold, M.; Morrison, A., Flat-plate Solar Array Project. vol. 3: Silicon sheet: Wafers and ribbons, : Final Report #: DOE/JPL-1012-125-VOL-3 (1986) from http://ntrs.nasa.gov/search.jsp Direct link: http://hdl.handle.net/2060/19870011215.

B. Kudo, Improvements in the Horizontal Ribbon Growth technique for single crystal silicon, J. Crystal Growth 50 (1980) 247-259.

Baghdadi, A: Gurtler, R, Recent Advances in Ribbon-to-Ribbon Crystal Growth, J. Crystal Growth 50 (1980) 236-246.

F. M. Uno, D. L. Bender, D. C. Wang, G. F. Wakefield, S. N. Rea, Rapid Cast Silicon Ribbon, Proc. 18th IEEE PVSC (1985) pp. 988-992.

T.W. Clyne, Numerical Treatment of Rapid Solidification, MetTransB vol. 15B (1984) pp. 369-381.

A. Eyer, N. Schillinger, I. Reis, A. Räuber, Silicon sheets for solar cells grown from silicon powder by the SSP technique, J. Crystal Growth 104 (1990) pp. 119-125.

N. Tsuya, K. I. Arai, T. Takeuchi, K. Ohmori, T. Ojima and A. Kuroiwa, Silicon ribbons made by roller quenching methods, J. Electronic Materials 9 (1980).

M. Suzuki, I. Hide, T. Yokoyama, T. Matsuyama, Y. Hatanaka and Y. Maeda, Growth of polycrystalline silicon sheet by Hoxan cast ribbon process, J. Crystal Growth 104 (1990) pp. 102-107.

Y. Maeda, I. Hide, M. Suzuki, T. Suzuki and T. Moritani, Low Cost silicon sheets produced by new spincast process, Solar Energy Materials 23 (1991) 190-198.

C. Rodrigues Pinto, J. M. Serra, M. C. Brito, R. Gamboa, J. Maia Alves and A. M. Vallêra, Zone Melting Recrystallization of Self Supported Silicon Ribbons Obtained by Fast CVD from Silane, Proc. 23rd EU PVSEC Dresden (2006).

S. Reber, A. Eyer, F. Haas, High-throughput zone-melting recrystallization for crystalline silicon thin-film solar cells, J. Crystal Growth 287 (2006) pp. 391.

G. Beaucarne, S. Bourdais, A. Slaoui, J. Poortmans, Thin-film polycrystalline Si solar cells on foreign substrates: film formation at intermediate temperatures, Appl. Phys. A 79 (2004) 469-480.

M. McCann, K. Catchpole, K. Weber and A. Blakers, A review of thin-film crystalline silicon for solar cell applications. Part 1: Native substrates and Part 2: Foreign Substrates, Solar Energy Materials & Solar Cells 68 (2001) 135-215.

B. Baliga, Silicon Liquid Phase Epitaxy, J. Electrochem. Soc. 133 (1986) pp. 5C-14C.

A. Zuschlag, G. Micard, J. Junge, M. Käs, S. Seren, G. Hahn, G. Coletti, G. Jia, and W. Seifert, Investigations on the Recombination Activity of Grain Boundaries in Multicrystalline Silicon, Proc. 33rd IEEE PVSEC, San Diego (2008).

T.F. Ciszek and T.H. Wang, Silicon defect and impurity studies using float-zone crystal growth as a tool, Journal of Crystal Growth, vol. 237 (2002) pp. 1685-1691.

J. Chen, T. Sekiguchi, D. Yang, F. Yin, K. Kido, and S. Tsurekawa, Electron-beam-induced current study of grain boundaries in multicrystalline silicon, Journal of Applied Physics, vol. 96 (2004) p. 5490.

W. Seifert, G. Morgenstern, and M. Kittler, Influence of dislocation density on recombination at grain boundaries in multicrystalline silicon, Semiconductor Science and Technology, vol. 8, 1993, pp. 1687-1691.

S. Reber, A. Hurrle, A. Eyer, and G. Willeke, Crystalline silicon thin-film solar cells—recent results at Fraunhofer ISE, Solar Energy, vol. 77, (2004), pp. 865-875.

Y. Kondo, N. Watanabe, D. Ide, T. Matsuki, H. Takato, I. Sakata, Characterization of multicrystalline silicon wafers for solar cell applications sliced with a fixed abrasive wire, Proc. 23rd EU PVSEC Valencia, (2008) pp. 1297-1300.

N. Stoddard, B. Wu, L. Maisano, R. Russell, J. Creager, R. Clark, J.M. Fernandez, The leading edge of silicon casting and BP Solar's Mono2 Wafers, Proc. 18th Workshop on Crystalline Silicon Solar Cells & Modules (2008) pp. 7-14.

F. Henley, A. Lamm, S. Kang, Z. Liu, and L. Tian, Direct film transfer (DFT) technology for kerf-free silicon wafering, Proc. 23rd EU PVSEC Valencia, (2008) pp. 1090-1093.

O. Schultz, S.W. Glunz, S. Riepe, and G.P. Willeke, High-efficiency solar cells on phosphorous gettered multicrystalline silicon substrates, Prog. Photovolt: Res. Appl. vol. 14 (2006) pp. 711-719.

P. Cousins and B. Mulligan, Cost as a design requirement for High-Efficiency Silicon Solar Cells, Proc. 19th Workshop on Crystalline Silicon Solar Cells & Modules (2009) pp. 20-24.

B.L. Sopori, A new defect etch for polycrystalline silicon, Journal of the Electrochemical Society, vol. 131 (1984) p. 667.

F.J. Humphreys, Review Grain and subgrain characterisation by electron backscatter diffraction, Journal of Materials Science, vol. 36 (2001) pp. 3833-3854.

T. Buonassisi, A.A. Istratov, M.D. Pickett, J.P. Rakotoniaina, O. Breitenstein, M.A. Marcus, S.M. Heald, and E.R. Weber, Transition metals in photovoltaic-grade ingot-cast multicrystalline silicon: Assessing the role of impurities in silicon nitride crucible lining material, Journal of Crystal Growth, vol. 287 (2006) pp. 402-407.

T. Buonassisi, A.A. Istratov, M.D. Pickett, M. Heuer, J.P. Kalejs, G. Hahn, M.A. Marcus, B. Lai, Z. Cai, S.M. Heald, T.F. Ciszek, R.F. Clark, D.W. Cunningham, A.M. Gabor, R. Jonczyk, S. Narayanan, E. Sauar, and E.R. Weber, Chemical natures and distributions of metal impurities in multicrystalline silicon materials, Progress in Photovoltaics: Research and Applications, vol. 14 (2006) pp. 513-531.

* cited by examiner

SELECTED METHODS FOR EFFICIENTLY MAKING THIN SEMICONDUCTOR BODIES FROM MOLTEN MATERIAL FOR SOLAR CELLS AND THE LIKE

RELATED DOCUMENTS

Priority is hereby claimed to and this is a continuation of U.S. Ser. No. 13/299,031, entitled METHODS FOR EFFICIENTLY MAKING THIN SEMICONDUCTOR BODIES FROM MOLTEN MATERIAL FOR SOLAR CELLS AND THE LIKE, in the names of Emanuel M. Sachs et al., filed on Nov. 17, 2011, set to issue on Oct. 23, 2012 under U.S. Pat. No. 8,293,009, which is a continuation of U.S. application Ser. No. 12/999,206, entitled METHODS AND APPARATI FOR MAKING THIN SEMICONDUCTOR BODIES FROM MOLTEN MATERIAL, in the names of Emanuel M. Sachs et al., filed Jun. 28, 2011, the U.S. National Phase of PCT application PCT/US2010/026639, having an International Filing Date of Mar. 9, 2010, which is a non-provisional of and claims priority to U.S. Provisional application Ser. No. 61/209,582, entitled METHOD AND APPARATUS OF MAKING THIN SEMICONDUCTOR SHEETS FROM MOLTEN MATERIAL, in the names of Emanuel M. Sachs, Richard L. Wallace, Eerik T. Hantsoo and Adam M. Lorenz, filed on Mar. 9, 2009, and U.S. Provisional application Ser. No. 61/224,730, entitled DIRECT KERFLESS SILICON WAFER PROCESS, in the names of Emanuel M. Sachs, Richard L. Wallace, Eerik T. Hantsoo and Adam M. Lorenz, filed on Jul. 10, 2009, and U.S. Provisional application Ser. No. 61/237,965, entitled KERFLESS SILICON WAFER FORMING PROCESSES, in the names of Emanuel M. Sachs, Richard L. Wallace, Adam M. Lorenz, Eerik T. Hantsoo and George David Stephen Hudelson, filed on Aug. 28, 2009, each of which is hereby incorporated herein fully by reference.

INTRODUCTION

Inventions disclosed herein are methods of making a sheet of silicon, which may later be used as a preform that is recrystallized to produce a high quality substrate for the manufacture of silicon solar cells. Other inventions disclosed herein are methods for making a thin sheet of silicon that can be used for manufacture of solar cells without recrystallization. Methods disclosed herein may also be used to make thin sheets from molten semiconductor materials other than silicon.

Processes are disclosed in Patent Cooperation Treaty Application No. PCT/US2008/008030, entitled, RECRYSTALLIZATION OF SEMICONDUCTOR WAFERS IN A THIN FILM CAPSULE AND RELATED PROCESSES, filed Jun. 26, 2008, in the names of Emanuel M. Sachs, James G. Serdy, and Eerik T. Hantsoo and the Massachusetts Institute of Technology, designating the United States of America, and also claiming priority to a provisional United States application, U.S. No. 60/937,129, filed Jun. 26, 2007. The technology disclosed in these applications can be used to recrystallize a semiconductor to a different crystal form and is referred to herein as Recrystallization In a Capsule (RIC) technology. The RIC PCT application and the US provisional application is hereby incorporated fully herein by reference. Methods disclosed herein can be used to make the starting material semiconductor sheet preform, which is later recrystallized using RIC technology.

Certain processing schemes and architecture are disclosed in Patent Cooperation Treaty Application No. PCT/US2008/002058, entitled, SOLAR CELL WITH TEXTURED SURFACES Filed: Feb. 15, 2008, in the names of Emanuel M. Sachs and James F. Bredt and the Massachusetts Institute of Technology, designating the United States of America, and also claiming priority to two provisional U.S. applications, U.S. No. 60/901,511, filed Feb. 15, 2007, and U.S. No. 61/011,933, filed Jan. 23, 2008. All of the PCT application and the two US provisional applications are hereby incorporated fully herein by reference. The technology disclosed in these applications is referred to herein collectively as Self Aligned Cell (SAC) technology. Methods disclosed herein can be used to make textured semiconductor wafers for use as a starting workpiece for self-aligned cells disclosed in the SAC patent applications.

SUMMARY

In one embodiment of a method disclosed herein shown in FIGS. 3A, 3B, 3C and 3D, a melt of silicon 13 is maintained and a cool sheet 15 of porous refractory material, such as graphite, is passed over the melt so that the refractory material contacts the top 15 of the melt. A vacuum 17 is applied to the top of the porous refractory sheet so as to pull the ambient atmosphere through the sheet. Upon contact with the melt, two events take place essentially simultaneously: 1) the silicon freezes to the cooled surface of the porous refractory sheet; and 2) the vacuum holds the silicon to the refractory sheet. The result is a thin sheet 19 of silicon on a cool refractory substrate. The silicon may be released from the refractory sheet after releasing the vacuum 17. There is little or no adhesion to the refractory sheet 5, as the refractory sheet was cool upon contact to the silicon melt 13. The method may be used to form thin sheets of other semiconductors in addition to silicon. The following discussion uses silicon as an initial example and generalizes this later.

BRIEF DESCRIPTION OF THE DRAWINGS

FIG. 3B showing a sheet of semiconductor formed on the mold sheet; FIG. 3C showing the plenum and mold sheet assembly removed from the melt and FIG. 3D showing the formed semiconductor sheet released from the mold sheet upon release of the vacuum in the plenum;

FIG. 4B showing a sheet of semiconductor forming on the mold sheet as the mold sheet moves across the surface of the melt; FIG. 4C showing the plenum and mold sheet assembly removed from the melt after having passed beyond it; and FIG. 4D showing the formed semiconductor sheet released from the mold sheet upon release of the vacuum in the plenum;

FIG. 5B showing a sheet of semiconductor forming on the mold sheet; FIG. 5C showing the plenum and mold sheet assembly removed from the melt; and FIG. 5D showing the formed semiconductor sheet released from the mold sheet;

FIG. 7B showing the textured refractory sheet with a conforming shell of semiconductor adhered thereto; and FIG. 7C showing the formed, textured semiconductor sheet released from the mold sheet.

DETAILED DESCRIPTION

General aspects of inventions disclosed herein are discussed first. Following the general aspects, detailed variations are discussed.

Figure 1:
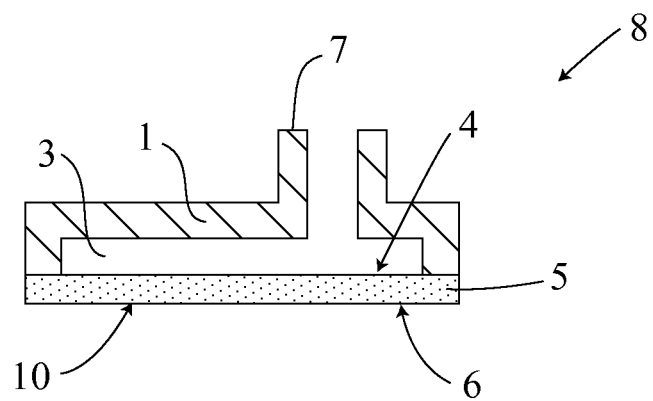
FIG. 1 is a schematic representation of a plenum and refractory mold sheet for use with inventions hereof.
Figure 3A:
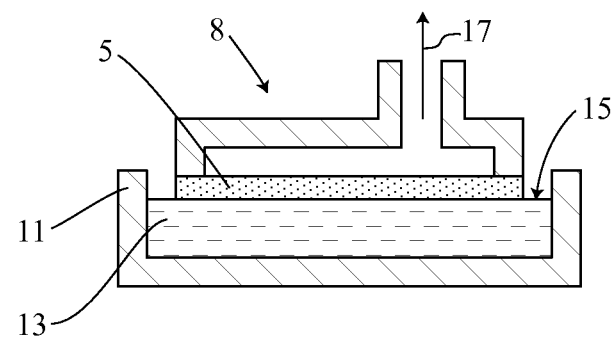
FIGS. 3A, 3B, 3C and 3D are a schematic representation of method steps of an invention hereof using a plenum such as shown in FIG. 1, with FIG. 3A showing a refractory sheet contacting a melt surface.
Figure 3B:
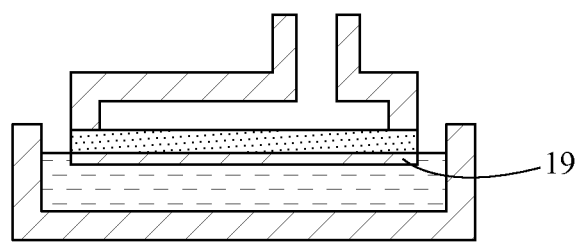

An aspect of an invention hereof will first be discussed in a batch implementation, where a single semiconductor sheet is made at a time, as shown schematically with reference to FIGS. 3A-3B. In this case, the semiconductor melt 13 may be contained in a fairly conventional crucible 11 made of graphite, silica, silicon carbide, silicon nitride and other materials known to contain molten silicon. As shown in FIG. 1 in detail a vacuum plenum 1 is created, for example, by machining a cavity 3 into a block of graphite. A thin sheet 5 of graphite is affixed to the bottom of the plenum 1. This sheet preferably has a fair degree of gas permeability (having a high porosity and/or being relatively thin). The plenum is preferably the least porous graphite available. The plenum could also be made of non-porous ceramic. The thin sheet will be referred to herein as the mold sheet. Vacuum suction is applied at port 7. The assembly 8 of plenum 1 and mold sheet 5 is supported from above by a structural member (not shown). An extension of vacuum port 7 may act as this structural member, or a separate structural member may be provided. Referring now to FIG. 3A, the assembly 8 is brought into contact with the surface 15 of melt 13 as in FIG. 3A. The assembly is allowed to remain in contact with the melt for a designated period of time, perhaps on the order of 1 second. The amount of contact time between the assembly and the melt will vary depending on factors that include, but are not limited to: the temperature of the melt, the temperature of the mold sheet, the thickness of the mold sheet and the intended thickness of the silicon sheet to be fabricated. A silicon sheet freezes onto the mold sheet, as shown in FIG. 3B because the mold sheet 5 is colder than the freezing point of the silicon. The process is thus a transient heat transfer resulting in the silicon melt 13 being cooled to the melting point and then heat of fusion being extracted, resulting in the buildup 19 of solid silicon on the mold sheet. In general, the mold sheet should be kept colder than the freezing point of the molten material. Even more generally, at least a portion of the mold sheet should be at a temperature below the freezing point, for at least a portion of the time that the mold sheet contacts the molten material. Taking silicon as an example, the freezing/melting point is 1412° C.). Useful ranges for maintaining the mold sheet might go from room temperature to 1300° C., with likely range from 900° C.-1200° C., but any temperature below the freezing/melting point may be suitable, depending on the totality of the circumstances.

A principal purpose of the vacuum is to cause the silicon sheet 19 to be temporarily held against the mold sheet 5. It is helpful that the silicon sheet 19 be easily removed from the mold sheet 5 after the silicon sheet is formed. It is very helpful if the silicon sheet would simply fall off. However, it is very important that as the silicon sheet is being formed, it adhere to the mold sheet 5. The vacuum 17 accomplishes this goal. Without the vacuum, when the mold sheet is removed after being in contact with the molten silicon 13 for the appropriate length of time, the solidified silicon 19 would likely remain behind on the top 15 of the melt and then it would remelt. Indeed, significant adhesion is needed to remove the solidified silicon sheet 19 from the melt 13, 15 because the surface tension of the molten silicon is holding the silicon sheet 19 down.

Figure 3C:
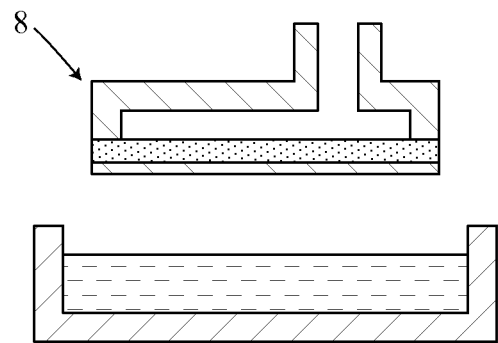
Figure 3D:
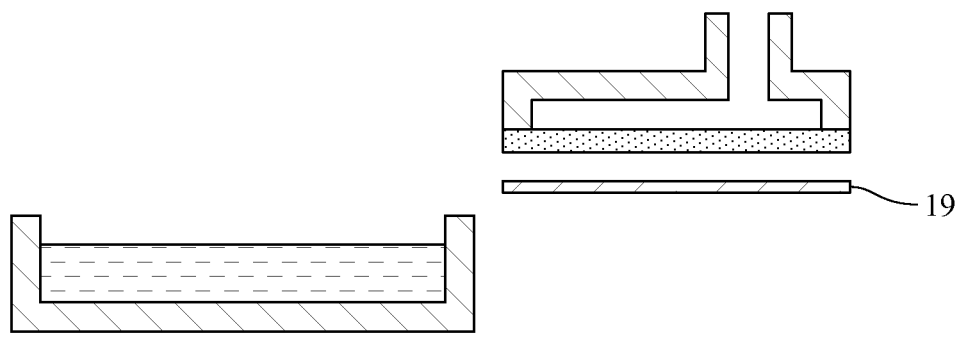

After the designated period of time, the assembly 8 is lifted out of the melt 13, now carrying silicon sheet 19 attached to it, as shown in FIG. 3C. Finally, in FIG. 3D, the vacuum 17 is released and the formed silicon sheet 19 can be separated from the mold sheet 5. Upon release of the vacuum 17 the silicon sheet 19 may simply fall off. However, some small amount of residual adhesion may keep the sheet from falling off. One approach is to apply positive gas pressure to the plenum of assembly 8, so as to blow sheet 19 off. Another is to provide some gentle mechanical removal. Techniques for this are discussed in detail below.

Figure 6:
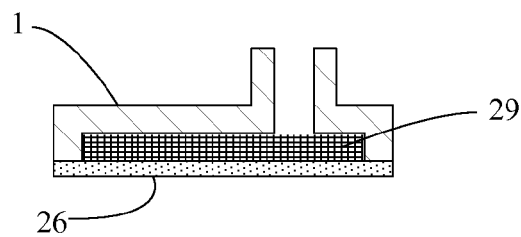
FIG. 6 is a schematic representation of a plenum and refractory mold sheet such as shown in FIG. 1, with a backing reinforcing the refractory sheet.

The graphite mold sheet 5 must have sufficient porosity to allow for suction sufficient to accomplish the goal of adhering to the silicon sheet 19. There are a very large variety of grades of graphite, ranging over a very large range of porosity. Thus there are many suitable choices. Two such suitable choices are Grade UT6 and Grade 2191, both from Ultra Carbon Corporation of Bay City Mich., a division of Carbone of America. Lower porosity graphites can also be used by making a mold sheet 26 thin so as to allow sufficient flow of gas through it. As shown schematically with reference to FIG. 6, if the mold sheet 26 is too thin to support itself over its full width while under vacuum, backup structure 29 may be provided within the plenum. This structure may be machined into the plenum in the form of ribs and posts. Alternatively, a piece of very porous graphite or other porous material may be placed in the plenum to provide backup support. For example, extremely high porosity can be attained using ceramic filter bodies, which are known in the art.

The porosity of the mold sheet 5 must not be so great as to allow the molten silicon 13 to enter the pores, thereby making release of the silicon sheet 19 difficult or impossible. Two independent factors combine to prevent silicon from entering into fine pores. First, the surface tension of the molten silicon is too high to permit it to infiltrate fine pores (of a non-wetting material). Second, the silicon is beginning to freeze rapidly on contact to the mold sheet and this freezing would be especially fast in the high surface area to volume ratio situation presented by a fine pore. The second factor is present even for a wetted material.

Figure 2:
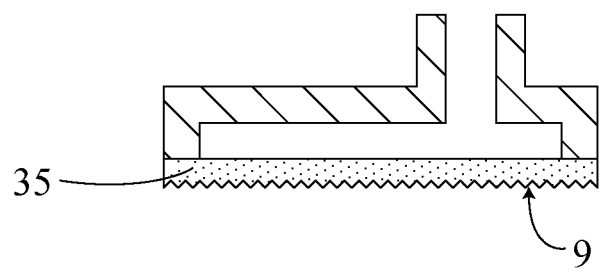
FIG. 2 is a schematic representation of such a plenum with a refractory mold sheet having a textured surface.

An advantage of lower porosity graphite for the mold sheet is that the grain size of this material is smaller and the material can therefore allow for fine finishes on the formed silicon sheet. These finishes can be nearly mirror-like and provide for a very smooth silicon sheet. Alternatively, as shown in FIG. 2, a graphite sheet 35 may have texture 9 deliberately machined into mold sheet 5, with the intent of transferring the texture to the formed silicon sheet. This texture can then act to trap light and also to provide the grooves needed to accomplish manufacturing operations of the cell, such as are described in the SAC patent applications mentioned above, such as channels for metallization, such as conductive fingers, and bus-bars. The application of vacuum draws the silicon melt to fill relevant texture elements, such as grooves, channels, etc. The vacuum suction needs to overcome the surface tension of the molten silicon to fill a texture element. The texture element can be modeled as a hemisphere. It follows that the smallest hemispherical texture element that can be filled can be estimated by applying Laplace's equation, as follows:

$$\text{Pressure} = 1 \text{ atm} = 2\gamma/r$$

Where γ is the surface tension of the molten silicon and r is the radius of the hemispherical texture. For silicon with γ=0.72 N/m, r=7 microns. This is sufficiently small to allow for good light trapping, especially since the texture can be larger than with an etched texture (since no silicon needs to be etched/wasted). The feature sizes of the metallization grooves are larger than those of the light trapping features, and thus, the metallization grooves are easier to fill with molten material. In fact, the light trapping texture can be done at a very large scale. The topography of the top surface can have a characteristic feature scale that can be deeper than the thickness of the wafer itself. The foregoing discussion relates to using a melt surface at approximately atmospheric pressure. Below, variations are discussed using a melt surface at higher than atmospheric pressure, which would permit achieving smaller hemispheric texture elements than is discussed above.

Figure 7A:
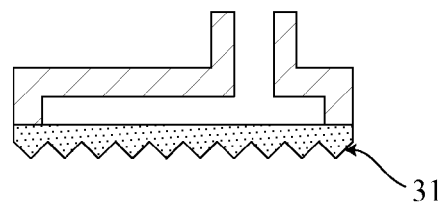
FIGS. 7A, 7B, and 7C are a schematic representation of method steps of an invention hereof using a plenum such as shown in FIG. 1 with a mold sheet that has a very large scale texture so as to provide a semiconductor sheet with such a large scale texture, with FIG. 7A showing a textured refractory sheet.
Figure 7B:
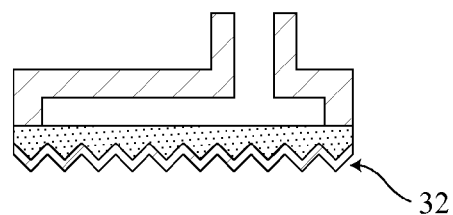
Figure 7C:
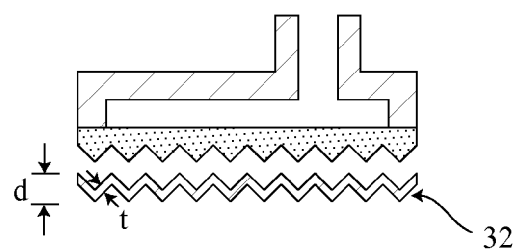

FIGS. 7A, 7B and 7C show a mold sheet 31 with large scale texture. The scale of this texture is larger than the intended thickness of the silicon sheet to be formed. FIG. 7B shows the mold sheet and plenum assembly with the frozen semiconductor sheet 32 in place. FIG. 7C shows the silicon semiconductor sheet 32 after release from the mold sheet. As shown, the amplitude of the corrugations of the formed sheet 32 is at least three times the thickness of the sheet 32 itself.

One important issue is that when the frozen layer is lifted out of the melt, some liquid may stick to the bottom and then freeze in a way so as to make the bottom lumpy. One method to minimize this is to lift the mold sheet up one edge, or corner first, thereby allowing molten material to run off the bottom of the wafer and back into the bulk of the melt.

The rapid disengagement of the freezing semiconductor sheet from the bulk of the liquid can be aided by lifting the mold sheet up a few millimeters (up to approximately 10 mm is possible without meniscus detachment) immediately after contact with the melt. This will establish a meniscus of liquid, which will more readily drop off when the mold sheet is raised at the end of solidification. The steps of tilting the formed semi-conductor sheet to minimize excess liquid attachment are discussed in more detail below.

Another approach to removing any residual liquid from the underside of the formed semiconductor sheet upon withdrawal is to rapidly spin the mold sheet and attached semiconductor sheet thereby throwing the residual molten material off to the side. This can be practiced with a square shaped mold sheet. However, for symmetry, a round mold sheet may be used, resulting in the casting of a disk shaped semiconductor sheet wafer. This wafer could then be laser trimmed to desired shape and size and the cut off pieces re-melted. The spinning of the mold sheet and wafer could commence immediately upon detachment of the meniscus, which is effected by raising the mold sheet. Alternatively, commencement of rotation could be the means by which meniscus detachment is effected. The liquid laterally ejected by spinning could be allowed to impact into the side-walls of the containing crucible and drip back in to the melt. Alternatively, if only a small amount of liquid is ejected it may be desirable to allow this liquid to be flung over the edges of the crucible to remove them from the melt. These droplets of liquid would impact a cold surface and freeze to it for later removal during planned maintenance. This bit of liquid will have concentrated impurities in it due to the segregation of impurities during the solidification. Thus removing this liquid will remove impurities from the system. The steps of spinning the formed semiconductor sheet are discussed in more detail, and illustrated below.

It may be desirable to raise the temperature of the mold sheet up to as high as, for instance, 1200° C., or as high as it can be, while still avoiding any adhesion between silicon and mold sheet. A higher temperature mold sheet will result in slower heat transfer and larger grain size in the solidified semiconductor sheet. Further, in the single wafer batch mode now under discussion, it may be desirable for the solidification to take as long as 5 seconds to provide for easier control over the process. Further, it may be desirable to control a temperature profile across the mold sheet so as to cause the solidification to proceed from one point or side on the mold sheet to another, resulting in larger grains. For example, with a circular mold sheet it may be desired either to have the center hotter than the perimeter or the perimeter hotter than the center, depending on the desired direction of grain growth. Having the initial nucleation at the perimeter may be advantageous because these small grains would then be cut off during the trimming operation.

One means of effecting temperature control over the mold sheet is to hold it in position 1-2 cm above the melt so that it can gain heat and then blow argon out through the mold sheet (via the port that will later be used to apply vacuum) so as to provide cooling and control the temperature of the sheet. If the thickness of the mold sheet is varied over its extent, the flow through it will vary. Where the mold sheet is thicker, there will be less flow of cooling gas and the mold sheet will run hotter. Another advantage of blowing argon out the mold sheet while it is in position above the surface of the melt is that it will keep vapor such as silicon oxides, from depositing on the mold sheet.

The frozen formed semiconductor sheet may be released from the mold sheet simply by removal of vacuum. In addition, some outward flow of gas can be imposed to help separate the formed semiconductor sheet. Further, the application of pressure within the plenum so as to cause outward flow of gas can also be used to cause the mold sheet to bow out slightly and controllably, thereby helping to separate the formed silicon semiconductor sheet. These and additional methods to encourage detachment are discussed in more detail below.

In another preferred embodiment, the mold sheet is continually moved laterally over the surface of a pool of melt. While it is possible that the mold sheet be a belt and that the process be continuous, it is also possible to be practiced with mold sheets of discrete length, for instance on the order of 0.5-2 meters long. This mode will be referred to herein as a semi-continuous mode.

A differentiating requirement of a continuous and a semi-continuous modes of operation is that a melt contained within and below the walls of a crucible will not, without something else, suffice for a continuous or semi-continuous mode, because the mold sheet larger than the crucible cannot contact the melt without interfering with the crucible walls. One solution is to create a bump in the melt, much as in wave soldering. This can be done by pumping the melt up through a slot and letting the melt overflow the slot and fall back down into the main pool of melt. Molten silicon can be pumped with a centrifugal pump, immersed in the melt. Alternatively, an oscillating magnetic field, such as created from a coil placed below the melt, can cause the melt to mound up due to electromagnetic repulsion. Magneto-hydrodynamics can be used to create a bump in the melt surface, by passing a current laterally in the melt and imposing a perpendicular magnetic field, to cause an upward body force on the melt. Each of these methods is discussed in more detail below, and is illustrated with reference to figures of the drawing.

Figure 4A:
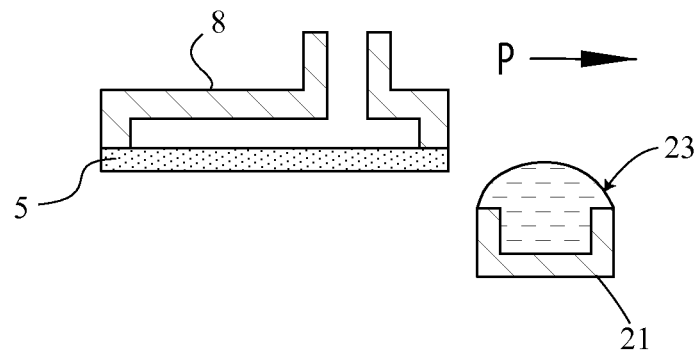
FIGS. 4A, 4B, 4C and 4D are a schematic representation of method steps of a semi-continuous embodiment of an invention hereof using a plenum such as shown in FIG. 1, with FIG. 4A showing a refractory sheet approaching a melt surface that extends above beyond the edges of a crucible.
Figure 4B:
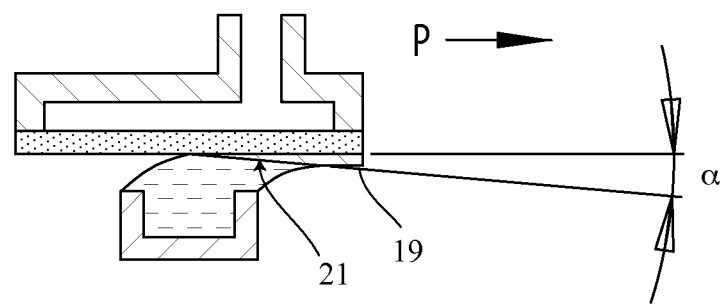
Figure 4C:
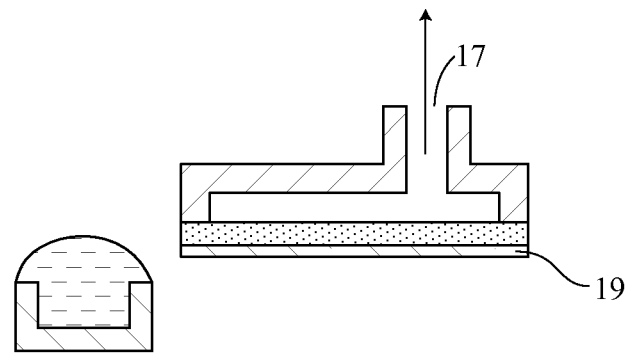
Figure 4D:
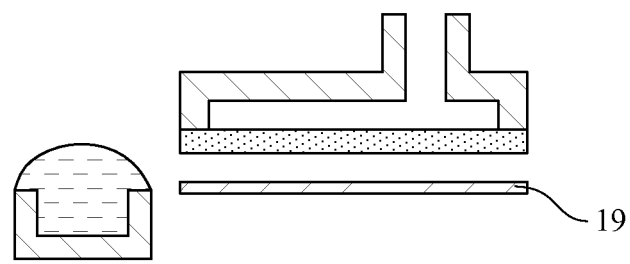
Figure 5A:
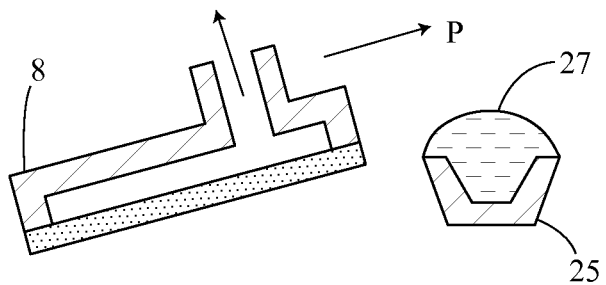
FIGS. 5A, 5B, 5C and 5D are a schematic representation of method steps of another semi-continuous embodiment of an invention hereof using a plenum such as shown in FIG. 1, similar to that shown in FIGS. 4A-4D, but with the plenum passing past the melt surface such that the mold sheet surface is inclined with respect to the melt surface, with FIG. 5A showing a refractory sheet approaching a melt surface.
Figure 5B:
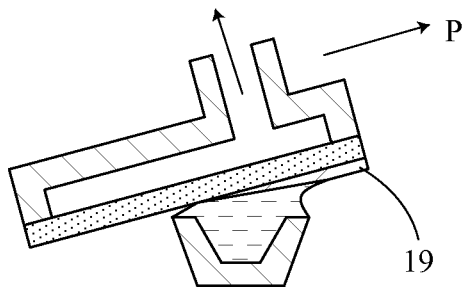
Figure 5C:
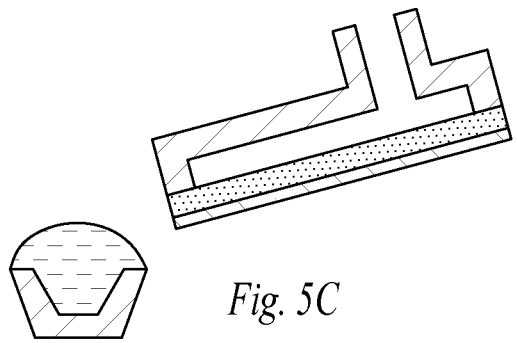
Figure 5D:
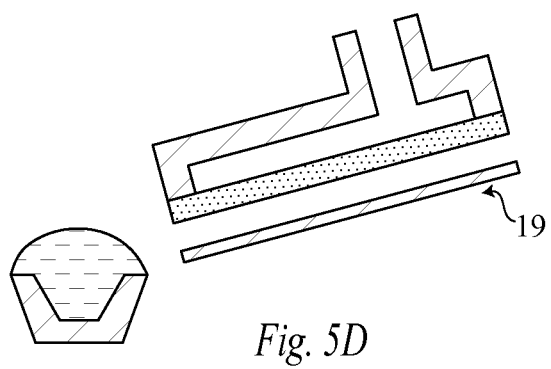

Another method for allowing the mold sheet to contact the surface of the melt in either a continuous or semi-continuous mode is shown in FIGS. 4A, 4B, 4C and 4D. The melt 23 is provided in a narrow trough 21 and the top of the melt extends over the top of the trough. The degree of extension can be small, about, 1 to about 4 mm. The melt will remain in place due to capillary action and will not overflow the trough. FIG. 4A shows the mold sheet in assembly 8 prior to arrival at the melt 23. FIG. 4B shows the mold sheet 5 approximately midway through its traverse over the melt with a thickness of silicon 19 frozen to the portion of the mold sheet 5, which has emerged from contact with the melt. The center portion of the mold sheet is still in contact with the melt and here silicon is in the process of freezing to the mold sheet. The consequence is that the interface 21, which demarks the boundary between liquid and solid, is inclined at an angle α relative to the bottom surface of the mold sheet 5 (indicated by the extension of the upper line bounding the angle ∝). FIG. 4C shows the mold sheet 5 and vacuum assembly 8 after it has completed its traverse, with the silicon sheet 19 still attached by vacuum 17. In FIG. 4D the vacuum 17 has been released and the silicon sheet 19 removed.

The speed of traverse of the mold sheet over the melt can be quite rapid. The contact time with the melt can vary between 0.001 and 1 second or more, for instance two seconds. If the contact width is 2 cm, the corresponding traverse speeds will be 20 m/s and 2 cm/s, with speeds in the range of between about 5-20 cm/s most likely.

The heat of fusion for silicon is 1787 J/g, compared to a specific heat of 0.7 J/gK. The energy required to solidify a superheated melt is overwhelmingly dominated by the heat of fusion, since even with 100° K superheat, the sensible heat accounts for only 4% of the energy required to freeze. Since the process and resulting film thickness are controlled by heat transfer, the process is very tolerant to variations in melt temperature. To solidify a 200 micron thick film, the energy required per unit area (based on heat of fusion only) is 90 J/cm$^2$. For a high thermal conductivity substrate, the heat extraction is dominated by the heat transfer coefficient between the mold sheet and the semiconductor (e.g. silicon). As an example, typical heat transfer coefficients for rapid solidification processes are $1 \times 10^3$ to $1 \times 10^6$ W/m$^2$K, with an experimental value for silicon on a water cooled copper and stainless steel wheel determining by Uno as $4.7 \times 10^3$ W/m$^2$K. Heat flux per unit area is defined as: $Q/A = h(T_{melt} - T_{substrate})$.

For a 1000 K temperature gradient, heat flux of 470 W/cm$^2$ would result in a solidification time of ~200 ms for a thickness of 200 μm. As a check to confirm the substrate thermal conductivity will not limit heat flow, the thermal diffusivity of graphite is approximately 0.1 cm$^2$/s, resulting in thermal diffusion length of 1.4 mm in 0.2 sec. Assuming the energy of solidification is taken up by a 1 mm thick surface layer of graphite with a specific heat of 2 J/gK, would result in a temp rise of 200 K in the graphite during the molding event.

In many embodiments, it will be important to keep the amount of melt available in the trough approximately constant during the traverse of the mold sheet, thus requiring that melt be admitted to the trough. This melt can come from a large reservoir of molten silicon that is contained in a crucible connected to the trough. The larger the reservoir, the smaller the change in melt height in the trough during a traverse. Further control of melt height can be achieved by using a displacer piston, for example of graphite, to compensate for the silicon withdrawn during a traverse, the piston being moved downward.

While transient heat transfer will determine a thickness of silicon sheet that will freeze to the mold sheet during the period of contact with the melt pool, some amount of liquid silicon may also be drawn off on the underside of the solidified silicon. To prevent this, the mold sheet may be traversed over the melt pool at an angle with respect to the horizontal as shown schematically in FIGS. 5A, 5B, 5C and 5D. This will provide a small hydrostatic head, which will drain any liquid silicon adhered to the bottom of the solidified silicon 19, back into the melt pool. FIGS. 5A, 5B, 5C and 5D show the same moments in the process sequence as was described with respect to FIGS. 4A, 4B, 4C and 4D, respectively. Note that the crucible 25 in FIGS. 5A and 5B has inclined outer walls. This inclination provides a margin of protection against silicon wetting down the side wall of the crucible, especially during the condition of FIG. 5B when the liquid is being drawn off the edge of the crucible.

Another important benefit of these methods is the ability to reject impurities into the melt and avoid having them incorporated into the growing silicon sheet. Most electrically harmful metallic impurities are much less soluble in the solid than in the liquid and hence tend to be rejected at the solidification interface. In crystal growth processes where the liquid/solid interface moves in a controlled direction—such as is the case in these processes—this offers the opportunity to purify the feedstock material. To be able to segregate impurities back into the bulk of the melt, the rate of advance of the liquid/solid interface must not be too high, or impurities get frozen into the solidified material. While the rate of formation of sheet is high in the inventions disclosed herein, the rate of advance of the solidification interface is significantly lower, owing to the angle α of inclination of the liquid solid interface with respect to the direction of pulling, indicated by the arrow P, which is also parallel to the bottom surface of the mold sheet. For example, consider where the width of the trough containing molten silicon is 2 cm and where the length of time needed for contact is 0.2 second. The pull speed is then 10 cm/sec. If the sheet being fabricated is 200 microns thick (a typical thickness), then the rate of advance of the solidification interface is 200 microns in 0.2 seconds, or 1 mm/sec. This rate of advance, while high, will still allow for segregation and attendant purification.

Segregation also impacts some intentional dopants and in standard crystal growth methods, makes it difficult to use such dopants. For example, gallium is a desirable p-type dopant in silicon, but is ordinarily difficult to use because segregation results in the resistivity of the grown crystal decreasing as growth continues in an ingot growth or casting process. The same is true for phosphorous, an n-type dopant. However, with methods of the current inventions, dopant will build up in the melt and reach a steady-state, which can be maintained by proper replenishment of the melt. In this way, each wafer is formed from a melt with the same level of doping and thus will itself have the same level of doping. Also, the formation of wafers directly from the melt enables close, rapid process monitoring for bulk resistivity. Any needed change in melt dopant concentration can be effected rapidly, along with each addition of Si feedstock.

The angle of inclination of the crystal growth interface is due to the fact that most of the heat is removed from the silicon across the thickness of the solidifying sheet (perpendicular to the direction of traverse/pulling). As a consequence, the temperature gradients in the solidifying sheet can be very low. This will lead to low stresses within the solidifying sheet and therefore low dislocation densities. As dislocation density is a major factor degrading the electronic performance of silicon sheet for photovoltaics, this is a major advantage.

The mold sheet 5 may be made of graphite, but also of a range of other materials including, for example, silicon carbide, silicon nitride, silica, boron carbide, pyrrolitic boron nitride and alloys of these including silicon oxynitride.

Because the mold sheet is kept cool it is also possible to consider materials such as aluminum oxide (which would otherwise lead to contamination of the melt by aluminum if contacted to the melt while hot). Other materials, such as silicon itself, are discussed below. In all cases, the porosity required to allow for vacuum suction can be created by fabricating the mold sheet from powder and either sintering or otherwise bonding the powder together in a porous body. It is also possible to make the mold sheet of a non-porous material and provide a sufficient density and multiplicity of small holes to admit the vacuum. In general, the mold sheet must exhibit enough permeability to allow suction, but not enough to admit silicon. It should not contain transition metals or transition metallic impurities. It should be fabricated in a thin sheet and either flat or with texture. It must tolerate some degree of thermal stress/shock.

The foregoing has described, in general, that the forming face of the mold sheet (also called a forming mold, in some cases) be at a temperature that is below the melting point of the semiconductor material. This must be so for a portion of the area of the forming face, for a portion of the duration of time that the forming face is in contact with the molten material, but not necessarily for the entire time and over the entire area of the forming face. Similarly, the foregoing has described that a vacuum (or, as discussed elsewhere, a pressure differential) be applied so that there is a pressure differential between the back, non-forming face of the forming mold, and the molten material, so that the molten material is drawn or forced against the forming mold. However, this pressure differential or vacuum need not be applied over the entire surface area of the forming mold, or even the entire portion that is in contact with molten material, or, for the entire duration of time that the forming mold is in contact with the molten material.

The processes described herein rely on differential pressure applied between the face of the mold sheet 5 (FIG. 1) exposed to the melt (the forming face, also called forming surface 6) and the opposite face of the mold sheet (the back face 4). A convenient means of applying this differential pressure employs a vacuum pump to generate low pressure on the back face 4 of the mold sheet, while using substantially ambient-pressure gas at the melt surface 15 and thus the forming face 6 of the mold sheet 5. An advantage of this embodiment is that the furnace enclosure does not need to be sealed gas-tight nor does it need to be capable of sustaining positive pressures beyond what is required for purge gas containment. However, in another embodiment differential pressure between the faces of the mold sheet is generated by venting the back face 4 of the mold sheet 5 directly to atmosphere, while maintaining the atmosphere on the forming face of the mold sheet at a pressure substantially higher than local atmospheric pressure. An advantage of this embodiment is that a vacuum pump is not required. A further advantage of this embodiment is that trans-mold sheet differential pressures greater than the local atmospheric pressure can be achieved, which may confer process benefits, for example in the creation of fine surface texture. The differential pressure may be applied before the mold sheet contacts the surface of the molten material, or after.

When the present specification and claims use the term vacuum, it also corresponds to any means of developing a pressure difference between the forming face 6 and back face 4 of the mold sheet 5, regardless of the absolute pressure at either the forming surface 6 or back 4 of the mold sheet 5. Experimentally, differential pressures ranging from 1 kilopascal (kPa) to 100 kPa across the thickness of the mold sheet 5 have demonstrated process viability. It should also be noted that whenever the present specification and the claims use the term vacuum, it is understood to mean a partial vacuum of any degree, up to and including a complete vacuum.

Porosity

The foregoing, and following, describe mold sheets and forming mold bodies that are porous. By porous, it is meant open-cell porosity, such that gas can flow through the porous body from one surface to an opposite surface. Such porous bodies may also include closed cell porous regions. It is necessary that the overall body be porous in such a way as to allow the transmission of gas therethrough. Thus, the term porous is used herein to describe such porous bodies that allow the transmission of gas therethrough, even though they may also included closed cell portions.

The growth of the forming semiconductor wafer may proceed in either a continuous, semi-continuous or discrete mode, as discussed above. For continuous growth a mold sheet must be fed over a rim or lip of a melt-containing crucible, come into contact with the melt over a predetermined distance, and then be fed out over a rim or lip of the crucible. A flat mold sheet would require some portion of the melt to reside above the lip of the crucible. This could be accomplished by the formation of a mound or raised bump in the melt, by mechanical pumping or magneto-hydrodynamic (MHD) forces, as discussed above and also below. Or, molten material could reside above the rim or lip of the crucible if the liquid meniscus was pinned at the top edge of the crucible. This crucible might be in the shape of a linear trough, such as shown above with reference to FIGS. 4A-4D and FIGS. 5A-5D. Such a trough could be free standing, or could reside in or above another, larger crucible. This arrangement would have the advantage of retaining any melt that was lost over the edge of the trough crucible. A means of transferring melt from the lower, larger crucible back into the trough may be useful to minimize waste.

Figure 8A:
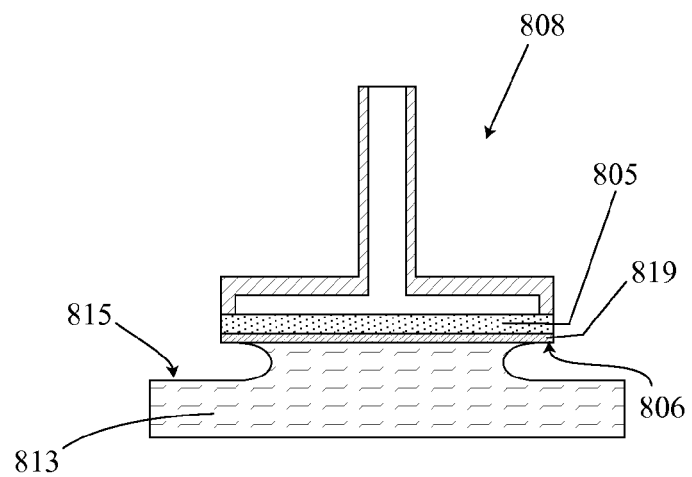
FIGS. 8 A-E show schematically, in cross-sectional view five stages of a method and apparatus that withdraws a mold forming surface from nearly face-to-face contact with a surface of a melt of molten material, and spins the mold surface causing molten material to accumulate at edges of the forming surface.
Figure 8B:
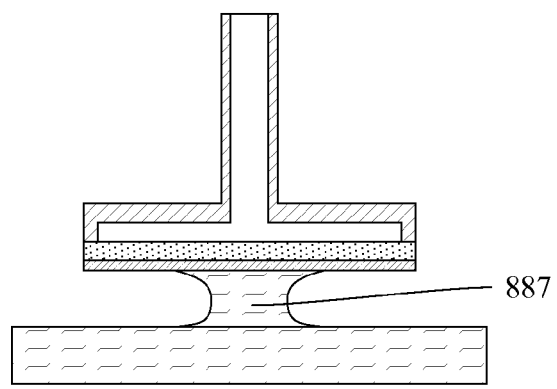
Figure 8C:
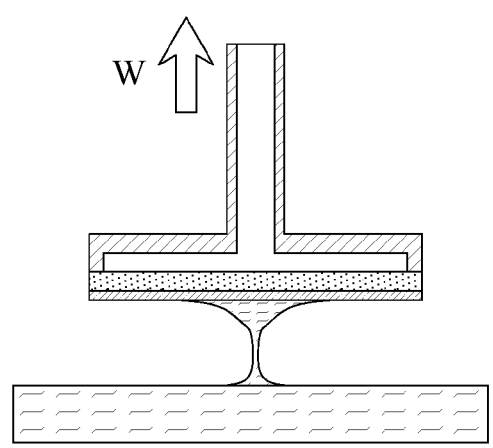
Figure 8D:
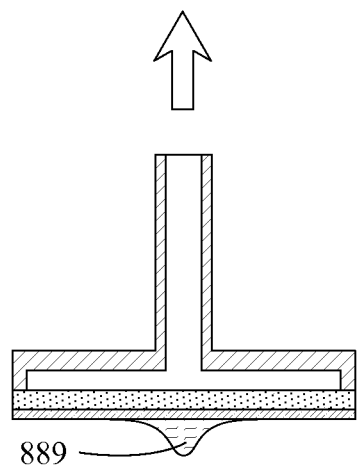
Figure 8D:
Figure 8E:
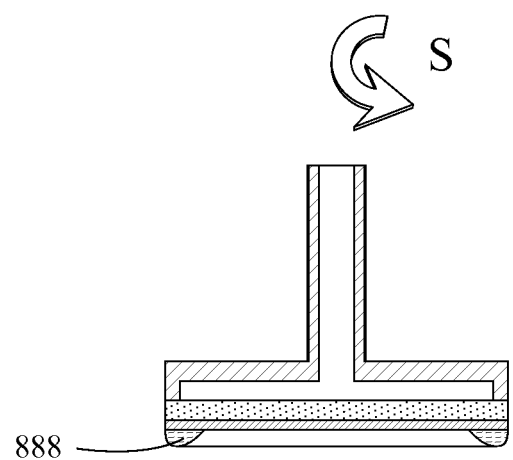
Figure 8E:

One issue with discrete or semi-continuous growth, as shown schematically with reference to FIGS. 8A-8E is the disposition of molten material remaining on the melt side surface of the wafer after forming. A microporous mold sheet 805 suspended from a vacuum plenum assembly 808 that is dipped into the melt 813 such that the forming face of the mold sheet 805 is substantially parallel to the free melt surface 815 and then withdrawn in the direction of the arrow W, tends to form a pendant drop 889 (FIG. 8D). This drop interferes with subsequent wafer processing and is generally undesirable. One method discussed above for removing this excess liquid, and now illustrated here is to spin the mold sheet 805 rapidly as indicated by the arrow S, upon withdrawal from the melt 813, thereby throwing the excess liquid off the rim or segregating it to the periphery 888 of the formed wafer 819 (FIG. 8E). This method could be used with round or polygonal mold sheets 805. Excess melt can be returned to the crucible or removed from the system as a means of impurity rejection. Excess melt localized to the rim or corners of a spinning planar substrate can be trimmed off and returned to the crucible. As with excess liquid, some or all of this material may be sequestered as a means of impurity removal. This excess melt is likely to be high in rejected impurities as it will be the last to freeze. As shown in FIG. 8E, the axis of rotation of the mold sheet 805 is substantially normal to the plane of the formed wafer 819. This need not be the case. Further, the axis of rotation is shown to be vertical, relative to a gravitational field. This also need not be the case.

Another method for dealing with a persistent drop of molten material, illustrated schematically with reference to FIGS.

9A-9C and FIGS. 10A-10E is to cause a drop 1088 to form on one edge of the formed wafer 19, rather than in the center. In this manner a sacrificial area of the wafer can be reserved for the purpose of accommodating the drop, which can be cut off of the formed wafer and fed back into the melt. One method for achieving this is to tilt the entire vacuum plenum and attached forming face at an angle to the melt surface. This approach requires the use of a vacuum connection allowing the tilt motion, and capable of operation at liquid silicon temperatures, without release of contaminants that might compromise final wafer quality.

Figure 9A:
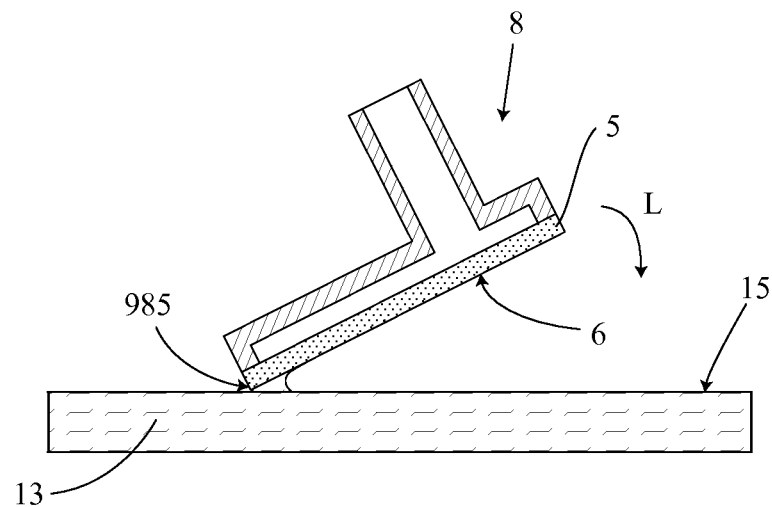
FIGS. 9 A-C, show, schematically in cross-sectional view, three stages of a method and apparatus that introduces a mold forming surface to a surface of a melt of molten material, by tilting the forming surface down toward the melt surface, to establish, progressively, nearly face-to-face contact.
Figure 9B:
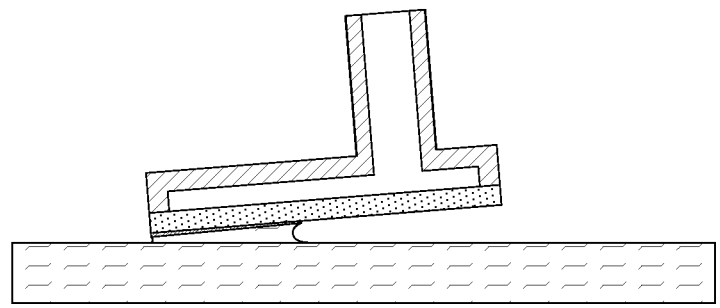
Figure 9C:
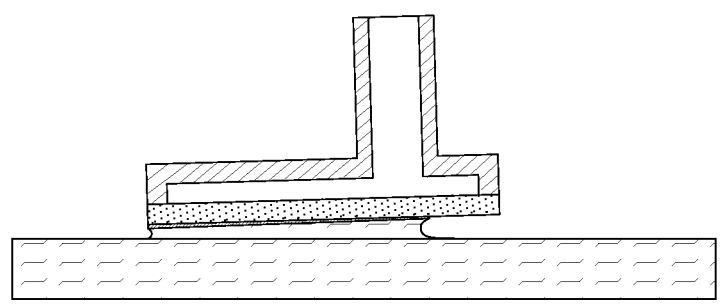

One implementation of this method is in two stages. The first stage is the lay-in (FIG. 9A-FIG. 9C), where the forming face 6 is held at a tilt and translated down as indicated by the arrow L, until contact with the melt surface 15 is made at the lower edge 985 of the forming face. The entire vacuum plenum with attached forming face is rotated about an axis parallel with the edge 985 of the forming face 6 in contact with the melt surface 15 in such a way as to sweep the molten material across the forming face 6. The edge 985 of the forming face that touched the melt surface may move vertically during this event. One consequence of this swept introduction of the molten material to the forming face 6 is to encourage lateral growth of the silicon wafer on the forming face (parallel to the plane of the forming face) so as to form an elongated grain structure with relatively large grains, which is desirable. Subsequent freezing onto this large-grained crystallographic template can occur normal to the surface of the forming face 6. Associated with the swept introduction and lateral growth is a liquid-solid silicon interface, which is at an angle with respect to the plane of the wafer (much as shown in FIG. 4B, but in that case in the context of a trough).

It should be noted that the same apparatus can also be used to introduce the forming face parallel to the surface of the melt so that all portions of the forming face contact the melt at the same time. In such a case, the interface between solid and liquid silicon will be substantially parallel to the plane of the forming sheet and of the wafer. Cases where the forming sheet is brought down parallel to the melt have the possibility of trapping small amounts of furnace ambient gas between the forming sheet and the melt, however, these small amounts of air will be removed by the vacuum which is being drawn through the forming face.

Figure 10A:
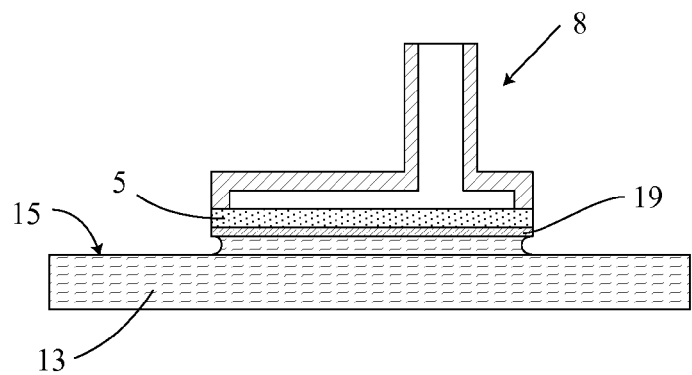
FIGS. 10 A-E, schematically in cross-sectional view, five stages of a method and apparatus that withdraws a mold forming surface from nearly face-to-face contact with a surface of a melt of molten material, by tilting the forming surface away from the melt surface while molten material accumulates at an edge of the forming surface.
Figure 10B:
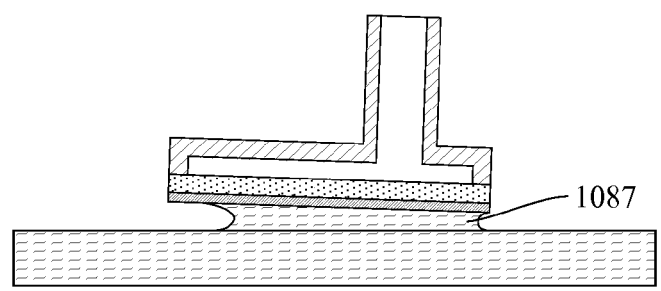
Figure 10C:
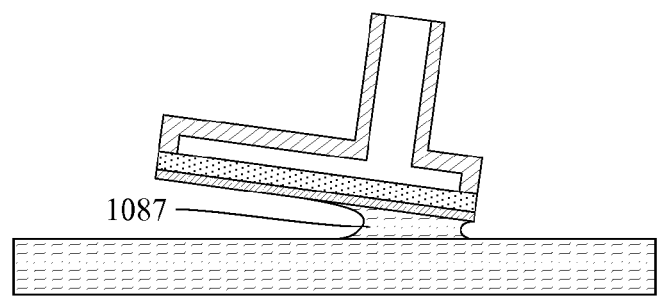
Figure 10D:
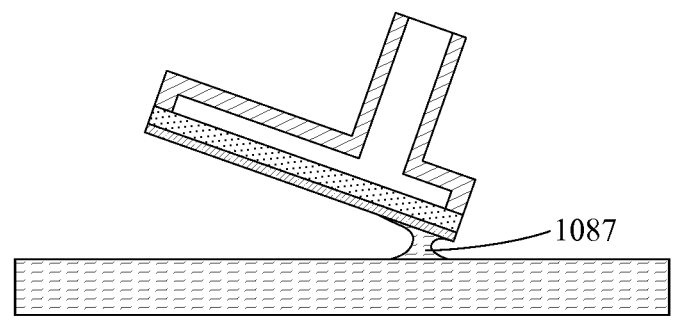
Figure 10E:
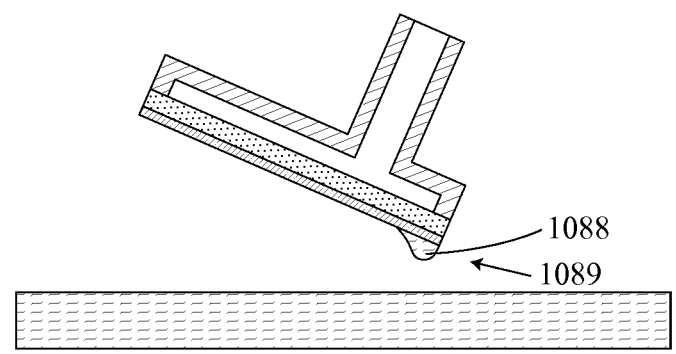

If, as shown with reference to FIGS. 10A-10E, the forming surface 6 is tilted as the mold sheet 5 is removed from the melt surface 15 the liquid meniscus 1087 can be shed in a controlled manner, and any residual melt 1088 left at the edge 1089 of the formed wafer 19 (FIG. 10E). This has the advantage of sweeping the meniscus in a linear manner across the wafer surface, leaving behind only a very thin film of molten material. As with the spinning arrangement, the excess or segregated material may be trimmed off and returned to the melt; with some of the trimmed material sequestered for removal of impurities from the melt and crucible.

The surface finish, including flatness and smoothness, of the silicon wafer is determined in large part by the shedding of the liquid meniscus after growth of the wafer. Good surface finish may be attained by the tilting motion described above but other processes may also further improve surface finish. One important factor in the detachment of the liquid meniscus is the motion of the melt during the shedding of the liquid from the wafer surface, for instance by tilting, or spinning the formed wafer, as described below. A controlled, slow, smooth retraction of the wafer from the liquid leads to a smooth wafer surface. Instability of the liquid meniscus during shedding, as for example caused by waves in the melt, can lead to adverse surface artifacts, such as ripples and bumps, on the surface of the wafer.

Figure 11:
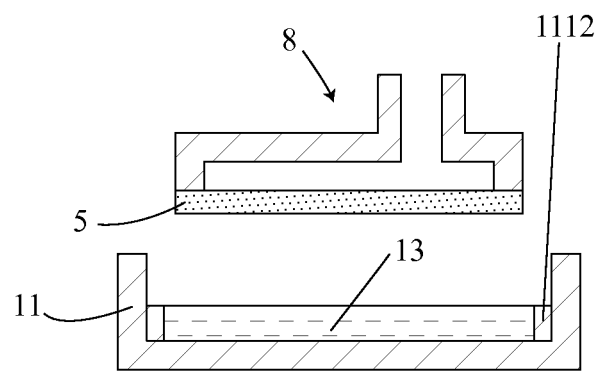
FIG. 11 shows, schematically, a crucible with a rim of partially submerged graphite.

One method to improve the surface finish of the wafer is to reduce the amplitude of any wave motion of the melt, and rapidly damp any waves that do occur. One method for reducing wave amplitude is to use a shallow melt 13 (FIG. 3A), for example a melt depth of 5 mm or less is useful, and even as shallow as 3 mm or 1 mm, if local particulate impurities on the crucible bottom are not larger than about 0.5 mm. The minimum melt depth achievable for certain non-wetting crucible 11 materials, such as quartz, is dictated by the surface tension of liquid silicon and the contact angle between liquid silicon and the crucible material. As a result, to obtain very shallow melt depths in such materials, a rim of wetting material may also be included to ensure full areal coverage of the crucible. For example, as shown schematically with reference to FIG. 11 a thin (e.g. 5 mm thick) ring 1112 of graphite (which is wetting for silicon) can be used, with an outer diameter that matches the inner diameter of the crucible 11, and a height equal to the desired depth of the melt 13.

Figure 12:
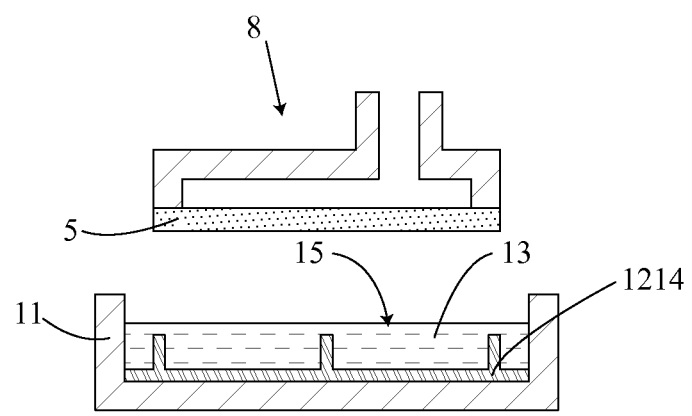
FIG. 12 shows, schematically, a crucible with submerged baffles for suppression of wave motion.

Another method for reducing waves in the melt, shown schematically with reference to FIG. 12 is to use physical baffles 1214 submerged below the surface 15 of the melt 13. These baffles impede lateral flow of liquid and quickly damps out any wave motion present in the melt.

Another means of controlling the rate of removal of melt from the formed wafer surface may be a meniscus control element. This consists of a separate body that is moved relative to the forming face and the position of which controls the position of detachment of the meniscus from the freshly formed wafer surface.

This topic discusses the stability of a meniscus attached to a forming face that is parallel to but raised from the nominal free melt surface. The equilibrium wetting angle of a liquid on a solid surface is determined by the surface energies of the melt and the surface. This angle is repeatable and is considered to be a constant for a given system of liquid, solid, and ambient gas. The equilibrium angle of attachment of liquid silicon on solid silicon in an inert gas is 11 degrees. Should a physical situation exist where the wetting angle is perturbed to less than 11 degrees then the meniscus attachment point will tend to move until equilibrium is re-established and the angle of attachment is 11 degrees. The case of attachment of the liquid meniscus to the horizontal forming face (held parallel to the free melt surface) may be examined by using Laplace's equation, which relates the pressure difference across a liquid-gas or liquid-liquid interface, the radii of curvature of that surface, and the surface energy of that interface. The pressure across the interface can be taken as the hydrostatic pressure:

$$P = \rho g H$$

(liquid density*gravity*height from free surface). The ambient gas pressure is taken as a constant in this calculation, and is considered to be equal to the pressure in the liquid at the free melt surface.

If a linear edge of attachment is considered then there is only one radius of curvature, and Laplace's Equation becomes $$P = 2\gamma/r.$$

By assuming an angle of attachment and incrementing along the surface in very small steps of swept angle the associated pressure drop and change in curvature can be solved for numerically. It was found through iteration that the maximum stable height of the forming face above the free melt surface was about 0.01077 m. A density value of 2530 kg/m³ and a surface tension of 0.72 N/m was assumed.

In the case of a forming face being slowly raised from the free melt surface the following can be predicted. As long as the attachment angle of meniscus to forming face is greater than 11 degrees the system is stable and the liquid 813 remains attached to the edge of the forming face. Once the forming face is raised to the height where a further increase in height would demand an angle of attachment of less than 11 degrees to the flat surface of the forming face, the meniscus 887 moves laterally until equilibrium is re-established or until the traveling meniscus from the other edge of the forming face is met. In this case the contact between the melt and the forming face is lost, and a large remaining droplet 889 is left on the forming face (FIG. 8D). Very small perturbations in the height of the melt can vary the velocity of detachment of the meniscus, or even reverse it temporarily. These perturbations can be caused by waves in the melt; which are difficult to avoid in a container of liquid (crucible) subject to agitation by the action of the vacuum plenum and forming face.

Control of the velocity of meniscus detachment is desirable, as it has been observed that the surface finish of Si sheet formed by this technique is highly dependent on the relative speed of withdrawal of the meniscus from the sheet surface. Techniques that better control the speed of withdrawal of the meniscus from the surface of the freshly formed Si sheet are well suited to control the surface finish of the Si sheet.

The above discussion of stability of meniscus attachment pertains to the control of detachment velocity of the meniscus from the Si sheet. One means of controlling the rate of removal of melt from the formed wafer surface may be a meniscus control element. This consists of a separate body that is moved relative to the forming face and the position of which controls the position of detachment of the meniscus from the freshly formed wafer surface.

Figure 13A:
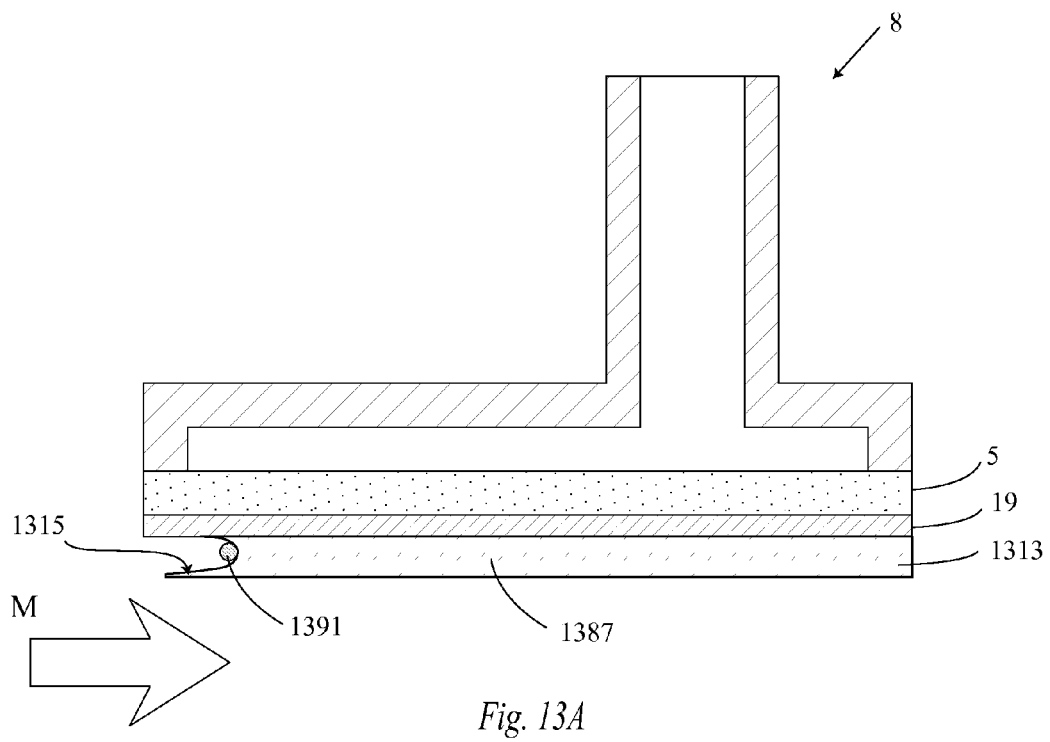
FIGS. 13A and 13B show, schematically in cross-sectional view, two stages of a method and apparatus, showing detaching a meniscus of molten material from a formed semiconductor body with a meniscus control element that is above the free surface of the melt and that is not wetted by the molten material.
Figure 13B:
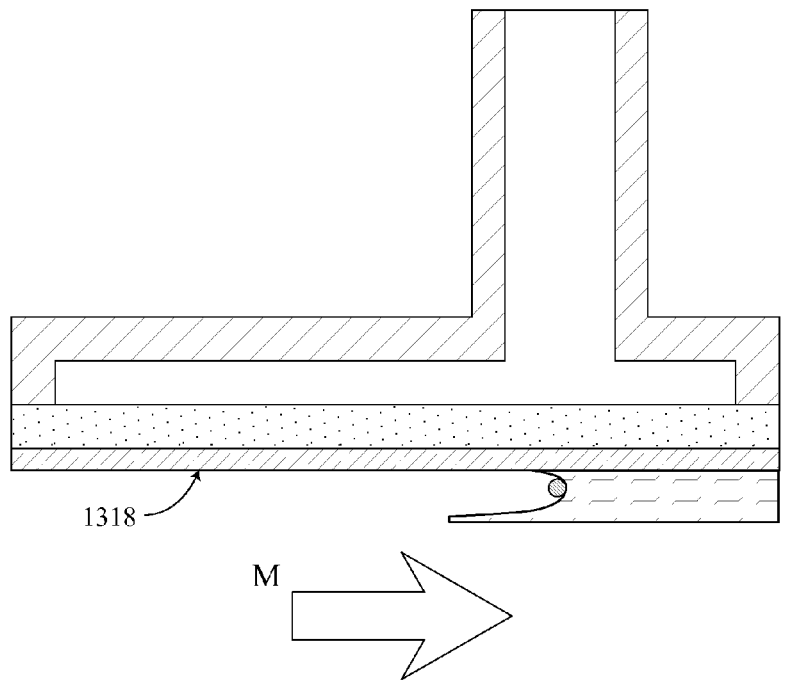

One configuration of meniscus detachment mechanism uses a material that is not wetted by the melt. The material should have a wetting angle of greater than approximately 60 degrees with respect to the molten material in the ambient atmosphere present. FIGS. 13A and 13B show one possible implementation of such a mechanism. In this example, a wafer 19 is formed by dipping the mold sheet 5 into the melt 1313. After growth of the wafer, the mold sheet 5 is retracted above the free surface 1315 of the melt 1313, to such a height that the liquid meniscus 1387 is still attached to the melt side of the formed wafer 19 (less than 0.01077 m per the above example). The meniscus control element, for instance, consisting of a horizontal cylinder 1391 of small diameter (for example 5 mm), is translated between the formed wafer 19 and the melt 1313, in the direction indicated by the arrow M, forcing the detachment of the liquid meniscus 1387 from the solid silicon wafer 19. This occurs due to deformation of the meniscus surface such that the attachment angle would be less than 11 degrees if the attachment position remained stationary. After translating the control element 1387 across the full length of the wafer 19, the melt side surface 1318 of the wafer 19 is nearly free of liquid silicon 1387.

Figure 14A:
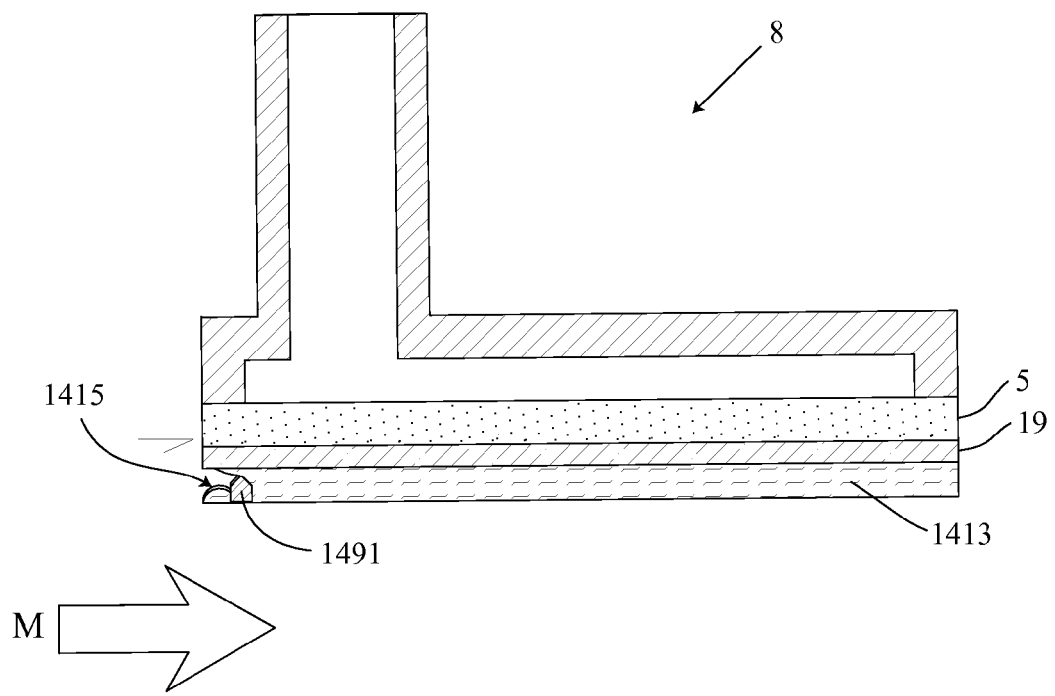
FIGS. 14A and 14B show, schematically in cross-sectional view, two stages of a method and apparatus, showing detaching a meniscus of molten material from a formed semiconductor body with a partially submerged meniscus control element that is not wetted by the molten material.
Figure 14B:
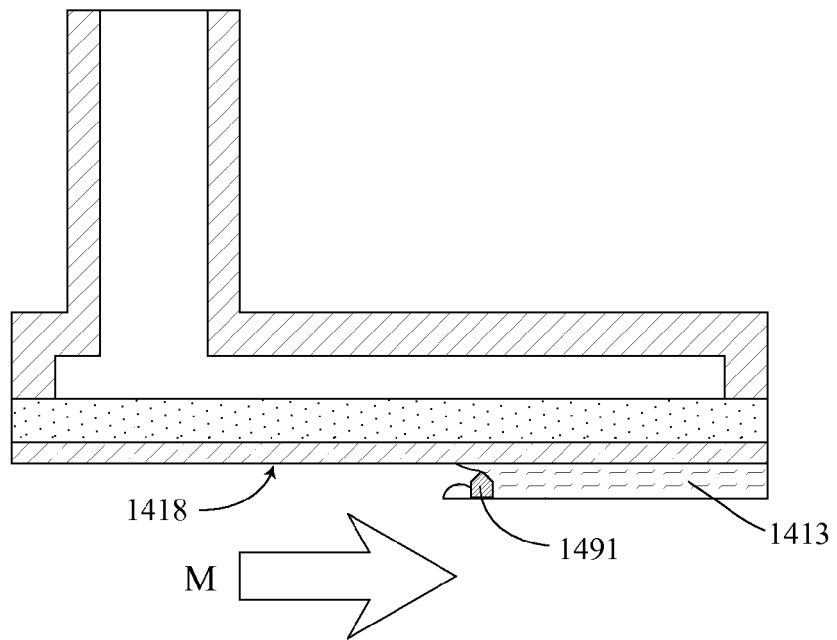

Another configuration of meniscus control element, shown in FIGS. 14A and 14B, is a body 1491 of a non-wetting material, which is partially submerged below the free melt surface 1415 of the melt 1413. Other elements shown in FIGS. 14A and 14B with reference numerals that begin 14, and are similar to those set in FIG. 13, which begin 13 and have the same numerals for the least significant digits, are themselves, analogous.

The meniscus control element may be combined with vertical or tilting motion of the plenum and mold sheet, or may involve both vertical and lateral motion of the meniscus detaching body.

Trough

Wafer surface finish quality may be affected by the withdrawal speed of the meniscus from the freshly formed wafer surface. A means of tightly controlling this speed is desirable. Also, a staged introduction of the molten material to the mold sheet surface, in a controlled sweep may have benefits in the final crystallography of the formed wafer. Specifically, a lateral introduction of molten material to the forming face of the mold sheet may encourage lateral growth of all or part of the forming wafer—resulting in larger, elongated grain structure. By lateral introduction, it is meant that relative motion is provided between the forming face and the free surface of the molten material, which relative motion has a component that is parallel to the plane of the free surface or tangential in the case of a curved melt free surface. Subsequent freezing of semiconductor material, such as Si from the melt to this crystallographic template of elongated grain structure may occur to reach the desired wafer thickness. One means of achieving both the controlled introduction of melt to mold sheet surface and separation of melt from the wafer surface is by use of the trough mentioned above, in connection with FIGS. 4A-4D and FIGS. 5A-5D and to provide a bump, or raised portion of the melt. Means to provide such a bump are discussed below. In those methods, the trough 21 (filled with molten material) is positioned such that the melt makes contact with one edge of the mold sheet 5, after which lateral relative motion of the trough 21 to the mold sheet 5 is effected to sweep the molten material 23 across the forming face of the mold sheet 5. Such motion might be combined with tipping of the mold sheet 5 to encourage removal of melt from the wafer surface, as just described. A gas jet might also be used to force the excess melt off the wafer surface. Such a trough requires a means of filling or replenishing, as melt would be lost to wafers being formed, as well as possible spillage over the edge. In a discrete or semi-continuous mode of growth, the trough can be refilled by submerging it under the surface of a melt in a larger crucible.

Pumped Raised Melt

Figure 15:
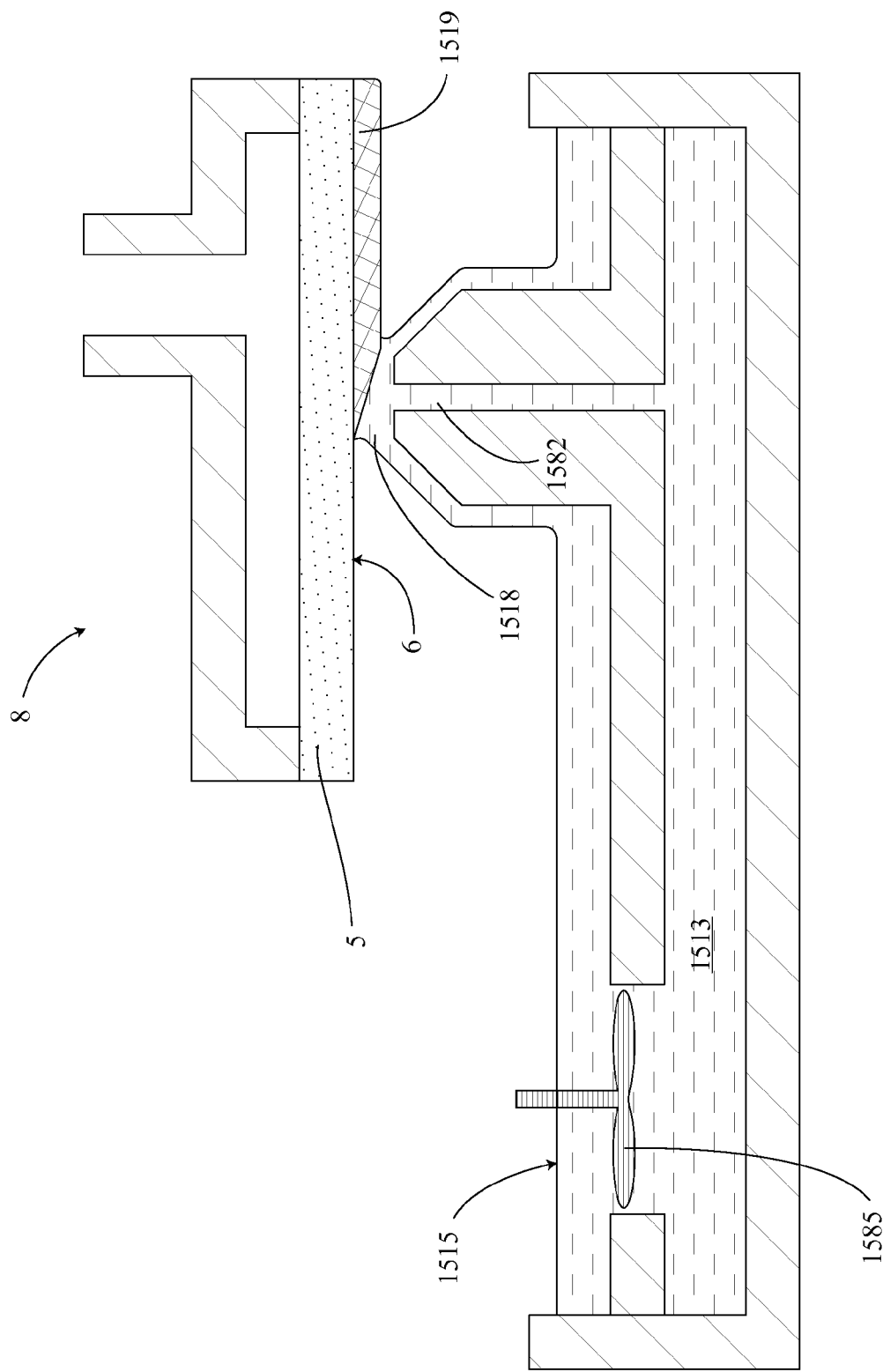
FIG. 15 shows, schematically, a cross-sectional view of a crucible with a raised slot through which molten material can be pumped, located within a crucible, for presenting to a mold forming surface a locally protruding liquid surface.

One technique discussed generally, briefly, above to provide a continuous process is to create a relatively raised region in the melt, referred to herein in some cases, as a bump, much as in wave soldering. Apparatus for accomplishing this is shown schematically with reference to FIG. 15. This can be done by pumping the melt 1513 up through a slot 1582 and letting the melt overflow the slot and fall back down into the main pool of melt 1513. Molten silicon can be pumped with a means 1585 of continuously or discontinuously pressurizing molten silicon 1513 to flow it above the free surface 1515 of the melt, providing a location for attachment of molten silicon to the forming face 6 of the mold sheet 5, immersed in the melt 1513. The pumping means could be a gear pump, an impeller pump or any other suitable means. In a related embodiment, pumping the molten silicon can be carried out in a non-continuous manner using a syringe-type displacer which mates with a silicon filled receptacle in fluid communication with the slot 1582. This embodiment has the advantage of allowing direct real-time control over height of the melt meniscus 1518 by varying the displacer position. A similar embodiment uses gas as a displacer to feed the slot non-continuously with molten silicon. The advantages of both these embodiments over continuously-pumped slots are decreased wear, decreased hardware complexity, and the capability to vary meniscus height on a per-wafer basis.

Figure 16:
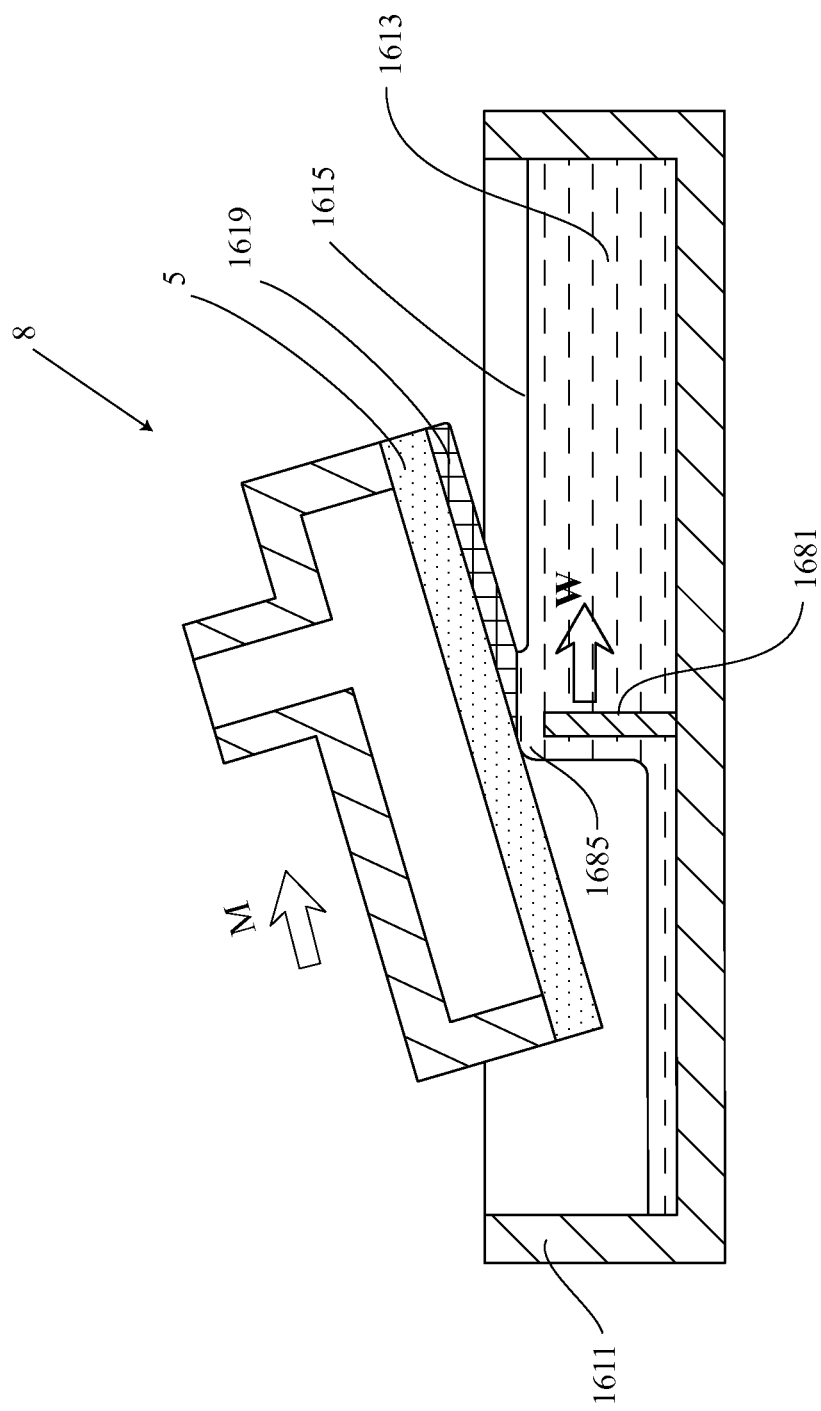
FIG. 16 shows, schematically, a cross-sectional view of a crucible with a raised, moving weir over which molten material can flow, for presenting to a moving mold surface a locally protruding liquid surface.

Instead of relying on pumped or kinetically-forced bumps, as shown schematically with reference to FIG. 16, a locally high liquid surface 1615 can instead be presented to a moving mold sheet 5 by sweeping a weir 1681 in the direction of arrow W, beneath the liquid silicon surface 1615 along the length of the mold sheet, which is itself moved in the direction of arrow M, which has a component that is parallel to the arrow W and which has a magnitude that exceeds the magnitude of the velocity of the weir in the direction of the arrow W. Such a weir will temporarily raise the liquid silicon free surface height 1685 ahead of the moving weir 1681. As molten silicon flows over the moving weir, the mold sheet moves independently over the peak of the weir, also generally in the same direction in the direction of arrow M, engaging the flowing liquid. Once the weir has traversed the crucible 1611 and the entire length of the mold sheet has been passed over the edge of the liquid surface, the completed solidified wafer 1619 can be removed, the weir can return to its starting position, and the cycle can begin again. The mold sheet may also be stationary, with the moving weir and related raised melt providing contact with the mold sheet, which is horizontal, slightly above the free surface. The weir can be symmetric such that wafers can be formed in both directions.

Figure 17A:
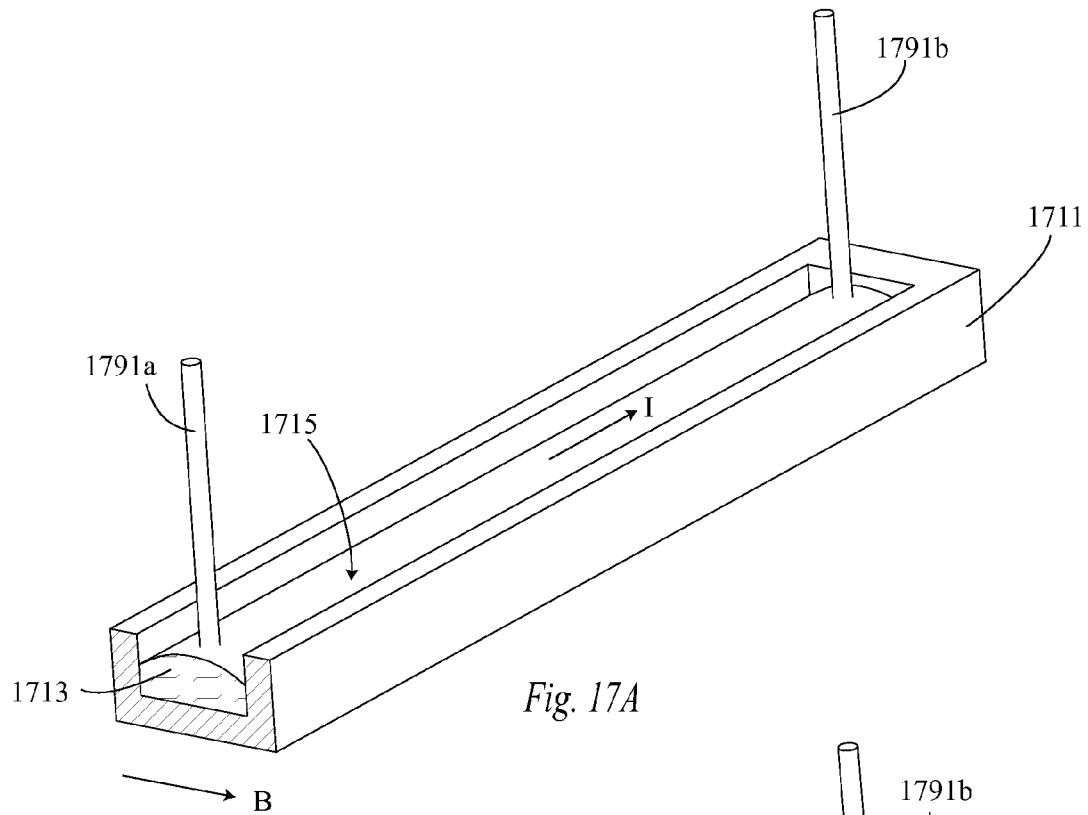
FIGS. 17A and 17B show, schematically, two stages of a method and an apparatus for providing a raised bump in a melt, using magnetohydrodynamic principles.
Figure 17B:
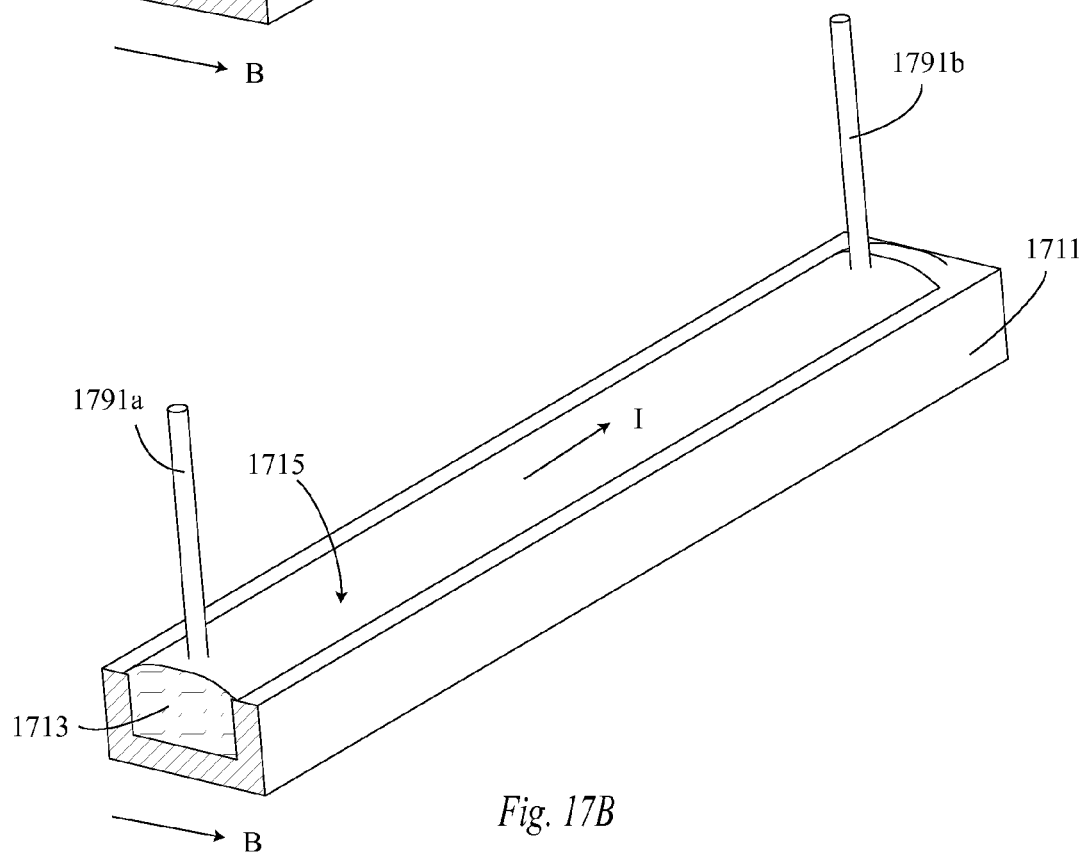

Another method to cause a section of the melt surface to raise or lower vertically is shown schematically with reference to FIGS. 17A and 17B. A portion of the melt 1713 is segregated in an electrically insulating trough 1711. Quartz could be used as a trough material. The trough 1713 is itself within and in fluid communication with a larger fluid reservoir, not shown, into which the melt 1713 can flow. If electrical contact is made to the electrically segregated region at both ends through two contacts 1791a and 1791b, a current path along the direction of the arrow I can be localized to the liquid volume 1713 defined by the interior dimension of the crucible 1711 and the depth of melt.

If this current is applied in a transverse magnetic field along the direction indicated by the arrow B a body force F is created in the confined region of melt. The direction of that body force is either up or down depending on the signs of the current I and the magnetic field B. If one end of the trough 1711 (shown open on the left hand side of FIG. 17A) is allowed to communicate with the larger volume of melt residing outside the trough (not shown) then a change in the vertical position of the top of the liquid 1715 in the trough can be effected by the magnitude and sign of the current, as shown by comparing the level of the top of the liquid shown in FIGS. 17A and 17B; while still confining the current path and associated body force to the melt in the trough and between the two electrodes.

The methods and apparatus described above for the lateral introduction of the mold sheet to the surface of the melt are intended to encourage lateral growth of the grains in the formed silicon wafer, leading to long grains which exhibit enhanced electrical properties. One method to further increase the grain size is by seeding of the formed wafer with a seed crystal of known orientation, which can be implemented in conjunction with any of the lateral introduction methods described above.

Figure 18:
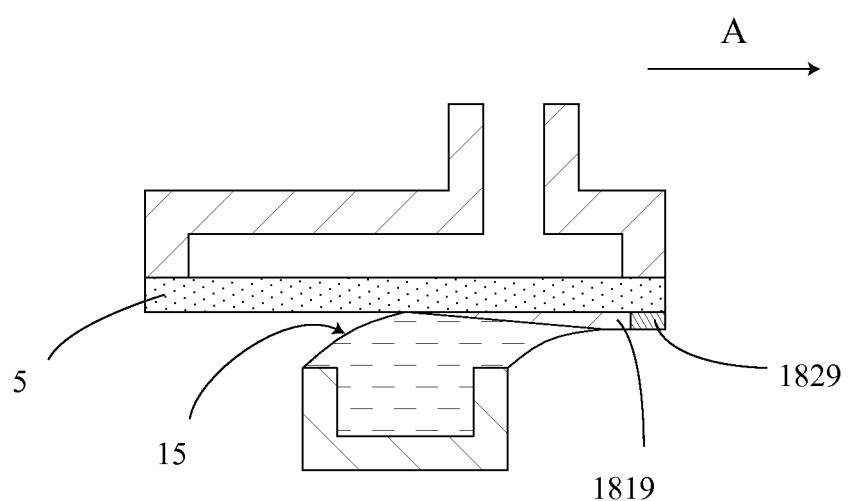
FIG. 18 shows, schematically, a seed crystal for growing crystals with relatively large grain size.

One method for seeding the grown wafer is shown with reference to FIG. 18. Seeding is achieved by attaching (either by vacuum or mechanically) a piece 1829 of monocrystalline silicon at the leading edge of the mold sheet 5 (Which will move relative to the melt in the direction of the arrow A (the first edge of the mold sheet to contact the melt surface). This is demonstrated schematically in FIG. 18 in a trough implementation. After the melt 15 is introduced to the seed crystal, the wafer 1819 is formed by lateral growth of a single grain of the same orientation as the seed crystal. After the wafer-molding is complete, the seed crystal can be cut off and re-used for the next molding event; or a new seed crystal may be used for each molding event.

It may be possible to influence the final crystallography of the formed Si sheet by initiating growth with discrete seeds, which may have a known crystallographic orientation. These seeds might be placed on the melt side of a functional layer, and could be held onto the forming face by vacuum. The combination of a nucleation suppressing functional layer (discussed below) with discrete crystallographic seeds may result in a final Si sheet with large grains of a predetermined orientation. These seeds may consist of a strip of Si wafer arranged at the edge of the forming face, such that lateral growth occurs from this seed and propagates across the forming face. Such a seed strip may consist of a narrow slice of <111> orientation Si wafer. Another possibility is a uniformly distributed set of particles spread across the forming face. In this case, the resulting Si sheet may consist of an array of grains of uniform size corresponding to the spacing of the initial seeds.

Figure 19:
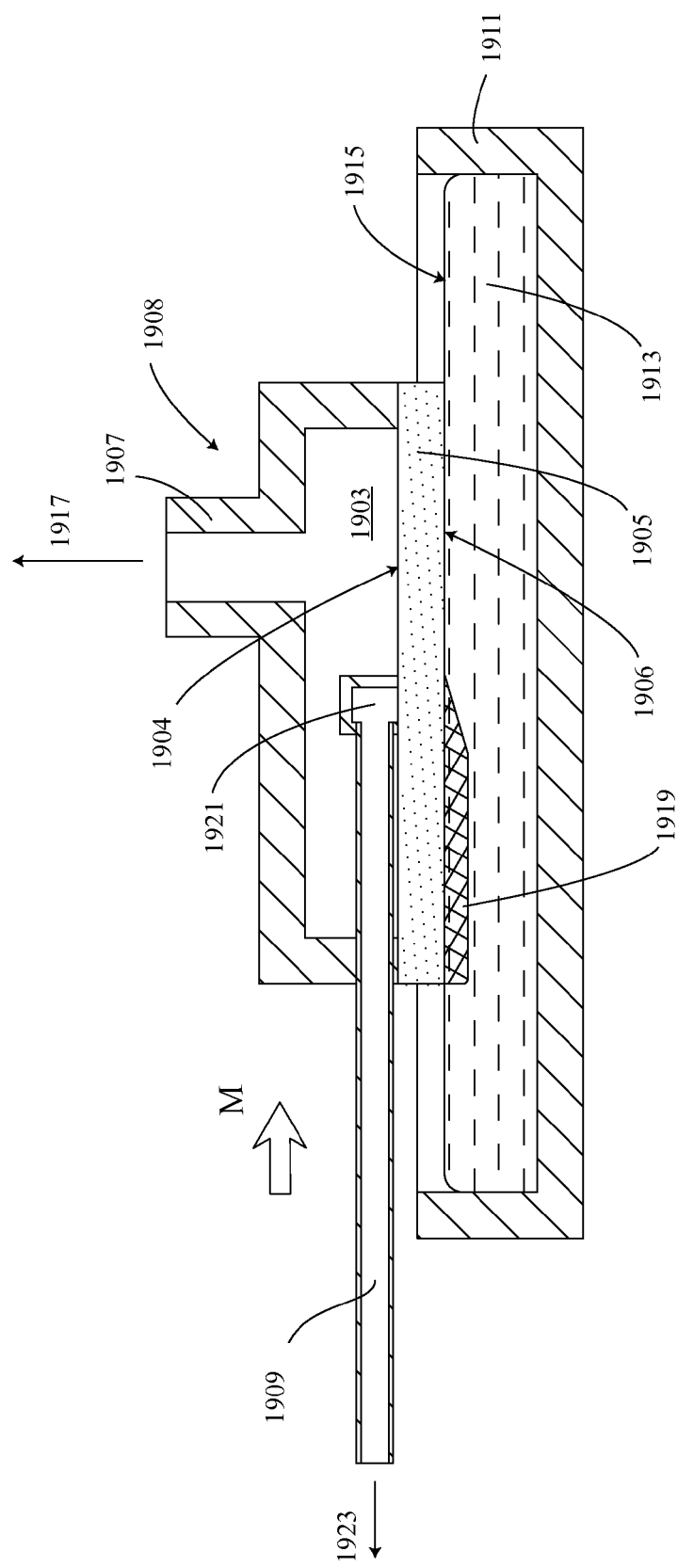
FIG. 19 shows, schematically, a relatively larger, relatively weaker vacuum plenum with a moving, relatively smaller, relatively stronger vacuum plenum located therein.

Lateral propagation of the solidification front along the length of a forming wafer may be advantageous in growing large grains and simplifying the design of manufacturing hardware. While the methods and apparatus described above allow lateral propagation of and direct control over the solid-melt interface, methods and apparatus that provide lateral (in-plane) growth that is free from surface liquid effects at the solid-melt interface may also be advantageous. In all embodiments of the present inventions, wafer growth requires thermal contact between the melt and the mold sheet, which is effected by applying vacuum through the mold sheet. As shown schematically with reference to FIG. 19, by varying the spatial vacuum environment on the back side 1904 of the mold sheet 1905 (the side that faces away from the melt surface 1915), thermal contact in a small, strong-vacuum region 1921, supplied through a strong vacuum port 1909 to a strong vacuum source 1923, may be forced between the melt 1915 and the mold sheet 1905. By varying the position of this strong-vacuum region 1921—for instance, sweeping a line of strong vacuum down the length of a forming wafer 1919 in the direction indicated by the arrow M,—lateral growth can be effected without the need for dynamically stable mold sheet/melt interfaces. Such an embodiment can be realized by implementing a moving vacuum plenum 1921 behind a mold sheet 1905 that is held in continuous contact with the melt surface 1915. The wafer 1919 solidifies at or near the location of the moving plenum 1921. Once the wafer 1919 is formed, a weak background level of vacuum in the remainder of the plenum 1903 allows the wafer 1919 to be remain temporarily attached to the mold sheet 1905. As used herein, a strong vacuum is considered between approximately 30 to approximately 80 kPa, and a weak vacuum is between approximately 1 and 30 kPa.

Figure 20:
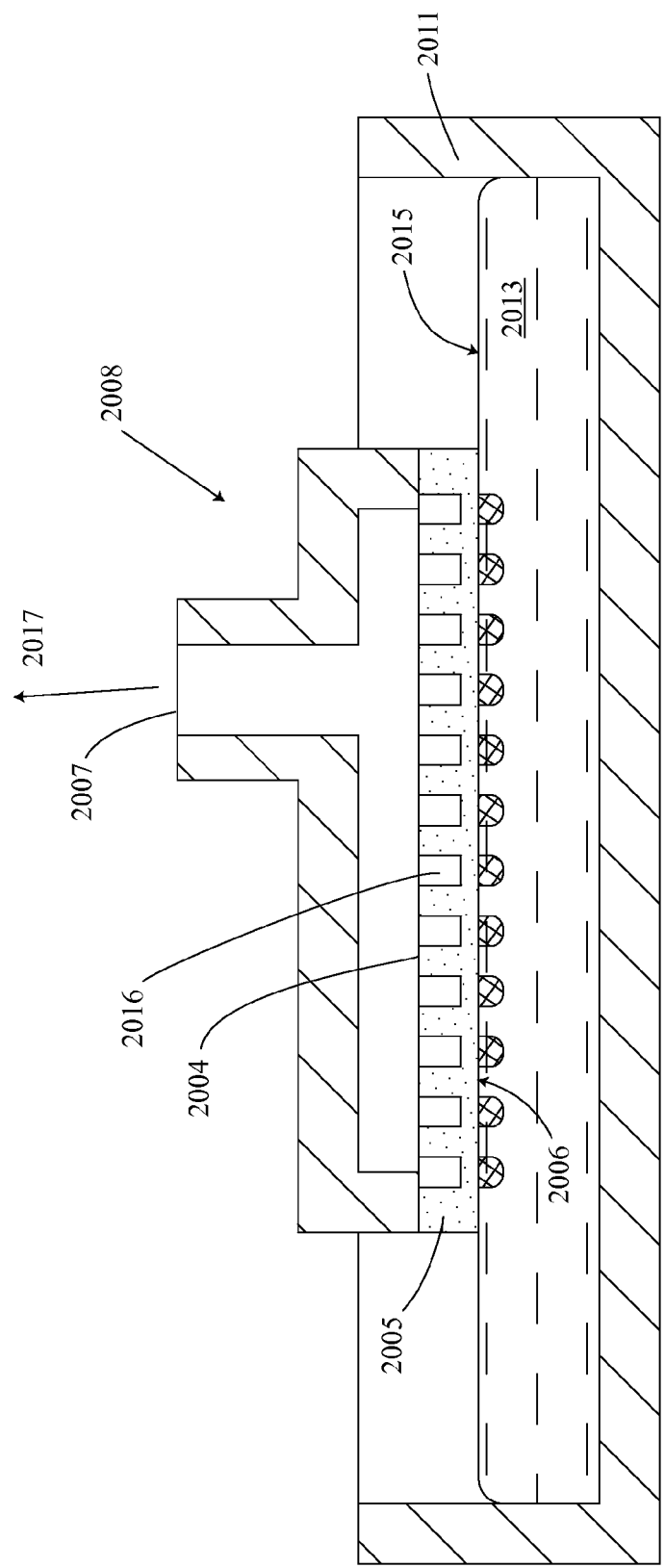
FIG. 20 shows, schematically, a cross-sectional view of a mold sheet having a mold surface, with blind holes facing toward the plenum, for localized vacuum profile control.

Another method of effecting in-plane lateral propagation of the solid-liquid interface without the need for a dynamically stable meniscus is to spatially vary the rate of heat transfer into the mold sheet by varying the properties and geometry of the mold sheet. In one embodiment, shown schematically with reference to FIG. 20, which is a cross-sectional view, the local vacuum across the area of the mold sheet 2005 is varied spatially by removing material in a set of blind holes 2016 in the back face 2004 of the mold sheet 2005. Regions of the mold sheet with blind holes will conduct vacuum 2017 more strongly to the melt side 2006, leading to local nucleation due to enhanced heat transfer. With the correct spacing of blind holes 2016, these locally nucleated grains will propagate laterally across regions of the mold sheet without blind holes, forming maximally large grains.

Figure 21:
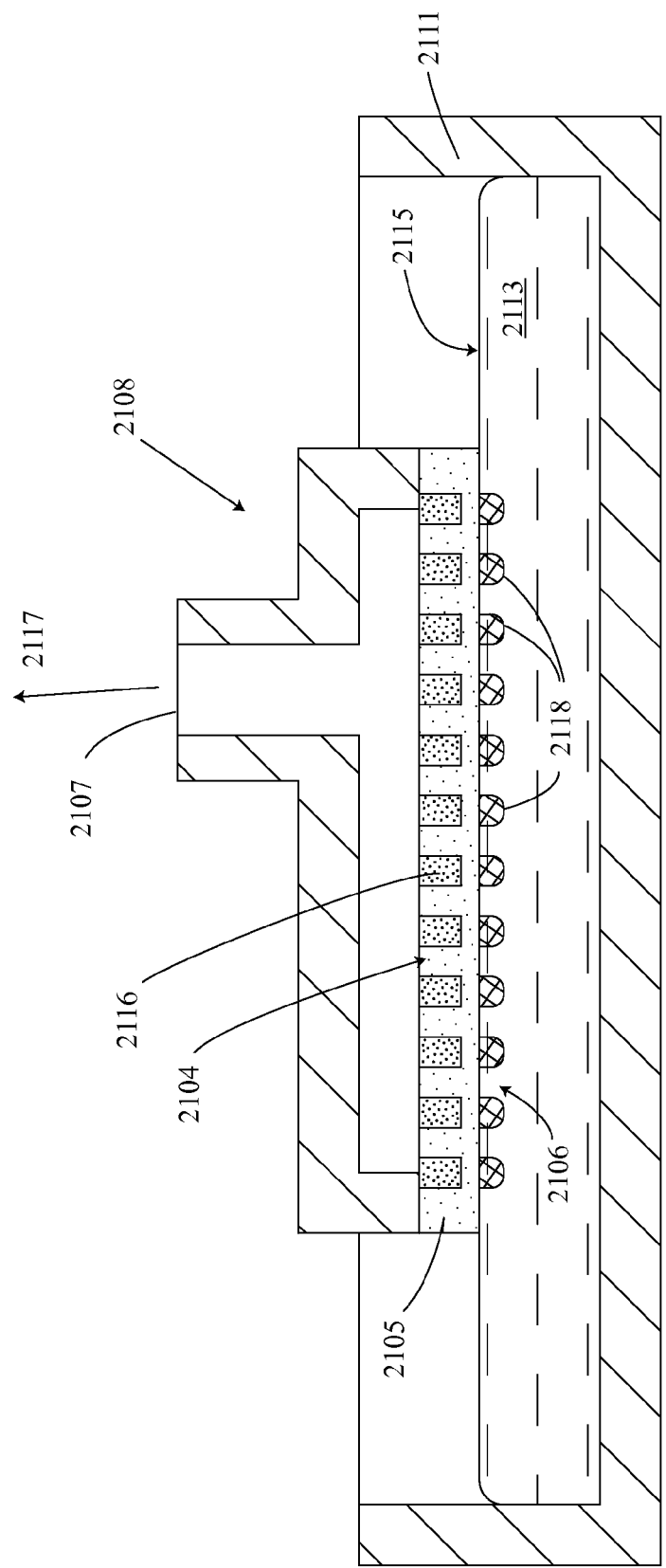
FIG. 21 shows, schematically, a cross-sectional view of a mold sheet having a forming surface, with regions of different thermal conductivity, for localized vacuum profile control.

In another embodiment, shown schematically with reference to FIG. 21, inserts 2116 of material with variable thermal diffusivity are implanted at different locations throughout the mold sheet 2105. (Items shown with reference numerals preceded by 21 are analogous to items preceded by 20 shown in FIG. 20, unless otherwise noted.) Regions of the mold sheet that can conduct relatively more heat in a relatively short period of time will tend to nucleate new grains. These grains will propagate across regions of low heat capacity, forming large grains when they meet neighboring grains. In one embodiment, inserts of high thermal diffusivity graphite 2116 are embedded at regular intervals within a mold sheet 2105 of low thermal diffusivity silicon carbide. Grains will tend to nucleate at locations 2118 directly beneath the high-thermal-diffusivity inserts 2116 and expand outward from those locations.

Figure 22A:
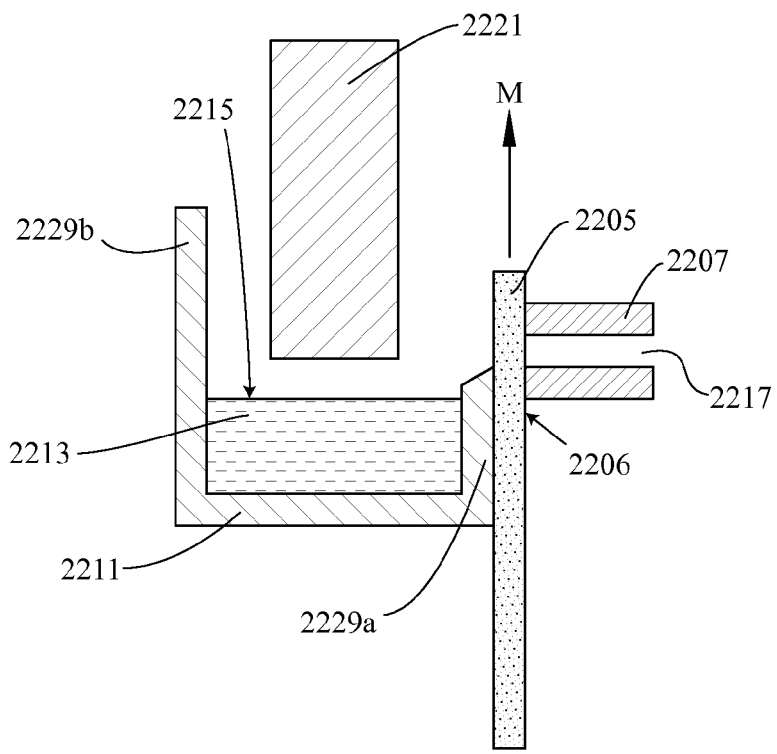
FIGS. 22A and 22B show, schematically, in cross-sectional view, two stages of a method and apparatus that provides a mold adjacent a melt of molten material, which mold is then moved, vertically past a melt surface such that a body solidifies against the mold.
Figure 22B:
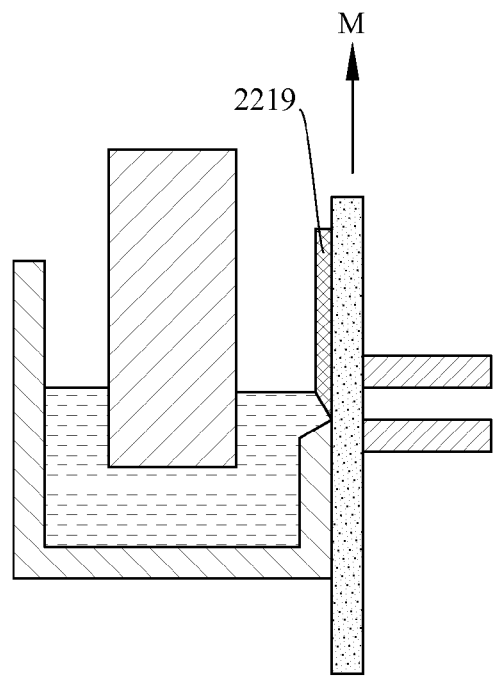

In another embodiment, shown schematically with reference to FIGS. 22A and 22B, a mold sheet 2205 may be pulled vertically, with exposure to a silicon melt 2213 from a horizontal direction, rather than the vertical direction, as shown in the embodiments discussed above. For this method, the melt 2213 is contained in a crucible 2211 with one wall 2229a shallower than another 2229b, such that when the level of the surface 2215 of the melt 2213 rises, it spills over the shallower edge 2229a. The melt level could be increased by means of a displacer 2221 as shown or by any suitable method. The mold sheet 2205 is placed in close contact with the short wall 2229a such that rather than spilling over the upper edge of the wall 2229a, the molten silicon 2213 contacts the mold sheet 2205, with a vacuum 2217 pulling through a port 2207 from the back side 2206 of the mold sheet 2205. A solid semiconductor sheet 2219 is formed against the mold sheet 2205. The mold sheet is pulled upwards along the direction of the arrow M. The vacuum 2217 promotes adhesion and heat transfer into the mold sheet 2205, similarly to the cases described above, of melt exposure from below the mold sheet 5. Additional relatively weak vacuum can be applied farther up on the mold sheet (not shown) to retain the silicon sheet against it as the mold sheet moves upward, until release is desired. The crucible walls 2229a, 329b, can be non-wetting with respect to the molten material, such that a small gap between the outside of the crucible wall and the mold sheet will not be filled by an overflowing melt because of the surface tension of the liquid silicon. An example of a non-wetting crucible material is quartz.

An advantage of this vertical method is that the shedding of liquid from the forming wafer 2219 is aided by gravity. The direction of motion M of the mold sheet 2205 can be vertical as shown in FIG. 22A, or the direction can be inclined. If the mold sheet 2205 inclines away from the melt 2213, the formed solid silicon sheet 2219 is supported by gravity on the upper portion of the mold sheet 2205. If the mold sheet inclines toward the melt such that the formed solid silicon sheet would be above the melt, a weak vacuum can be applied on the upper portion of the mold sheet to retain the silicon sheet against the mold sheet until release is desired. Optimal shedding of liquid would occur when gravity acts directly opposite the surface tension force, which for liquid silicon against solid silicon is at approximately 11 degrees.

Figure 23A:
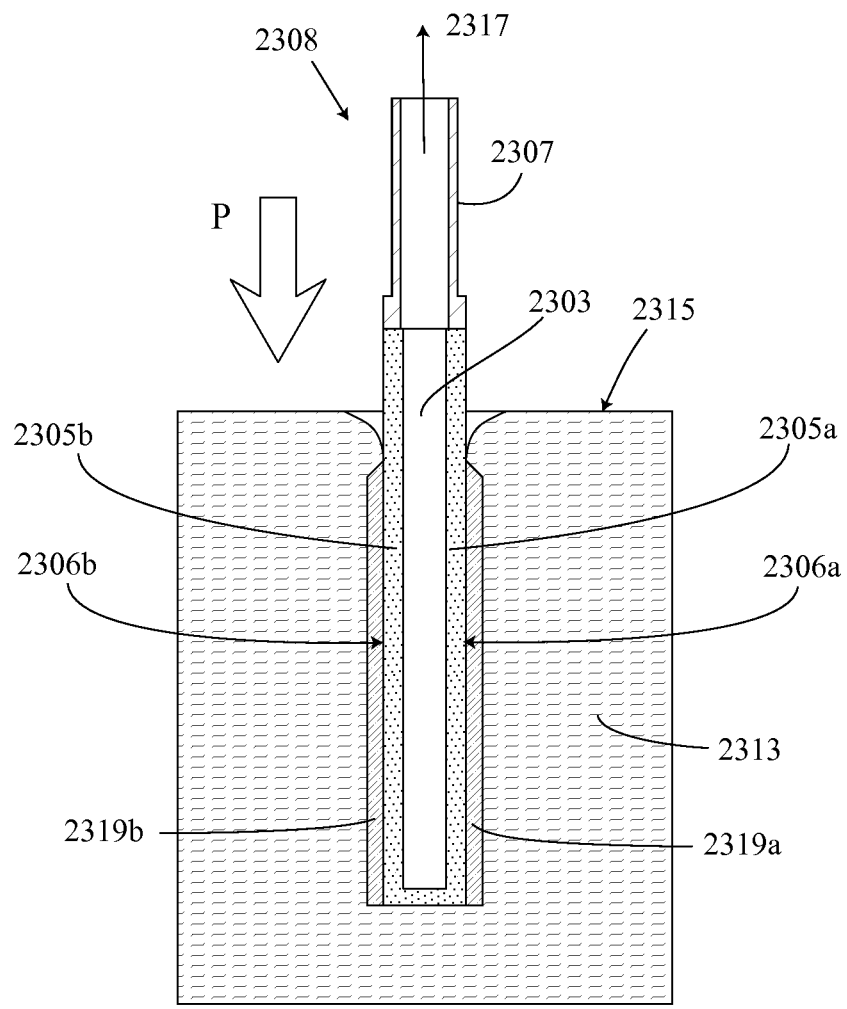
FIGS. 23A and 23B show, schematically in cross-sectional view, two stages of a method and apparatus that introduces a mold vertically into a melt of molten material.
Figure 23B:
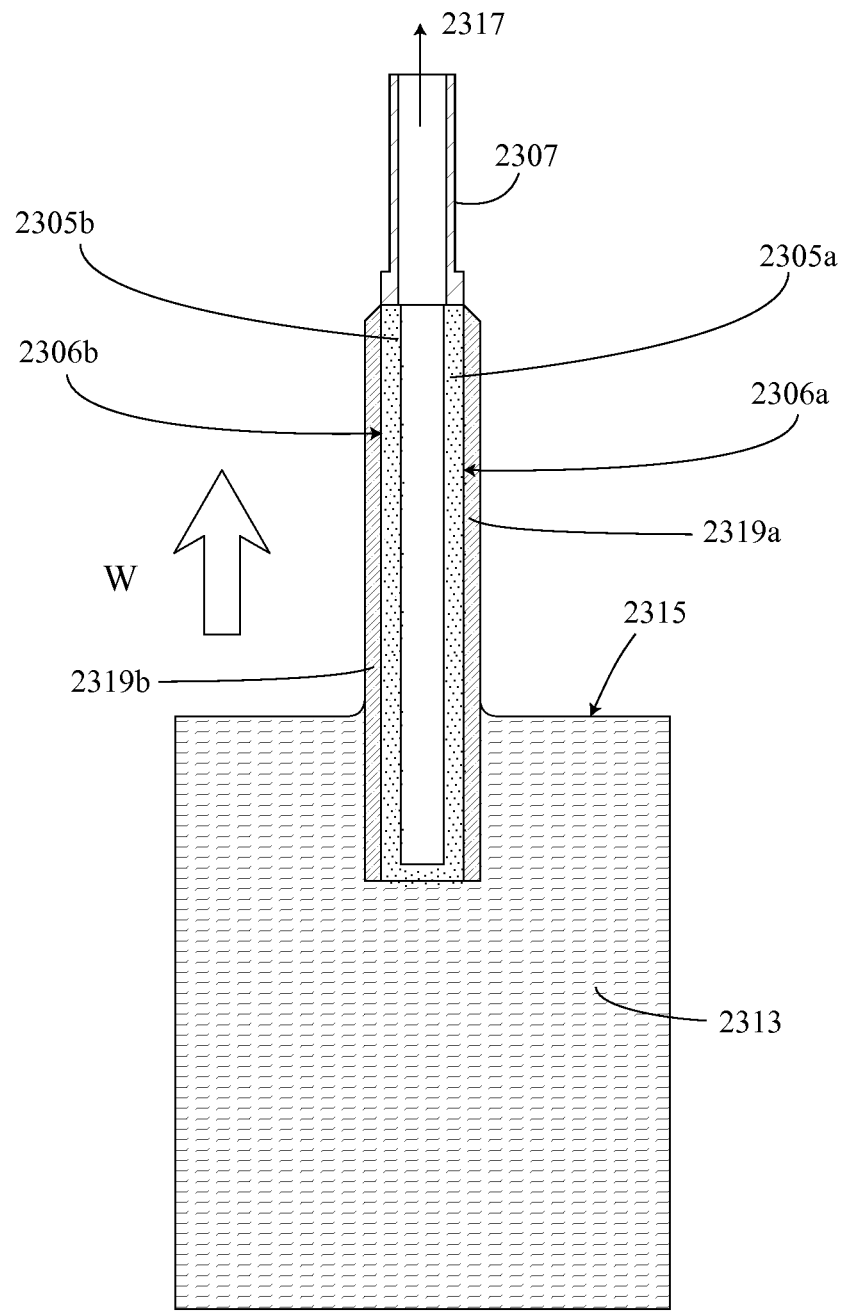

Another means of effecting a controlled, progressive, lateral attachment of melt to mold sheet surface and detachment of melt from the formed wafer surface, is to situate the forming face such that it can be plunged into a melt vertically—with the forming face surface of a mold body perpendicular to the free surface of the melt. This is shown schematically with reference to FIGS. 23A and 23B, with a hollow microporous mold body 2308 being plunged into a melt 2313 along the direction of the arrow P, forming wafers 2319a and 2319b, on two forming faces 2306a and 2306b, respectively of the mold body 2308, having two mold sheets 2305a and 2305b. Two forming surfaces, 2306a and 2306b are shown, which are substantially parallel and facing opposite to each other. The mold body may be one of many different shapes, and it may have two, three, four, or more mold forming surfaces. Each of the structures 2305a and 2305b that back up each of the forming surfaces 2306a and 2306b may be considered a mold sheet as that term is used herein. FIG. 23B shows the mold body 2308 near the end of withdrawal from the melt 2313 along the direction of the arrow W. This allows the formation of two wafers per forming event, but requires a relatively deep crucible. Differential pressure is provided through the plenum 2303, for instance with a vacuum 2317 being drawn through a conduit 2307.

The foregoing discussion, before this most recent discussion of a vertical dip embodiment of inventions hereof, uses the term mold sheet to refer to the element against which the molten material is molded to its final shape and surface texture. The mold sheets have been described as generally sheet like elements, of one or more layers. This present section uses the term mold body, which refers to a generally three dimensional, non-sheet like element, composed of two or more mold sheets disposed at some geometric relation to each other. Each mold sheet has a forming surface, also referred to herein as a forming face. It is not necessary that the individual mold elements of a mold body be sheet like. For instance, the mold body can be entirely solid, with a porous interior that admits of a vacuum being drawn there through, with different forming faces facing outwardly away from each other around the periphery of the mold body. As used herein, and in the claims, the term mold will be used to refer to both or either a mold sheet or a mold body, or the individual mold sheets of a mold body, or the outer periphery of a mold body, which embodies the shape and/or surface texture that is molded upon the formed wafer.

Figure 24:
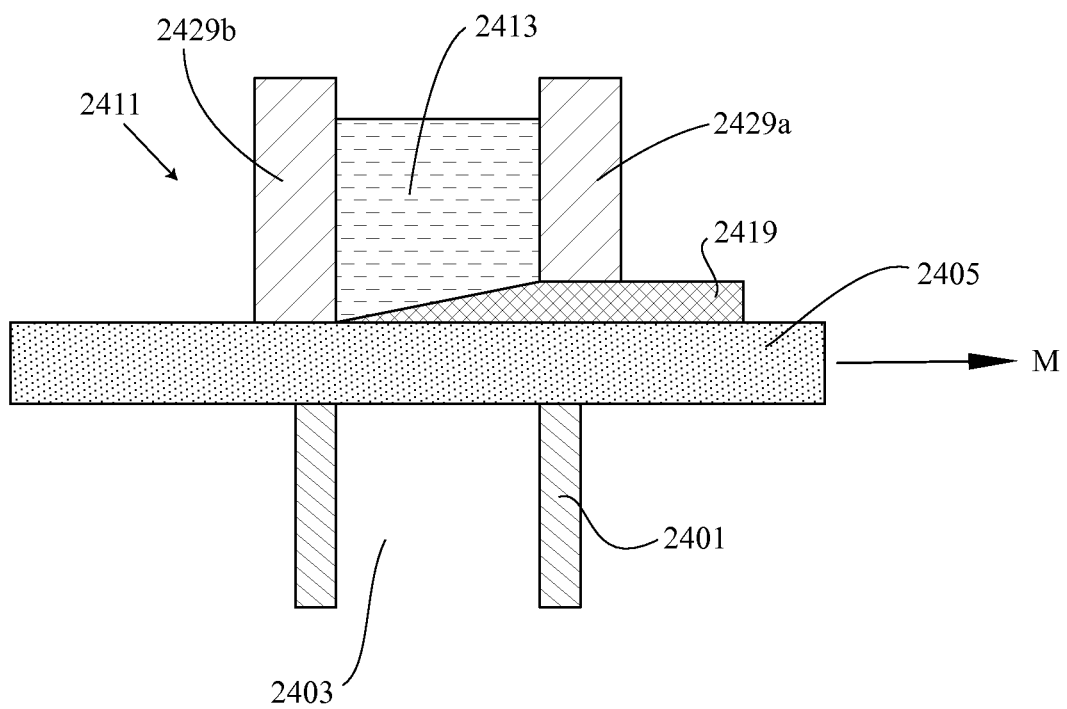
FIG. 24 shows, schematically, in cross-sectional view, a method and apparatus that provides a mold with a quantity of molten material above it, and a vacuum pulling from the opposite side of the mold sheet, generally below it.

In another embodiment, shown schematically with reference to FIG. 24, a cool mold sheet 2405 is pulled horizontally along the direction of arrow M, with exposure to the silicon melt 2413 that resides above the mold sheet 2405. The molten material 2413 is contained in a crucible 2411 using non-wetting materials along the small gap along the bottom of the walls 2429a, 2429b, which prevents the silicon melt 2413 from leaking, due to the high surface tension of liquid silicon. One wall 2429a can be raised to allow extraction of a solid sheet 2419, which forms against a mold sheet 2405 with vacuum pulling from the opposite side by means of vacuum plenum 2401, through vacuum cavity 2403 to promote adhesion and heat transfer into the mold sheet 2405.

As with the other cases, discussed above, although FIG. 24 shows the mold sheet being pulled horizontally (perpendicular to a gravitational field) that need not be the case. The mold sheet can be pulled along a line having a horizontal component, with the molten material located gravitationally above it.

In all cases, the use of vacuum enables a much wider process window for mold sheet temperatures and materials than would be possible without vacuum. Specifically, the vacuum can promote necessary adhesion for a material that would otherwise be non-wetting. Since non-wetting materials also typically exhibit low nucleation and can support greater undercooling, this is a significant advantage in controlling the resulting grain size of the solidified silicon sheet.

Figure 25:
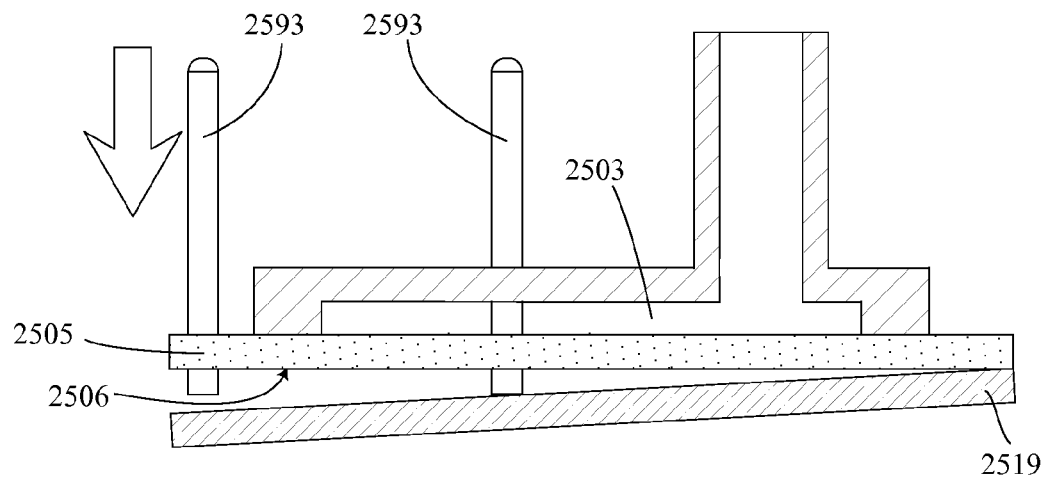
FIG. 25 shows, schematically, in cross-sectional view a mechanism of ejector pins for detaching a formed solidified body from a mold surface.

As shown schematically with reference to FIG. 25, release of the formed wafer 2519 from the mold sheet 2505 can be aided by one or more small pins 2593, which would be forced through tight-fitting holes in the mold sheet. These pins might reside within the vacuum plenum void area 2503 or outside it. They should preferably contact the freshly formed wafer 2519 and help to push it off the surface of the forming face 2506 after the wafer has been formed.

Figure 26:
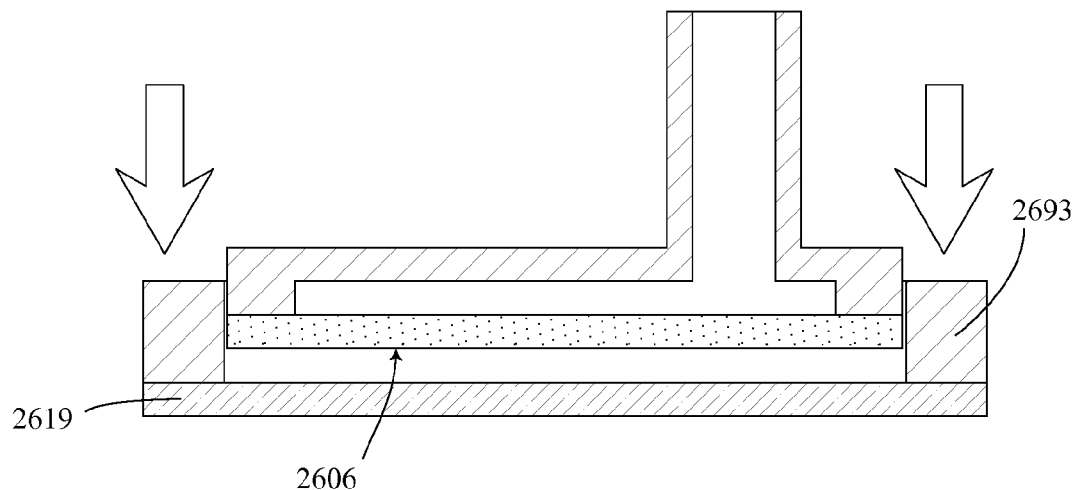
FIG. 26 shows, schematically, in cross-sectional view a mechanism of a stripper plate for detaching a formed solidified body from a mold surface.

Another apparatus to achieve such release is shown schematically with reference to FIG. 26. A frame 2693 forms an annulus around the perimeter of the forming face 2606. After the wafer 2619 has been formed, the frame 2693 is pushed so that it protrudes past the plane of the forming face 2606, pushing the wafer 2619 off the forming face 2606. The frame could extend around the complete perimeter of the forming face, or only over some segment of it.

Figure 27:
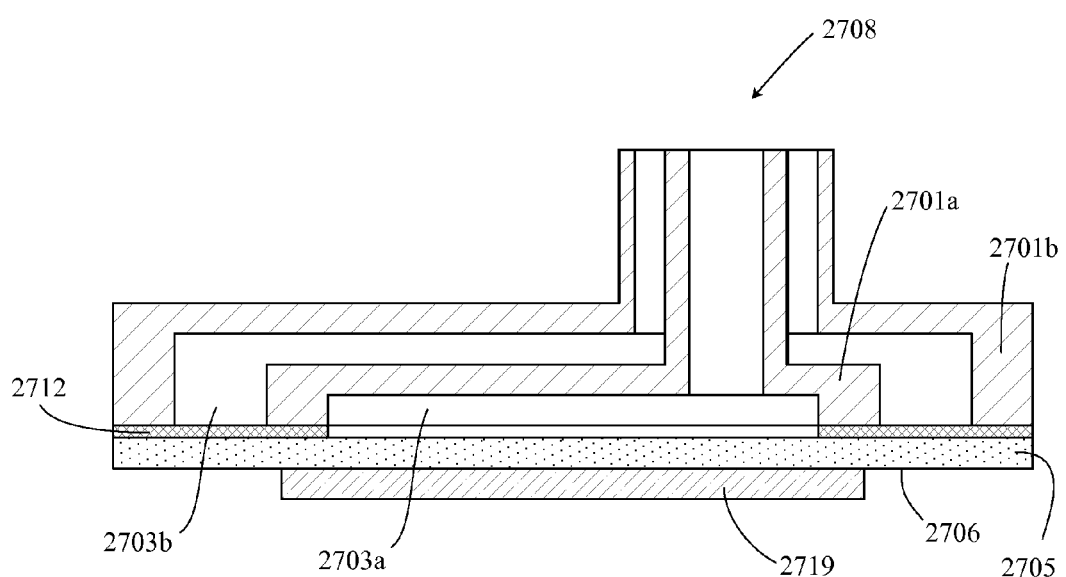
FIG. 27 shows, schematically, in cross-sectional view, a dual plenum assembly, for use aiding securing a mold sheet to a mold assembly, and also releasing a formed wafer from a mold sheet.

Another method is to apply vacuum over only a reduced area of the interior portion of the surface 4 of the mold sheet 5. The wafer tends to form where the vacuum is applied, so applying the vacuum over a smaller interior region may result in non-complete coverage of the forming face 6 by the wafer 19. As shown with reference to FIG. 27, the reduced vacuum area can be achieved by smaller vacuum plenum 2701a, or a non-permeable coating 2712 on the back side of the mold sheet 2705 in the area where vacuum is not desired. Examples of such coatings are CVD SiN (Silicon Nitride) or pyrolytic graphite. The formed wafer 2719, then does not extend to the sharp edges of the forming face 2706, and can release from a purely planar surface. This may affect both the release properties of the wafer and the amount of plastic deformation the wafer undergoes during the forming event. The sharp edges have been found to be places of enhanced attachment for the formed wafer 2719, and provide strong mechanical coupling between the wafer 2719 and forming face 2706. Preventing the wafer from being mechanically continuous from edge to edge promotes relative slipping between the wafer and forming face, reducing the amount of plastic deformation and associated creation and multiplication of dislocations and other crystallographic defects. Any such dislocations and defects would arise from inequalities in the coefficient of thermal expansion of the forming face and the solidified wafer.

Figure 28:
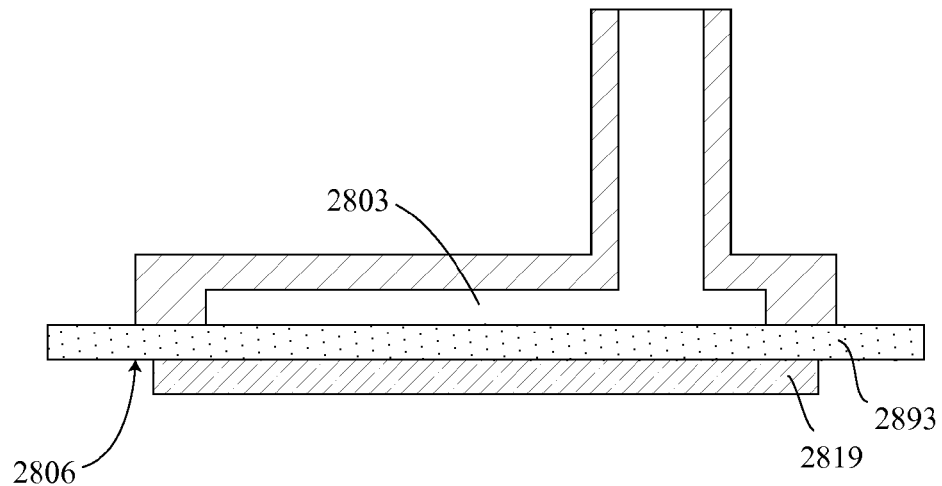
FIG. 28 shows, schematically, in cross-sectional view a mold surface that extends beyond a region of relative vacuum application, to result in a solidified body that is smaller in areal extent than a mold surface.

Or, with a similar, simpler embodiment, as shown schematically with reference to FIG. 28, the forming face 2806 might have extensions 2893 beyond the region 2803 of the vacuum plenum, so that no molten material is drawn to the mold sheet near to its edges, thus minimizing the stronger attachment effect that arises near edges and thus the formed wafer 2819 can be more easily released.

Figure 29:
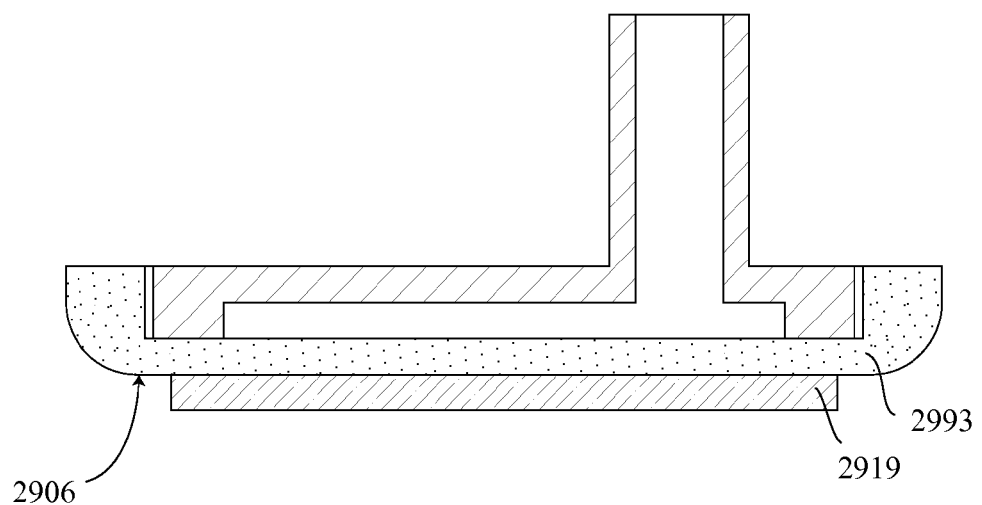
FIG. 29 shows, schematically, in cross-sectional view a mold surface that has curved edges, to result in a solidified body that is more easily detached from a mold surface.

As shown schematically with reference to FIG. 29, the forming face 2906 might also be non-planar in the region of the edges 2993, promoting a gradual introduction of melt to the forming face surface 2906, and further reducing the opportunity for mechanical attachment of formed wafer 2919 to the forming face 2906.

Any one or more of these techniques for reducing the degree of attachment of the formed wafer to the forming face, such as a reduced area vacuum plenum, gas impervious layer, ejector pins, stripper plate, non-planar edge regions, etc., might be combined with any other structure mentioned above or hereinafter developed for a similar purpose.

It is necessary to secure the mold sheet 5 to the plenum assembly 8. This can be done using conventional pins or another mechanical attachment mechanism. Alternatively, as shown with reference to FIG. 27, the mold sheet 2705 can be secured to the plenum assembly 2708 by means of a vacuum. In this case, a gas non-permeable coating 2712 is provided around the edges of a mold sheet 2705. A secondary vacuum plenum 2701b is applied on this non-permeable area of the mold sheet 2705 as a means of mechanical attachment of the mold sheet to the plenum assembly 2708 and when the primary plenum 2701a is pressurized for release of the solidified semiconductor wafer 2719. The thinner cross-hatched area 2712 is a gas non-permeable coating such as pyrolytic graphite, which does not allow gas flow, which serves two purposes. First, it prevents vacuum from being applied to the outer portion of the mold sheet 2705 near the edges, so the solidified wafer 2719 is defined by the non-coated area adjacent the cavity 2703a, where vacuum is applied. This keeps the edges of the wafer 2719 away from the edges of the mold sheet 2705 and aids in release of the wafer 2719. The outer vacuum plenum 2701b can also be applied on this coated area 2712 to mechanically attach the mold sheet to the vacuum assembly 2708 when the inner plenum 2701a is not applying vacuum during release of the wafer 2719. One advantage of using vacuum as a means of mechanical attachment is it does not affect the thermal mass of the mold sheet 2705, which can impact wafer thickness. Another advantage is it can provide a simpler means of automated loading and unloading of the mold sheet 2705, which must by cycled through attachment and detachment many times over the course of a production day, at a rate that could range from once per minute to once every two to three hours, given a reasonable range of duration for the forming of each wafer, and durability of the mold sheet.

Control of target thickness and control of thickness uniformity of the formed silicon sheet is important for use of the silicon sheets in fabrication of solar cells because they can impact the strength and the thermal mass of wafers made from the formed silicon sheet wafers. The present methods can be used for fabricating individual semi-conductor wafers, or for larger sheets, from which wafers can be obtained, for instance for use in a solar cell. The present discussion will use the term sheet, as it is more general, but it will be understood that this thickness discussion relates also to bodies formed as wafers. The thickness and subsequent thermal mass can be important when wafers undergo rapid thermal cycles such as metallization firing. Thin areas of a silicon sheet can result in local weakness, breakage of wafers during handling and decrease yield in cell processing.

Thickness of silicon sheet formed by inventions disclosed herein is determined primarily by control of heat extraction from the melt 13 during the molding event as discussed above. The heat flux per unit area from the melt is influenced by the material, thickness, and surface texture of the mold sheet 5, as well as the applied vacuum pressure and temperatures of both the melt 13 and mold sheet 5.

Upon contact, the intimate thermal contact between the melt 13 and mold sheet 5 results in solidification of a sheet 19 of solid silicon, whose thickness grows based on the heat of fusion and heat flux:

$$V = h^*(T_{melt} - T_{mold})/H_f$$

Where V is the solidification front velocity, h is the heat transfer coefficient, T is temperature, and $H_f$ is the volumetric heat of fusion, $4.2 \times 10^9$ J/m$^3$ for silicon. This simple form neglects specific heat of melt superheat, which is typically less than 5% of $H_f$ as discussed above. The planar case with a solidification front parallel to the forming face 6 of the mold sheet is also generally applicable to a continuous process with the mold sheet moving across a melt surface 15 and solidification front would be nearly parallel, but at a shallow angle from the mold sheet. From the literature and experimental measurement, an example value of h is ~5000 W/m²K, which would result in solidification front velocities of 0.1 mm/s and 1 mm/s for ΔT of 100° C. and 800° C. respectively. During the initial period after contact, the silicon sheet thickness can be controlled by the time the mold sheet is in contact with the melt.

As heat is extracted from the melt, the mold sheet 5 will heat up based on its own thermal mass and conductivity. For the case above with ΔT of 100° C., a heat flux of 5×10⁵ W/m² through a mold sheet with conductivity k=50 W/mK will result in a temperature gradient of 10 C.°/mm in the mold sheet. If a thin mold sheet is used with an insulated back, the bulk temperature of the mold sheet will rise until it is saturated when $T_{mold} \approx T_{melt}$. For a 2 mm thick mold sheet with specific heat $C_p=3.5\times10^6$ J/m³K and an initial ΔT of 100° C., it would have a maximum thermal capacity of 7×10⁵ J/m², corresponding to a silicon sheet thickness of 167 μm. This provides a stabilizing mechanism for thickness control that is independent of residence time.

Similarly, mold sheets may be designed with varying thickness of different materials, including a thermally insulating layer in a stack to achieve desired silicon sheet thickness and improved uniformity that is robust against variations in residence time. As one mold sheet example, shown schematically in FIG. 30, a layer 3008 of a mold sheet 3005 with high thermal conductivity could be used with a thickness and initial temperature chosen such that the layer 3008 will thermally saturate once a desired thickness of silicon sheet has formed. By thermally saturate, it is meant that no additional semiconductor material can solidify, given the temperature gradient between the melt and the layer 3008. A more insulating internal layer 3007 would retard subsequent heat flow so that the rate of solidification would be substantially slower after this initial saturation point. The layer 3008 may be nearly saturated such that solidification rate slows to less than 10% of the original solidification rate. This provides for a more robust means of controlling thickness because it decreases sensitivity to residence time.

Thermal diffusivity of the mold sheet material will impose an additional limit on heat extraction if the diffusivity is not sufficient to extract the heat through the mold sheet and the surface temperature rises instead. Lower thermal diffusivity can favor improvements in uniformity of sheet thickness, since an increase in mold sheet surface temperature will decrease the solidification front velocity and decrease the sensitivity of thickness to residence time.

Figure 31A:
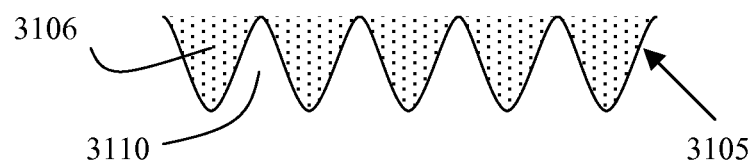
FIG. 31A shows, schematically, a cross-sectional view of a porous mold sheet with surface texture.
Figure 31B:
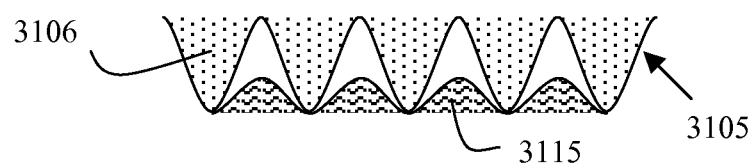
FIG. 31B shows the porous mold sheet of FIG. 31A, with a relatively light vacuum having been applied, generating relatively small amount of contact area between the mold surface and the molten molding material.
Figure 31C:
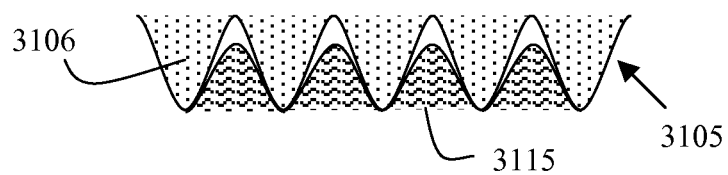
FIG. 31C shows the porous mold sheet of FIG. 31A, with a relatively strong vacuum having been applied, generating relatively larger amount of contact area between the mold surface and the molten molding material.

Upon initial contact between the mold sheet and the melt, the surface of the melt can be shaped to partially conform to the mold sheet. This can impose light trapping texture as discussed above and additionally can influence heat transfer. The vacuum pressure applied to the back surface 4 (FIG. 1) of the mold sheet 5 can be used to balance the surface tension forces of the molten silicon and dictate the contact surface area of the mold sheet and subsequent heat transfer coefficient. FIG. 31A shows, schematically in cross-section an example of a portion of a mold sheet 3105 with a textured surface on the forming face 3106. The depth of grooves 3110 could be less than 1 micron for a polished surface or could be 20 to 50 microns on a purposefully designed texture. Under light vacuum pressure shown in FIG. 31B, there is little driving force to deform the melt surface 3115 and only the high points of the texture will be in intimate contact with the melt for heat extraction. The remaining pockets of void space between the melt and mold surface are relatively insulating and have the affect of reducing the overall heat transfer coefficient. Once a continuous layer of solid is formed, no further deformation will occur. Under stronger vacuum pressure (up to 1 atm or higher in a pressurized melt chamber), the melt can be forced deeper into the grooves prior to forming a solid, effectively increasing the contact area as shown in FIG. 31C.

As the mold sheet contacts the melt surface, which was initially at the ambient pressure, the pressure changes to match the vacuum pressure applied to the back of the mold sheet with a time constant of response equal to:

$$\tau = \frac{M \varepsilon \mu}{2 \kappa \rho} \frac{t^2}{RT}$$

Where M, μ, ρ, and T are the molecular weight, dynamic viscosity, density and temperature of the gas, R is the universal gas constant, and ε, κ and t are the void fraction, permeability and thickness of the mold sheet. As an example, using the properties of argon at 1273° K and a 1 mm thick mold sheet with permeability 1×10⁻¹⁵ m², and 5% void fraction, τ=15 ms. Mold sheet materials are available with permeability values that span three orders of magnitude, so combined with thickness selection, this time constant can be tailored to between several seconds and less than approximately one millisecond.

The time available for the liquid to deform prior to solidifying a continuous layer is determined by the melt superheat, specific heat, undercooling prior to nucleation and heat flux. The mold sheet and melt conditions can be selected such that the time available prior to freezing is longer than the time constant for pressure reduction and deformation of the melt surface. Such time, prior to freezing, enables the liquid to better conform to the mold sheet surface (similar to that shown in FIG. 31C) and increase contact area and subsequent heat transfer coefficient.

One means of increasing the grain size is by the use of a functional layer between the mold sheet and the melt during the formation of the wafer. There are different sorts of functional layers, which can be provided by different techniques, and can function in different ways. Further, these functional layers can be of many different materials.

One sort of a functional layer provides a non-nucleating interface, which allows for heat extraction from the melt and sub-cooling of the liquid, leading to lateral growth of solid crystal grains without nucleation of new grains, resulting in larger grain size. Another sort provides a chemical barrier against contaminating diffusion of impurities from the material of the mold sheet into the forming semiconductor wafer. Yet another functional layer may promote nucleation of grains in desired locations (seeds). Still another function such a layer can provide is to prevent adhesion of the formed body to the mold sheet.

One effective non-nucleating functional layer is a thin film of a silicon oxide, for instance, silicon dioxide, for example a 500 nm thick film. Differential Scanning calorimetry (DSC) experiments indicate that sub-cooling in excess of 150° C. can be maintained between liquid silicon and silicon dioxide layers.

Functional materials can be provided on the mold sheet forming face, or on the melt, or both. Providing a functional material on the melt is discussed first, followed by a discussion regarding providing the functional material on the mold sheet.

Figure 32A:
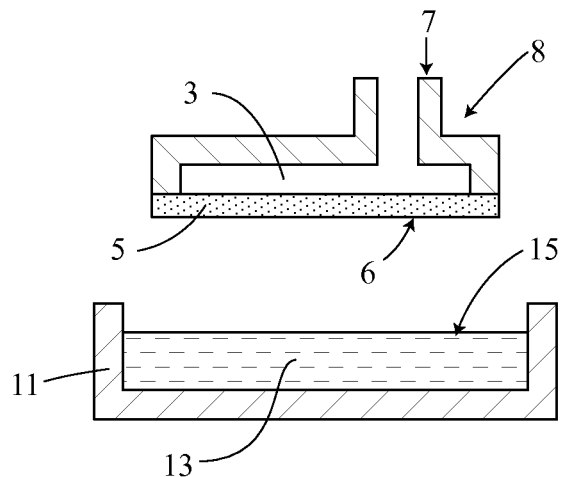
FIGS. 32A, 32B, 32C, 32D and 32E show, schematically, steps of a method for providing and using a functional material on the surface of the molten material.
Figure 32B:
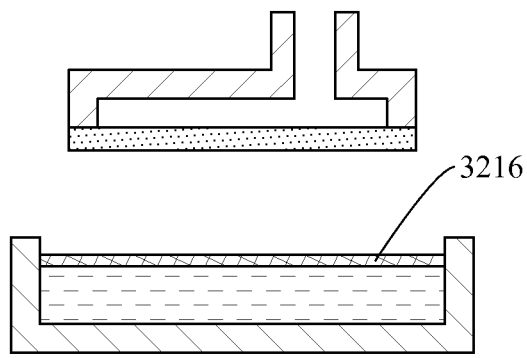
Figure 32C:
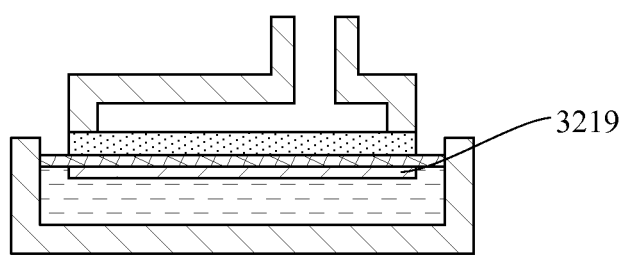
Figure 32D:
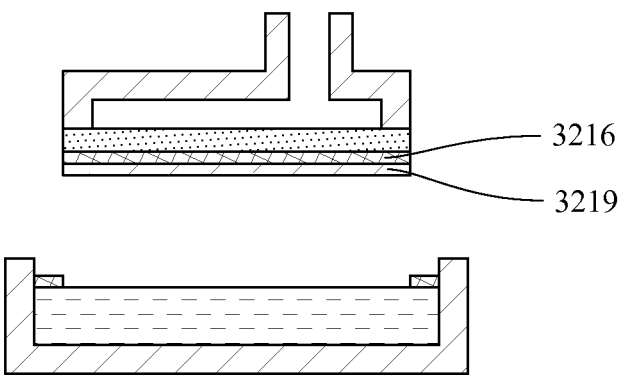
Figure 32E:
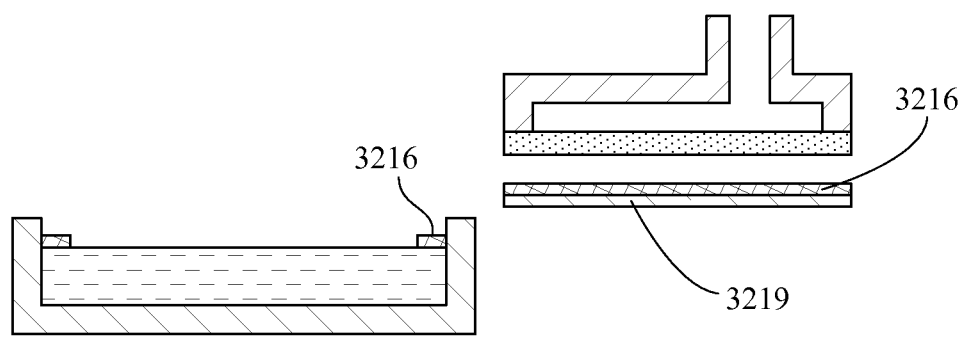
Figure 33A:
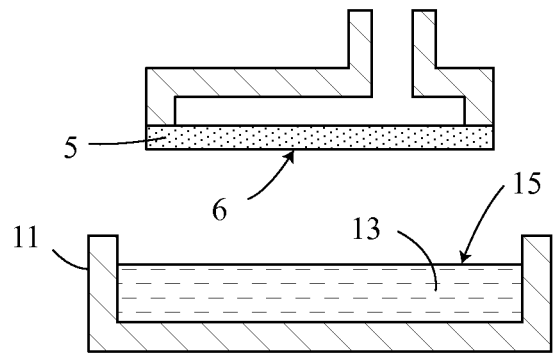
FIGS. 33A, 33B, 33C, 33D, 33E, 33F, 33G and 33H show, schematically, steps of a method for growing a sacrificial wafer, growing a functional material upon the sacrificial wafer, melting away the sacrificial wafer, leaving the functional material from the wafer on the melt surface, contacting a mold forming surface to the melt at the functional material and solidifying a formed wafer at the forming surface and removing the formed wafer from the mold surface.
Figure 33B:
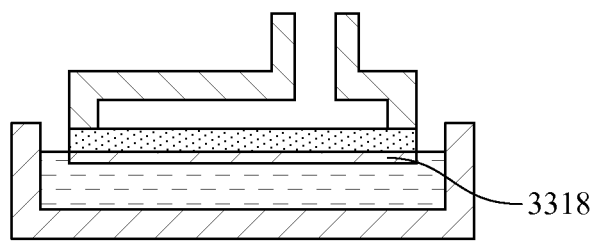
Figure 33C:
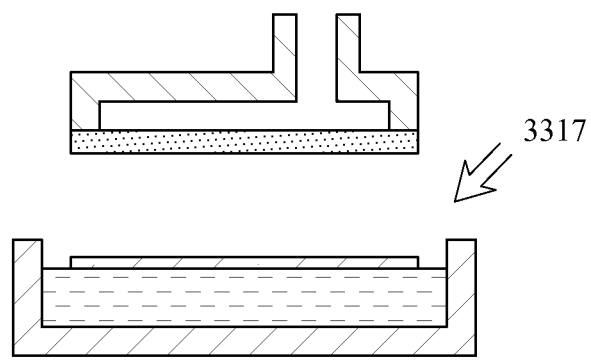
Figure 33D:
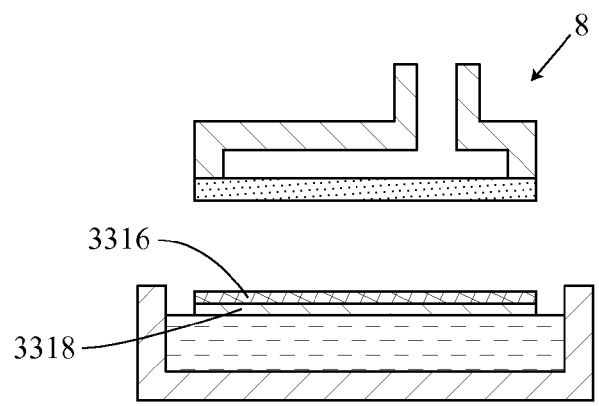
Figure 33E:
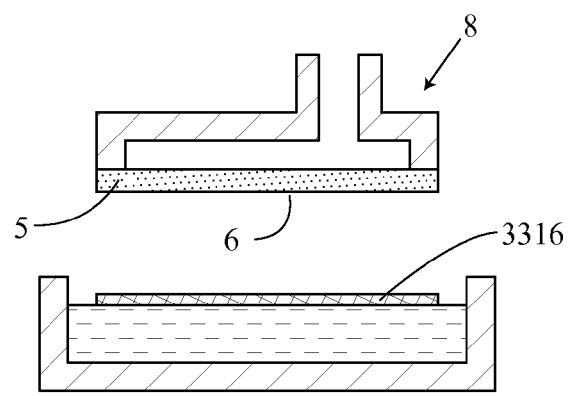
Figure 33F:
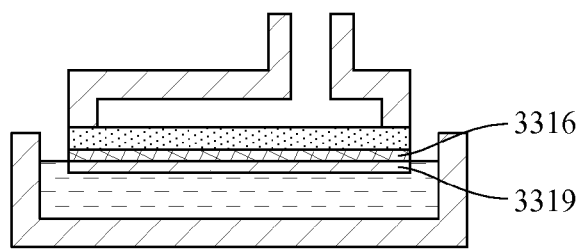
Figure 33G:
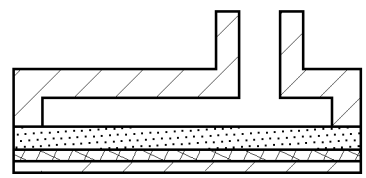
Figure 33H:
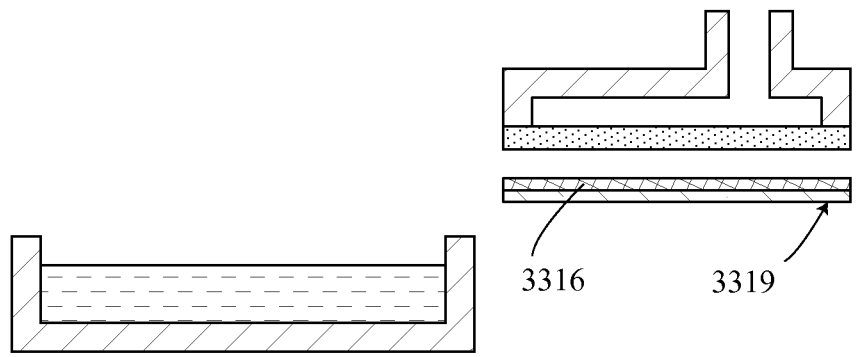

One approach to creating a silicon oxide functional layer is shown schematically with reference to FIGS. 32A-32E to create the functional layer on the free surface 15 of the silicon melt 13. This can be achieved by growing a thin layer 3216 of silicon oxide directly on the melt by the introduction of an oxidizing gas species that reacts with the silicon present on the melt surface 15 to form a thin layer of silicon oxide which floats on the surface of the melt (FIG. 32B). The mold sheet 5 is then dipped into the melt (FIG. 32C), forming a wafer 3219 on the forming face 6 of the mold sheet 5. The mold assembly 3208 is withdrawn from the melt surface 15 with a vacuum applied, lifting the formed wafer 3219 from the melt. The wafer 3219 that is removed includes a coating layer 3216 of the functional material (FIG. 32E). In this approach, the functional layer is re-grown between each wafer molding event.

Another approach to creating a non-nucleating functional layer is shown schematically with reference to FIGS. 33A-33H. This approach is to grow such a functional layer on a solid silicon surface, which is subsequently melted back to leave only the silicon oxide. Because the kinetics of oxide growth and oxide properties differ between liquid and solid silicon, it may prove beneficial to be able to grow the functional layer on a solid silicon surface, rather than the free surface of the silicon melt. In this approach, the forming face 6 of the mold sheet 5 is first brought into contact with the melt surface 15, making a sacrificial wafer 3318, as described above, but with small grains. The sacrificial wafer 3318 is released from the mold sheet 5 and floats on the surface 15 of the melt 13. An oxidizing ambient 3317 is then introduced to the surface of the sacrificial wafer, causing the growth of an oxide layer 3316. Either simultaneously with the oxide layer growth, or subsequently, the sacrificial silicon wafer 3318 is melted away from beneath by high temperature of the melt 13, but the oxide remains for a while. Finally, the mold sheet 5 is brought into contact with the floating oxide functional layer 3316, and a production wafer 3319 is formed.

Another function that a functional layer can perform is as a chemical barrier to prevent, for instance, diffusion of impurities from the mold sheet to the forming semiconductor wafer. Another function that a functional layer can perform is to prevent adhesion between mold sheet and solidified silicon sheet and thereby to facilitate release. A functional layer can also discourage uncontrolled grain nucleation in the forming body. Silica can serve each of these purposes. A different functional material can also promote grain nucleation at desired locations, if it is spatially tailored.

Figure 30:
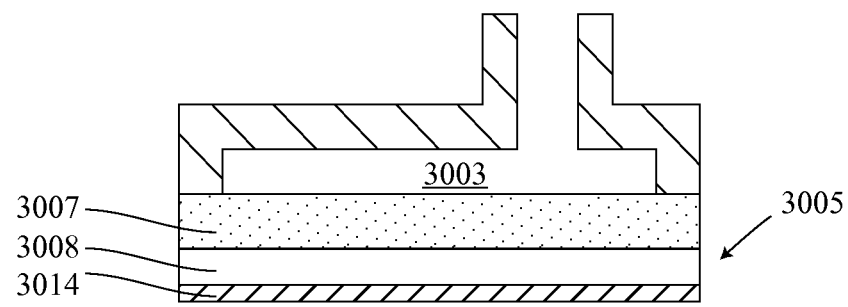
FIG. 30 shows, schematically, a porous mold composed of several layers of different materials and different thickness.

Another approach to creating a functional layer between the melt surface and the mold sheet is by creating such a functional layer on the surface of the mold sheet itself, for example by depositing a functional layer of silicon dioxide or silicon nitride on a graphite mold sheet. FIG. 30 shows such a functional layer 30014 on a mold sheet 3005. One approach to creating such a functional layer is to directly deposit the functional layer in final form, for example by chemical vapor deposition (CVD), or by physical vapor deposition (PVD). Layers of hydrogen-rich silicon nitride are routinely deposited on silicon solar cells for use as anti-reflection coatings by plasma enhanced chemical vapor deposition (PECVD). Both these silicon nitride layers and electron beam deposited of SiO2 have been found effective to form a nucleation suppressing buffer layer on the mold sheet.

Another approach is to deposit a layer of precursor material, which is subsequently converted to the final functional layer 3014. For example, a thin layer of silicon can be deposited onto the mold sheet by electron-beam evaporation and subsequently converted to silicon dioxide by a thermal anneal in the presence of an oxidizing gas.

Another implementation of a functional layer on a forming face is the use of a powder layer. This powder layer may consist of ceramic powders, for example silicon carbide, silicon nitride, or silicon dioxide. The powder layer may be single or multi-component, with powders of differing composition and/or particle size distribution. This powder layer may be applied by spray and subsequent drying of a slurry.

In each of the above-described implementations, the functional layer created can persist during the molding of multiple wafers without refreshing or re-depositing the functional layer. However, it may also be necessary to refresh or re-deposit the functional layer between each molding event to obtain optimal functionality. The porosity of the deposited, converted, or refreshed functional layer must still be sufficient to allow gas passage through the plane of the functional layer such that the vacuum or differential pressure attachment mechanism can operate.

Thus, functional materials can be chosen from the group including but not limited to: silicon oxide, silicon dioxide (silica), silicon carbide, silicon nitride, silicon oxynitride, silicon oxycarbide, and boron nitride and silicon itself (as a seed).

The foregoing has discussed use of a mold sheet composed of various materials, such as: graphite, silicon carbide, silicon nitride, silica, silicon oxynitride, silicon oxycarbide, boron carbide, boron nitride and alloys of these including silicon oxynitride and also, under certain circumstances, aluminum oxide.

Silicon itself could be an excellent material to grow silicon wafers on, due to its availability in very high purity, well understood thermal properties, and ease of growing or depositing silicon based compounds such as silicon dioxide, silicon nitride, silicon carbide for use as a functional layer, discussed above. More specifically, Silicon dioxide has been found to have excellent non-nucleating and chemical barrier properties and can be grown on silicon. Thus, it would be desirable to use a mold sheet 5 fabricated from silicon, for certain reasons. A significant problem is that silicon is not permeable and thus cannot transmit a vacuum or pressure differential to the melt. However, several methods to make silicon permeable have been developed, and are discussed below.

Figure 34:
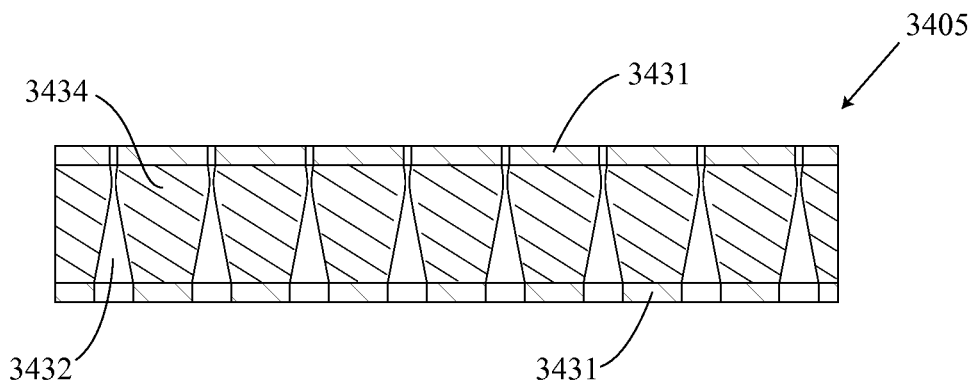
FIG. 34 shows, schematically, a cross-sectional view of a substrate, typically silicon, with conical through holes.

As shown schematically with reference FIG. 34 for a schematic cross-section, laser through holes 3432 can be cut into substrates 3405 of thin bulk silicon 3434 (100 to 300 um thick) with through hole diameter of <3 um on at least one face of the silicon substrate. (As used herein, the term mold sheet refers to a finished mold element, having a forming face and an obverse face. The molten material is presented against the forming face of a mold sheet. In some cases, a mold body may be used, which has several mold sheets arranged relative to each other. The term substrate is used herein to refer to material that is processed to become a mold sheet.) Through-hole 3432 size and pitch can be varied to control wafer properties such as thickness and microstructure. After creating porosity by cutting holes, the substrate 3405 can be further processed by oxidizing or coating with oxides, nitrides and carbides of silicon to form a desired outer functional layer 3431. Other methods of processing such as reactive ion etching may also be used to create through holes.

Figure 35:
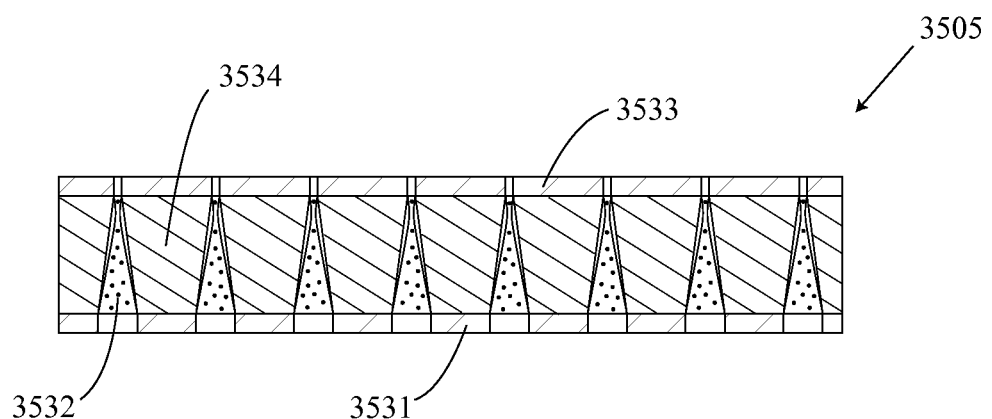
FIG. 35 shows, schematically, a cross-sectional view of a substrate, typically silicon, for use as a mold sheet having a mold surface, with laser cut, powder filled holes.

If thicker substrates 3505 are desired as shown schematically with reference to FIG. 35, it may become impractical to laser cut through-holes with <3 um diameter. An alternative approach would be to cut large conical through holes 3532 with diameters on one face 3531 of the substrate 3505 of 100 to 1000 um and 10 to 100 um at the opposite face 3533. The main body 3534 of the substrate 3505 is bulk silicon. These through holes can then be filled with powders of silicon, silicon carbide, silicon nitride, silica or a combination of all or some of these silicon based compounds. The through holes can be filled by, for example, applying a slurry of desired powders with a mix of particle sizes that is consistent with the through hole dimension and the desired permeability of the substrate to the face of the substrate with the large diameter holes. More specifically, particles close to the diameter of the small hole should be included to allow the powder mix to be securely wedged into the hole and particles with much smaller size should be used to tailor permeability. Vacuum can then be applied from the face 3533 of the substrate with the small holes to pack the powder particles into the through holes. The substrate can be thermally treated in inert or reactive atmosphere to oxidize, nitride, carbide, reaction bond, or sinter the powder mix to connect and densify the powder inside the though holes.

Both methods using laser cut through holes described so far result in permeable silicon with macroscopically non-uniform permeability. This may be desired for nucleation control. If uniform permeability is desired, bulk silicon needs to be made permeable with pores on a nanometer scale. Processes for creating thin layers of porous silicon by etching in $HF:H_2O_2$ with a metal catalyst layers such as silver, gold, copper have been described in the literature (for example by C. Chartier at al. in Electrochimica Acta 53 (2008) 5509-5516).

Figure 36:
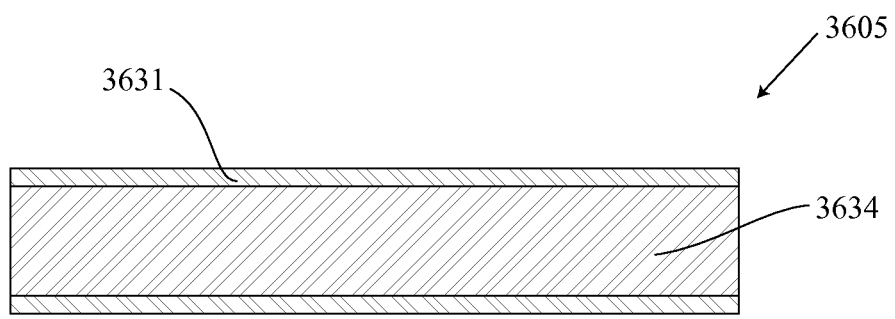
FIG. 36 shows, schematically, a cross-sectional view of a substrate, typically silicon, for use as a mold sheet having a mold surface, with a porous silicon internal portion, partially oxidized, and a porous $SiO_2$ outer layer(s)

Using a Silver (Ag) assisted $HF:H_2O_2$ etch, several novel types of substrates for growth of silicon wafers from a silicon melt can be fabricated. FIG. 36 shows a thick porous silicon substrate 3605 (100 to 1000 um thick) with oxidized porous silicon 3631 on the surface. During the etch process two types of porous silicon are generated. Silver particles sinking into the silicon leave behind large macro pores with hundreds of nanometer (nm) diameter. Nano-porous silicon is generated at the surface of the sample and on the pore walls. This nano porous silicon can be removed with an alkaline etch such as NaOH or KOH. The nano porous silicon is much more reactive then the macro porous silicon and can be left in place if, for example, a thick $SiO_2$ layer is desired. After silicon etching, a cleaning step in $HNO_3$ is recommended to remove any residual silver from the sample. To form the $SiO_2$ layer, a thermal oxidation between 900° C. and 1300° C. can be performed in oxygen-containing ambient. The degree of permeability can be adjusted by the amount of Ag deposited, the etch time, $HF:H_2O_2$ ratio and the bath temperature. FIG. 36 shows an example of a substrate 3605 made by this method with partially oxidized porous silicon in the center 3634 and layers of porous $SiO_2$ on the surface 3631.

Figure 37:
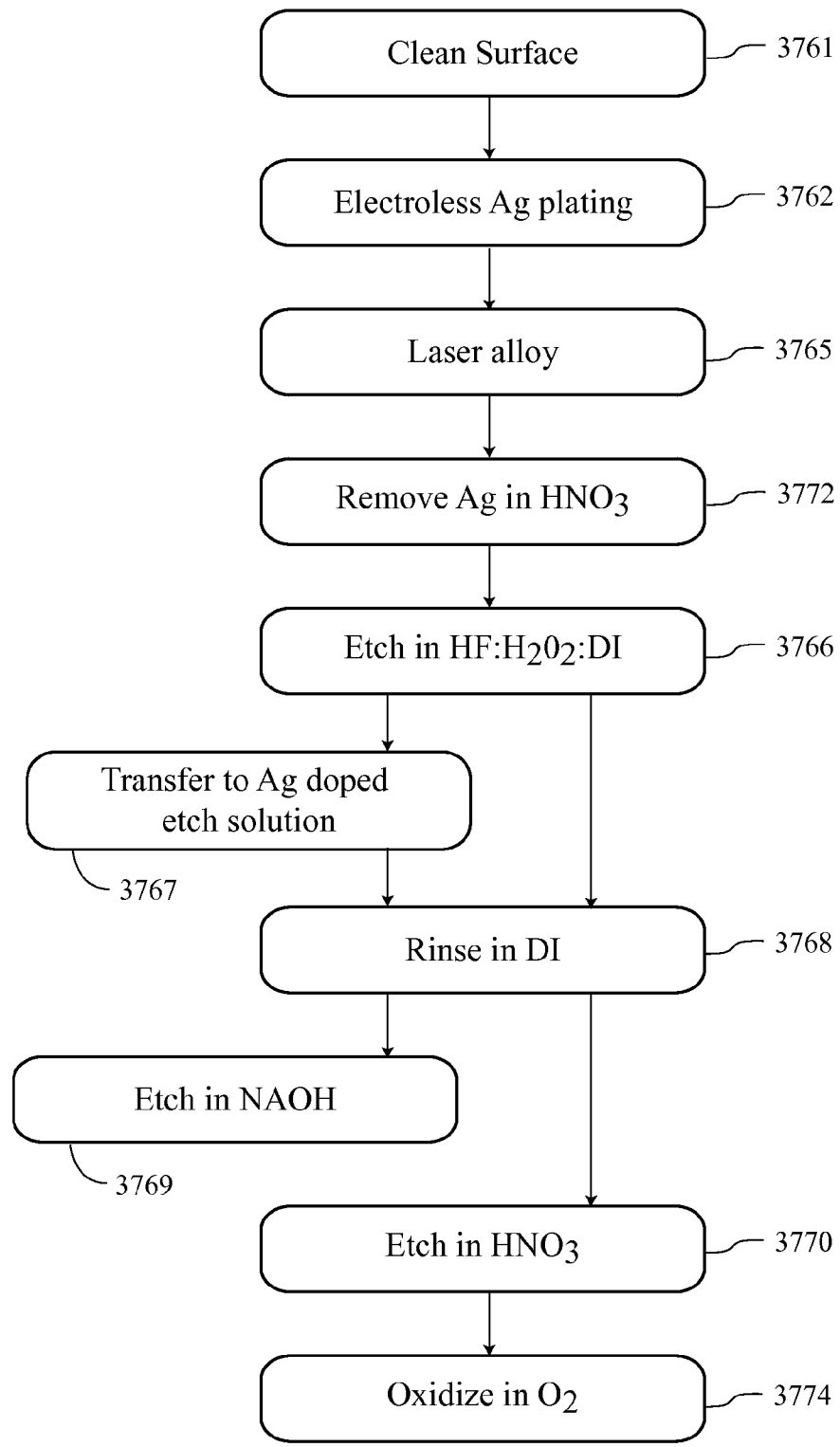
FIG. 37 shows, schematically in flow chart form steps of a method of an invention hereof for making a microporous silicon substrate using an electroless application of a metal seed layer and laser augmentation.

One drawback of the methods described in the literature is that it is not easily possible to create local areas of porous silicon while maintaining a smooth finish in adjacent areas. Over the time required to completely etch through a thick substrate, part of the silver becomes dissolved in the etch solution and etching is catalyzed over the entire surface of the substrate, even if the silver layer was masked prior to etching in $HF:H_2O_2$. This problem can be solved by techniques developed by present inventors hereof. FIG. 37 shows a preferred process flow for creating substrates with porous silicon areas.

Figure 38:
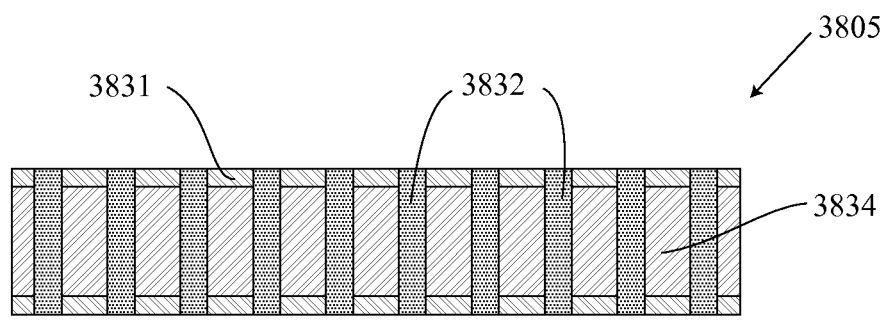
FIG. 38 shows, schematically, a cross-sectional view of a substrate, typically silicon, for use as a mold sheet having a mold surface, with a bulk silicon internal portion, pierced by oxidized porous silicon plugs and a bulk SiO2 outer layer(s).

Silicon substrates are cleaned 3761 and then plated from a silver nitrate solution 3762. By then alloying 3765 the silver with the underlying silicon using, for example, a laser at low power setting after deposition 3762 of the silver seed layer, regions of silver silicon alloy can be created on the sample surface. Any un-alloyed silver can then be removed 3772 in concentrated nitric acid leaving areas of clean silicon adjacent to areas with silver silicon alloy, because the Ag—Si alloy is not etched by the nitric acid. The Ag—Si alloy will still act as a catalyst but will not contaminate the etch bath and thus bulk silicon substrates with porous silicon plugs can be manufactured by etching the so prepared substrate in an $HF:H_2O_2$ solution 3766. FIG. 38 shows such a substrate after oxidation 3774. Oxidized porous silicon plugs 3832 penetrate bulk silicon 3834. The bulk silicon areas are coated with fully dense $SiO_2$ 3831. If a thick layer of porous $SiO_2$ is desired above the bulk silicon the substrate can be immersed 3767 in Ag doped etch solution (about 100 ppmw of Ag is sufficient) before or after the alloyed areas have completely etched through 3766. This will result in a thick layer of nano-porous silicon at the surface of the sample, which will result in a thick porous $SiO_2$ layer after oxidation (3834 would be porous $SiO_2$ instead of bulk SiO in this case). After the final silicon etch 3766 or 3767, the sample should be cleaned by rinsing 3768 in DI water. If no porous silicon is desired the sample can then be etched in a weak caustic solution 3769 such as 1% NaOH for example. In all cases the substrates should be cleaned in nitric acid 3770 to remove residual Ag metal. With this method, 3-dimensional structure of bulk silicon and porous silicon can be created. Because porous silicon is more reactive than bulk silicon three dimensional structures of bulk silicon and reaction products of silicon, such as for example $SiO_2$ or silicon nitride can be created. Besides suppressing nucleation with a $SiO_2$ layer, both control of vacuum and control of heat transfer allow further control of microstructure of wafers grown on these substrates.

As outlined earlier a thermally grown silicon dioxide acts well as a nucleation suppression layer when growing silicon. Silicon wafers with relatively large grains (grain diameter 3 to 5 times the wafer thickness) have been grown on Silicon substrates with laser through holes or porosity generated by metal assisted etching. Microstructure was controlled by the density and size of laser though holes. Nucleation of grains was enhanced at the site of the through holes and suppressed elsewhere, showing a high degree of control of nucleation. Near mono-crystalline silicon was grown on oxidized porous silicon substrates with the substrate acting a as a seed for the grown wafer.

Thus, the mold sheet can be formed of porous silicon, as just discussed, and, as outlined above, the mold sheet can be composed of: graphite, silicon carbide, silicon nitride, silica, silicon oxynitride, silicon oxycarbide, boron carbide, boron nitride, and combinations thereof, along with combinations of porous silicon, as just discussed above.

Much of the foregoing discussion has concerned a mold sheet that has a textured forming surface. However, inventions disclosed herein are also useful with mold sheets having an untextured, substantially smooth, and even substantially polished mold surface.

A central aspect of some of the inventions disclosed herein is the use of a pressure differential across a mold sheet and forming a wafer thereon, to control the solidification, and adhesion of the semiconductor, typically silicon, to the mold sheet and, by later relaxation of the pressure differential, to allow for release of the formed wafer. This aspect greatly increases the range of parameters and materials available for solidifying a sheet on a substrate and also reduces cost. The mold sheet may be (although it need not be) cooler and even substantially cooler than the melt, because, adhesion is created by pressure differential and is not reliant on wetting. The use of lower mold sheet temperatures also broadens the nature of available sheet materials. Release by reduction or even reversal of the pressure differential provides a rapid, economical and manufacturable method of release that does not rely on the function of release coatings and their reapplication.

Heat is extracted almost exclusively through the thickness of the forming wafer (and not along its length). Accordingly, the interface between liquid and solid is substantially parallel to the mold sheet forming surface or at a relatively small acute angle to it. Thus the temperature of the solidifying semiconductor body is substantially uniform across its width, resulting in low stresses and low dislocation density and therefore higher crystallographic quality. Segregation of impurities from the interface to the bulk of the melt can take place, resulting in purification of the material during growth. Dopants with low segregation coefficients (such as gallium in silicon) can be used as each wafer can be grown from a melt with the same dopant concentration and therefore have the same dopant concentration.

The mold sheet must allow flow of gas through it to create and sustain a pressure differential and this can be accomplished by porosity across the entire area of the sheet or by concentrated porosity that is distributed over the sheet. The mold sheet may be substantially the size of a single wafer or the size of multiple wafers, for example in a strip form. The introduction of the melt to the mold sheet can be implemented in a wide variety of configurations including: full area contact with the top of a melt of material; traversing a partial area contact of melt with the mold sheet, whether horizontal or vertical, or in between; and by dipping the mold sheet into a melt. The thickness of the solidified layer can be controlled by varying the temperature of the mold sheet, the thickness of the mold sheet, the temperature of the melt and the duration of contact between mold sheet and melt. The grain size can be controlled by the initial temperature of the mold sheet, by introducing the mold sheet to the melt in a directional means. By directional means, it is meant, progressively, with a portion of the mold sheet contacting the molten material first, and then additional portions contact the molten material, rather than the entire mold sheet contacting molten material all at once. The grain size can also be controlled by the nature of the material at the interface between the mold sheet and the melt surface, especially by the use of functional materials that reduce the tendency for nucleation. Removal of the formed wafer from the melt is aided by providing a mechanism to shed excess, unsolidified melt which would otherwise by held on by capillary action. Removal of the wafer from the mold sheet can be by reduction or reversal of the pressure differential or aided mechanically. The various methods of melt introduction, control of solidification, removal of excess melt and removal of wafer can be combined in any reasonable manner. To make up for loss of material by removal of the solidified sheet, material must be added to the melt. This can be done by either adding solid pieces, or by adding molten material, which material was melted in a separate container. The replenishment can happen between the formation of each wafer, between the formation of batches of wafers, or on a continuous basis. The material that is added must also contain dopant, typically in approximately the same concentration as that desired in the solidified wafers. However, the level of intentional doping may be varied so as to maintain tighter control over the doping of the solidified wafers A useful embodiment of a method invention hereof has the following characteristics. To promote large grains, the melt is introduced to the mold sheet in a progressive manner, for example, by using a method of tilted lay in as described with reference to FIG. 9A and FIG. 9B. A functional material which reduces grain nucleation is also used, whether on the mold sheet or on the surface of the melt. The meniscus is detached with the aid of a meniscus control element. The mold sheet is larger than the wafer to be formed and vacuum is confined to only a portion of the mold sheet so as to facilitate release.

While portions of this description have focused on the fabrication of silicon sheets to be subsequently processed into solar cells, the methods disclosed herein are not limited to this application. It is possible that the grain size and structure of the formed silicon will not be sufficient to allow for the fabrication of solar cells directly on the silicon sheets made by these methods. Because the solidification is taking place across the thickness of the wafer, there is the potential to reject impurities into the bulk of the melt, as discussed above, and therefore to chemically refine the silicon during the process. Thus, it may be that while some directly fabricated sheet has grains too small to support the highest efficiency solar cells, it may be possible to attain reasonable efficiency cells (perhaps 15%) at extremely low cost.

As such, the sheets of Si may be used as feedstock for the Recrystallization in Capsule (RIC) technology described at the beginning of this description.

Further, the material that is formed need not be silicon. Other semiconductor material can be used, such as elemental semi-conductors such as germanium and compound semiconductors, such as gallium arsenide.

Many techniques and mechanical aspects of the inventions have been described herein. The person skilled in the art will understand that many of these techniques and mechanical aspects can be used with other disclosed techniques, even if they have not been specifically described in use together. Any combinations, sub-combinations, sub-sub-combinations, etc., of elements disclosed herein which can be effectively combined and used, are intended to be set forth as explicit inventions, whether claimed or not claimed. It would be impossible to specifically set forth as an invention the many hundreds of viable combinations that are inventive, and that are based on inventions disclosed herein.

Thus, inventions disclosed herein include methods, articles of manufacture, and manufacturing apparatus.

Method inventions disclosed herein include a method of making a semiconductor sheet preform for later re-crystallization, by contacting a cool porous mold sheet to a melt of semiconductor material, developing a pressure differential across the front and back surfaces of the mold sheet and thereby separating a thin semiconductor sheet from the melt, recrystallizing the formed preform sheet, as described in the RIC applications, and then use the semiconductor sheet as a solar cell substrate. Another method invention is a method of making a solar cell substrate using the cool mold sheet and semiconductor melt, that need not be re-crystallized, and which may or may not have a textured surface. Many variations on these methods have been discussed, including the means by which the molten material and the mold sheet meet (dip and tilt; raised melt below the mold sheet; melt above the mold sheet; melt to the side of a vertical mold sheet; plunge a mold body into a melt vertically. Other variations relate to the method of applying a pressure differential; including using a full or partial vacuum with a molten surface at atmospheric pressure, using a pressurized melt furnace, applying uniform pressure over the entire mold sheet, or applying different pressure regimes at different locations of the mold sheet. Many different methods and apparatus for removing the solidified body from the mold sheet have been discussed, including turning off the differential pressure across the mold sheet; applying positive pressure, mechanical pins, shaping the mold sheet to prevent adhesion, providing a functional material that acts as a mold release, and using a dual plenum vacuum along with a gas impermeable coating on a portion of the mold sheet.

For instance, any suitable method for drawing a vacuum through a mold sheet can be used. Any semiconductor can be used as the material for the sheet preform. Various techniques can be used to prevent liquid from adhering to the bottom of the formed sheet preform. Different functional materials can be used for different purposes. Different methods of introducing the melt to the mold sheet can be used.

Articles of manufacture inventions disclosed herein include semiconductor sheet preforms made according to the methods mentioned above, either suitable for use with or without re-crystallization, with or without textured surfaces. Additional article inventions hereof include the various configurations of mold sheets, including those with blind holes therethrough, either filled with porous or other material, or unfilled; layered, with layers of different thicknesses and thermal diffusivities; mold sheets that are larger than the semiconductor body to be solidified, and/or which have rounded edges; mold sheets having functional material at the forming surface; mold sheets that have flat or textured forming surfaces. Still more article inventions hereof are mold sheets composed of porous silicon, with or without macroscopic openings therethrough, which may be filled with porous material or unfilled; and with or without an outer surface, for instance of silica, or other material.

Inventions hereof of manufacturing apparatus include arrangements of troughs and support structure for the plenum and mold sheet, as described above for a semi-continuous mode of manufacture, and the plenum and mold sheet assembly; dual plenum with sweep ability; dual plenum for mold sheet and formed wafer attachment and release. Additional apparatus inventions hereof include the various apparati to produce a raised portion in a melt, including a moving weir, a pump and raised slot for pumping molten semiconductor up therethrough, and magnetohydrodynamic equipment. Additional apparatus inventions hereof include the different arrangements for presenting molten material to a cool mold sheet, including those where the molten material is below the mold sheet, those where the molten material is presented to the mold sheet from above (gravitationally) and those where the molten material is presented to a mold sheet from a side.

While particular embodiments have been shown and described, it will be understood by those skilled in the art that various changes and modifications may be made without departing from the disclosure in its broader aspects. It is intended that all matter contained in the above description and shown in the accompanying drawings shall be interpreted as illustrative and not in a limiting sense.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

ASPECTS OF INVENTIONS

The following aspects of inventions hereof are intended to be described herein, and this section is to ensure that they are mentioned. They are styled as aspects, and although they appear similar to claims, they are not claims. However, at some point in the future, the applicants reserve the right to claim any and all of these aspects in this and any related applications.

A1. A method for fabricating a semi-conductor body, the method comprising the steps of:
  a. providing a molten semi-conductor material, having a surface;
  b. providing a porous mold, comprising a forming surface;
  c. providing a differential pressure regime such that pressure at least a portion of the forming surface is less than pressure at the molten material surface;
  d. contacting the forming surface to the molten material for a contact duration such that, for at least a portion of the contact duration:
    i. the differential pressure regime is provided and;
    ii. at least a portion of the forming surface is at a temperature below a melting point of the semi-conductor material,
  such that a body of semi-conductor material, solidifies upon the forming surface;
  e. causing motion of the forming surface relative to the molten semi-conductor material, with the solidified body upon the forming surface; and
  f. reducing the degree of the differential pressure regime, thereby contributing to the solidified body detaching from the forming surface.

A2. The method of aspect 1, the step of providing a differential pressure regime comprising, providing at the molten material surface, atmospheric pressure, and providing at the forming surface a pressure that is less than the atmospheric pressure.

A3. The method of aspect 2, wherein the pressure that is less than the atmospheric pressure is a partial vacuum.

A4. The method of aspect 1, the step of providing a differential pressure regime comprising, providing at the molten material surface, a pressure that exceeds atmospheric pressure, and providing atmospheric pressure at the forming face.

A5. The method of aspect 1, the mold comprising a single forming surface, which contacts a surface of the molten semi-conductor material.

A6. The method of aspect 1, the mold comprising a plurality of surfaces, which are angled relative to each other, the step of contacting comprising dipping the mold into the molten material, such that the molten material contacts the plurality of surfaces.

A7. The method of aspect 6, the mold comprising orthogonal surfaces.

A8. The method of aspect 1, further comprising, before the step of contacting the forming surface to the molten material, the step of tilting the forming surface relative to the surface of the molten material, so that only a portion of the forming surface makes initial contact with the surface of the molten material.

A9. The method of aspect 1, further comprising, after the step of contacting the forming surface to the molten material, the step of tilting the forming surface relative to a gravitational field, so that molten material flows off from the forming surface.

A10. The method of aspect 1, further comprising, during or after the step of causing motion of the forming surface relative to the molten material, the step of spinning the forming surface about an axis having a component that is perpendicular to the forming surface, so that molten material flows off from the forming surface.

A11. The method of aspect 1, further comprising, after the step of causing motion of the forming surface relative to the molten material, the step of providing a pressure regime, such that pressure between the forming surface and the solidified semi-conductor body is greater than pressure at a free face of the solidified semi-conductor body, which free face, faces away from the forming surface.

A12. The method of aspect 1, further comprising the step of providing a functional material between the forming surface and the molten material, the functional material chosen to contribute to a function chosen from the group of:
   a. suppressing nucleation of grain growth;
   b. preventing passage of impurities from the mold to the solidified semiconductor body;
   c. enhancing release of the solidified semiconductor body from the forming surface; and
   d. encouraging nucleation of grain growth at specific locations of the solidified semiconductor body.

A13. The method of aspect 1, further comprising the steps of:
   a. before the step of causing relative motion, the step of providing on the solidified semi-conductor material, which is designated a sacrificial solidified body, functional material comprising an oxide;
   b. melting the solidified sacrificial solidified semi-conductor body, thereby leaving a functional body upon the molten material; and
   c. contacting the forming surface to the functional body upon the molten material for a second contact duration such that, for at least a portion of the second contact duration:
      i. a differential pressure regime is provided and;
      ii. at least a portion of the forming surface is at a temperature below a melting point of the semi-conductor material,
   such that a body of semi-conductor material, having a free face, solidifies upon the forming surface.

A14. The method of aspect 13, further comprising, before the step of contacting the forming surface to the functional body, the step of causing relative motion of the forming surface relative to the functional body, such that they are spaced apart for a time.

A15. The method of aspect 13, wherein the step of contacting the forming surface to the functional body, comprises maintaining the forming surface in contact with the functional body during the step of melting the sacrificial body.

A16. The method of aspect 12, the step of providing a functional material comprising providing the functional material to the forming surface.

A17. The method of aspect 12, the step of providing a functional material comprising providing the functional material to the surface of the molten material.

A18. The method of aspect 17, the molten material comprising silicon, the step of providing functional material comprising providing a body of solidified functional material to the surface of the molten silicon, and enriching the atmosphere at the surface of the molten silicon in oxygen, thereby giving rise to a body of SiO2 upon the surface of the molten silicon, further comprising the step of contacting the forming surface to the body of SiO2.

A19. The method of aspect 12, the functional material being selected from the group consisting of: silicon oxide, silicon dioxide (silica), silicon carbide, silicon nitride, silicon, silicon oxynitride, silicon oxycarbide, and boron nitride.

A20. The method of aspect 1, further comprising providing a preferential nucleation agent at an interface between the forming surface and the molten material, before the step of contacting the forming surface to the molten material.

A21. The method of aspect 8, the functional material being selected from the group consisting of: silicon and silicon dioxide.

A22. The method of aspect 1, further comprising the step of applying a meniscus control element to detach adhering molten material from the solidified body.

A23. The method of aspect 22, the meniscus control element comprising a body that is substantially non-wetted by the molten material, having a wetting angle of greater than about 60 degrees with respect to the molten material and the ambient atmosphere.

A24. The method of aspect 22, the meniscus control element comprising a rod.

A25. The method of aspect 1, the forming surface comprising a substantially untextured surface.

A26. The method of aspect 1, the forming surface comprising a textured surface.

A27. The method of aspect 26, the textured surface comprising shapes that correspond to light trapping texture to be formed in the solidified semiconductor material.

A28. The method of aspect 26, the textured surface comprising shapes that correspond to electrode locating texture to be formed in the solidified semiconductor material.

A29. The method of aspect 26, the textured surface having a characteristic feature scale, and the solidified semi-conductor body having a thickness that is less than the characteristic feature scale.

A30. The method of aspect 1, the porous forming body comprising a material selected from the group consisting of: graphite, silicon carbide, silicon nitride, silica, silicon oxynitride silicon oxycarbide, and boron nitride.

A31. The method of aspect 1, the porous mold comprising a body of sintered powder.

A32. The method of aspect 1, the porous mold comprising a graphite body.

A33. The method of aspect 1, the porous mold comprising a body of originally solid silicon that has been processed to be porous.

A34. The method of aspect 1, the porous mold comprising an originally solid silicon body with holes that have been formed therethrough.

A35. The method of aspect 34, the holes comprising conical holes.

A36. The method of aspect 34, further comprising, in the holes through the solid body, porous material.

A37. The method of aspect 1, the porous mold comprising a body of porous silicon.

A38. The method of aspect 37, the porous silicon having been formed by depositing a metal seed layer upon a surface of a silicon body and then etching the seeded silicon body.

A39. The method of aspect 33, the porous mold further comprising at least one outer surface layer of a silicon oxide.

A40. The method of aspect 1, further comprising the step of controlling nucleation of grain growth at selected locations of the forming surface.

A41. The method of aspect 1, the step of controlling nucleation being selected from the group consisting of:
 a. providing a mold with a spatially varied thickness;
 b. providing a pressure differential that varies spatially with respect to the forming surface;
 c. providing a mold with spatially varied thermal insulation;
 d. providing a forming surface with a spatially varied texture;
 e. providing a mold with a spatially varied thermal diffusivity;
 f. providing an area-specific temperature profile at the forming face; and
 g. providing a crystal seed at a location upon the forming surface that first contacts the molten material.

A42. The method of aspect 1, further comprising the step of controlling directionality of growth of grains at selected locations of the forming surface.

A43. The method of aspect 42, the step of controlling directionality of growth of grains selected from the group consisting of:
 a. providing a mold with a spatially varied thickness;
 b. providing a pressure differential that varies spatially with respect to the forming surface;
 c. providing a mold with spatially varied thermal insulation;
 d. providing a forming surface with a spatially varied texture;
 e. providing a mold with a spatially varied thermal diffusivity;
 f. providing area-specific temperature profile at the forming face; and
 g. providing a crystal seed at a location upon the forming surface that first contacts the molten material.

A44. The method of aspect 1, the mold comprising a plenum.

A45. The method of aspect 44, the mold comprising a mold sheet, the plenum comprising a structure designed to reinforce the mold sheet against any excessive pressure.

A46. The method of aspect 44, the plenum comprising a compound plenum, having at least two chambers, wherein the step of providing a differential pressure regime comprises providing two different differential pressure regimes, such that pressure at least two different portions of the forming face is less than that of an atmosphere at the molten material surface, and further comprising during the contacting step, the step of moving one chamber relative to the other, to change the relative location of the two different pressure regimes.

A47. The method of aspect 1, further wherein:
 a. the step of providing molten material comprises providing molten material in a container, the container having at least one wall, such that a meniscus of the molten material exists with a convex curvature facing away from the container having an uppermost part that is above the wall; and
 b. the step of contacting the forming surface to the molten material comprises passing the forming face against the convex meniscus.

A48. The method of aspect 47, the step of causing relative motion comprising causing substantially linear relative motion between the forming surface and the molten material.

A49. The method of aspect 48, the step of causing relative motion comprising causing relative motion that is substantially perpendicular to a local gravitational field.

A50. The method of aspect 48, the step of causing relative motion comprising causing relative motion that has a component that is aligned with a local gravitational field.

A51. The method of aspect 1, the step of providing a differential pressure regime comprising:
 a. providing a first differential pressure adjacent a first region of the mold surface; and
 b. providing a second, different differential pressure at a plurality of discrete locations of the mold surface.

A52. The method of aspect 1, further comprising the step of suppressing oscillatory motion of the surface of the molten material.

A53. The method of aspect 1, the step of providing molten material comprising providing molten material in a vessel, such that the molten material has a depth of less than approximately five mm, and preferably less than approximately three mm.

A54. The method of aspect 1, the step of reducing the degree of differential pressure regime comprising reversing the direction of differential pressure, such that a force is applied to the solidified material directed away from the forming surface.

A55. The method of aspect 1, further comprising the step of providing the forming surface of the mold and the surface of the molten material each at uniform initial temperatures across their spatial extent.

A56. The method of aspect 1, the step of contacting comprising contacting the forming surface to the surface of the molten material, such that each portion of the forming surface contacts the molten material for approximately the same duration.

A57. The method of aspect 56, the step of contacting comprising providing a progressive relative sweep of the forming surface relative to the surface of the molten material.

A58. The method of aspect 1, further wherein the mold has a limited heat capacity, such that the temperature of the forming surface rises substantially to a temperature approximately equal to that of the molten material, such that thereafter, no additional molten material solidifies.

A59. The method of aspect 1, further comprising the step of decreasing the heat transfer coefficient between the mold and the solidified body by reducing contact area between the initial solidified layer and mold.

A60. The method of aspect 59, the step of controlling the heat transfer coefficient comprising adjusting the magnitude of the differential pressure regime.

A61. The method of aspect 59, wherein the step of providing a mold comprises providing a mold with properties of gas permeability, void fraction and thickness selected to control changes in the magnitude of the differential pressure regime over time in conjunction with superheating of the molten material to define a contact area for the heat transfer coefficient.

A62. The method of aspect 1, wherein the formed wafer has an impurity level that is lower than the impurity level in the molten material A63. The method of aspect 62, where the lower level of impurity is accomplished through the action of segregation and advance of a solidification front is kept slow enough to allow for segregation to take place.

A64. The method of aspect 1, further comprising a dopant with a low segregation coefficient.

A65. The method of aspect 64, further comprising the step of adding gallium, indium, phosphorous, or arsenic and the molten material is silicon.

A66. The method of aspect 64, further comprising the step of adding material to replenish the melt, which material has a concentration of dopant approximately equal to that desired in a final wafer.

Having described the inventions disclosed herein, what is claimed is:

The invention claimed is:

1. A method for fabricating a semi-conductor body, the method comprising the steps of:
  a. providing a molten semi-conductor material, having a surface;
  b. providing a porous mold, comprising a forming surface;
  c. providing a differential pressure regime such that pressure at at least a portion of the forming surface is less than pressure at the molten material surface;
  d. contacting the forming surface to the molten material for a contact duration such that, for at least a portion of the contact duration,
    the differential pressure regime is provided and;
  such that a body of semi-conductor material, solidifies upon the forming surface; and
  detaching the solidified body from the forming surface.

2. The method of claim 1, further comprising the step of providing a functional material between the forming surface and the molten material, the functional material chosen to contribute to suppressing nucleation of grain growth.

3. The method of claim 1, further comprising the step of providing a functional material between the forming surface and the molten material, the functional material chosen to contribute to preventing passage of impurities from the mold to the solidified semiconductor body.

4. The method of claim 1, further comprising the step of providing a functional material between the forming surface and the molten material, the functional material chosen to contribute to enhancing release of the solidified semiconductor body from the forming surface.

5. The method of claim 1, further comprising the step of providing a functional material between the forming surface and the molten material, the functional material chosen to contribute to encouraging nucleation of grain growth at specific locations of the solidified semiconductor body.

6. The method of claim 1, further comprising the step of providing a functional material between the forming surface and the molten material, the functional material chosen to contribute to controlling heat extraction form the molten semiconductor material.

7. The method of claim 1, further comprising the step of controlling nucleation of grain growth accomplished by providing a mold with a spatially varied thickness.

8. The method of claim 1, further comprising the step of controlling nucleation of grain growth accomplished by providing a pressure differential that varies spatially with respect to the forming surface.

9. The method of claim 1, further comprising the step of controlling nucleation of grain growth accomplished by providing a mold with spatially varied thermal insulation.

10. The method of claim 1, further comprising the step of controlling nucleation of grain growth accomplished by providing a forming surface with a spatially varied texture.

11. The method of claim 1, further comprising the step of controlling nucleation of grain growth accomplished by providing a mold with a spatially varied thermal diffusivity.

12. The method of claim 1, further comprising the step of controlling nucleation of grain growth accomplished by providing area-specific temperature profile at the forming face.

13. The method of claim 1, further comprising the step of controlling nucleation of grain growth accomplished by providing a crystal seed at a location upon the forming surface that first contacts the molten material.

14. The method of claim 1, further comprising the step of controlling directionality of growth accomplished by providing a mold with a spatially varied thickness.

15. The method of claim 1, further comprising the step of controlling directionality of growth accomplished by providing a pressure differential that varies spatially with respect to the forming surface.

16. The method of claim 1, further comprising the step of controlling directionality of growth accomplished by providing a mold with spatially varied thermal insulation.

17. The method of claim 1, further comprising the step of controlling directionality of growth accomplished by providing a forming surface with a spatially varied texture.

18. The method of claim 1, further comprising the step of controlling directionality of growth accomplished by providing a mold with a spatially varied thermal diffusivity.

19. The method of claim 1, further comprising the step of controlling directionality of growth accomplished by providing area-specific temperature profile at the forming face.

20. The method of claim 1, further comprising the step of controlling directionality of growth accomplished by providing a crystal seed at a location upon the forming surface that first contacts the molten material.

21. The method of claim 1, further comprising the step of suppressing oscillatory motion of the surface of the molten material.

22. The method of claim 1, further comprising the step of providing at least one baffle in the molten material.

* * * * *